United States Patent [19]
Tomishima et al.

[11] Patent Number: 5,822,264
[45] Date of Patent: Oct. 13, 1998

[54] DYNAMIC SEMICONDUCTOR MEMORY DEVICE WITH SOI STRUCTURE AND BODY REFRESH CIRCUITRY

[75] Inventors: Shigeki Tomishima; Kazutami Arimoto, both of Hyogo, Japan

[73] Assignee: Mitsubishi Denki Kabushiki Kaisha, Tokyo, Japan

[21] Appl. No.: 837,167

[22] Filed: Apr. 14, 1997

[30] Foreign Application Priority Data

Dec. 10, 1996 [JP] Japan ................................. 8-329740

[51] Int. Cl.$^6$ ............................................................ G11C 7/00
[52] U.S. Cl. ................ 365/222; 365/230.03; 365/189.09
[58] Field of Search .............................. 365/222, 189.01, 365/149, 189.09, 230.03

[56] References Cited

U.S. PATENT DOCUMENTS

| | | | |
|---|---|---|---|
| 5,418,754 | 5/1995 | Sakakibara ................................ | 365/222 |
| 5,654,913 | 8/1997 | Fukushima et al. ..................... | 365/222 |

FOREIGN PATENT DOCUMENTS 4-295698  10/1992  Japan .
4-367265  12/1992  Japan .

OTHER PUBLICATIONS

*1996 Symposium on VLSI Circuits*, Jun. 13–15, 1996/Honolulu pp. 189–200.

*Primary Examiner*—Vu A. Le
*Attorney, Agent, or Firm*—McDermott, Will & Emery

[57] ABSTRACT

A semiconductor memory device of a silicon-on-insulator (SOI) structure is provided that can have majority carriers stored in a body region discharged without increasing a memory cell area. A body refresh circuit adjusts a row related control signal from a local row related control circuit and a bit line precharge voltage according to body refresh designating signals. When body refresh is specified and is to be carried out in parallel to CBR refresh, a column select line is driven to a selected state according to an output signal of a shift register. Low level data from a write circuit is transmitted to each bit line in a selected bit line pair. In a self refresh operation, a bit line precharge voltage applied to a bit line equalize circuit group is reduced to the voltage of an Low level.

17 Claims, 28 Drawing Sheets

| REF<10:8> | DATA REFRESH MEMORY BLOCK | BODY REFRESH MEMORY BLOCK |
|---|---|---|
| 0 0 0 | MB#0 | MB#1 |
| 0 0 1 | MB#1 | MB#2 |
| 0 1 0 | MB#2 | MB#3 |
| 0 1 1 | MB#3 | MB#4 |
| 1 0 0 | MB#4 | MB#5 |
| 1 0 1 | MB#5 | MB#6 |
| 1 1 0 | MB#6 | MB#7 |
| 1 1 1 | MB#7 | MB#0 |

DYNAMIC SEMICONDUCTOR MEMORY DEVICE WITH SOI STRUCTURE AND BODY REFRESH CIRCUITRY

This application is related to commonly assigned co-pending application Ser. No. 08/710,215, filed Sep. 13, 1996, and titled SEMICONDUCTOR MEMORY DEVICE.

BACKGROUND OF THE INVENTION

1. Field of the Invention

The present invention relates to semiconductor devices, and more particularly, to a dynamic semiconductor memory device (SOI-DRAM) having an SOI (Silicon On Insulator) structure in which a memory cell is formed on an insulation layer.

2. Description of the Background Art

An SOI type thin film transistor is used as a component in three-dimensional integrated circuits and liquid crystal displays. The SOI type thin film transistor includes an active region (source/drain region) formed at a semiconductor layer formed on a semiconductor substrate with an insulation film thereunder. Since the active region is isolated from the semiconductor substrate, the SOI type thin film transistor is characterized in that the junction capacitance of the active region is extremely small so that operation at high speed and with low power consumption is allowed. There are also the advantages that radiation resistance is superior, and that the integration density can be increased by a latch up free insulation film isolation. By such features, an SOI type thin film transistor (thin film SOIMOSFET) is increasingly expected as a device structure of the next generation including and following a 1 G bit (gigabit) DRAM (dynamic random access memory).

FIG. 38 schematically shows a sectional view of the memory cell portion of a conventional SOIDRAM disclosed in pp.141–142 in "1995 Symposium on VLSI", Technology Digest of Technical Papers by Morishita et al.

Referring to FIG. 38, a semiconductor layer (silicon layer) 3 is formed on the surface of a semiconductor substrate (or a semiconductor layer) 1 with an insulation layer 2 therebetween. This three-layered structure is called an SOI structure (SOI substrate).

A memory cell of an SOIDRAM includes a transistor (thin film transistor) 4 as an access transistor including an active region formed at semiconductor layer 3.

Transistor 4 includes a source/drain 4a having an n type impurity region 4aa of high impurity concentration and an n type impurity region 4ab of low impurity concentration formed inward and adjacent to impurity region 4aa, a source/drain 4b having an n type impurity region 4ba of high impurity concentration formed opposing to source/drain 4a and an n type impurity region 4bb of low impurity concentration formed inward and adjacent to impurity region 4ba and facing impurity region 4ab, a body region 4c between impurity regions 4ab and 4bb, and a gate electrode 4e formed on body region 4c with a gate insulation film 4d thereunder.

A sidewall insulation film 4f is formed at the sidewall of gate electrode 4e. Side wall insulation film 4f is used as a mask in forming impurity regions 4aa and 4ba of high impurity concentration. By making source/drains 4a and 4b with the so-called LDD (lightly doped drain) structure of a high concentration impurity region/low concentration impurity region, generation of a high electric field in the proximity of the source/drain can be suppressed to prevent trapping and accumulation of electron/hole pairs caused by impact-ionization in gate insulation film 4d and in body region 4c.

Impurity region 4aa is connected to a bit line BL, and gate electrode 4e is connected to a word line WL. Impurity region 4ba is connected to one electrode of capacitor 5 via a storage node SN. Capacitor 5 has its other electrode connected to a cell plate electrode CP. A constant cell plate voltage VCP is applied to cell plate electrode node CP. Body region 4c is kept in an electrically floating state. Body region 4c is a p type region.

It is now assumed that, in the memory cell shown in FIG. 38, a voltage VSN corresponding to data of an H level (logical high) is applied to storage node SN, and word line WL attains the ground voltage level of a non-selected state. In this state, source/drain 4b and body region 4c are reversely biased. A reverse current JR expressed by the following equation is conducted.

$$JR = q\left(\frac{Dn \cdot Npo}{Ln} + \frac{Dp \cdot Pno}{Lp}\right)(1 - \exp(-q \cdot VR/k \cdot T))$$

Dn and Dp indicate the diffusion coefficients of electrons and holes respectively, and Ln and Lp indicate the diffusion length of electrons and holes, respectively. Npo indicates the concentration of the minority carriers (electrons) at thermal equilibrium in the P type region (body region), and Pno indicates the concentration of the minority carriers (holes) at thermal equilibrium in an N type region (source/drain 4b). The q indicates the amount of charge of an electron, T the absolute temperature, and k the Boltzmann's constant. VR is the reverse bias voltage applied to the PN junction.

When the reverse bias voltage is applied, a depletion layer in the PN junction is expanded. The concentration of the minority carriers at the region in contact with this depletion layer becomes lower than the concentration at thermal equilibrium. Concentration gradient of the minority carriers is generated in respective N type and P type regions. Minority carriers move in source/drain region 4b and body region 4c according to this concentration gradient. More specifically, electrons are diffused towards source/drain region 4b in a P type region (body region 4c), and holes are diffused towards body region 4c in an N type region (source/drain 4b). Therefore, the holes diffused out from source/drain 4b are accumulated in body region 4c at a deep portion 4g by the influence of the depletion layer in body region 4c.

During selection of word line WL, a channel is formed at the surface of body region 4c, and a depletion layer is formed below this channel. Electrons pass through this channel to cause a flow of electrons between source/drains 4a and 4b. Not all the holes stored in deep portion 4g are removed, and will be sequentially accumulated therein. Storage of holes in body region 4c causes the potential of body region 4c to increase. Body region 4c is the substrate region of the SOIMOSFET, and the increased potential thereof functions to effectively reduce the threshold voltage of transistor 4, and increases the sub threshold leakage current in transistor 4 in a non-selected state of word line WL. Increase in the leakage current causes the problem that destruction of data stored in storage node SN is accelerated.

When the potential of bit line BL is amplified by a sense amplifier to attain an H level in a selected state of a memory cell, the reverse bias voltage of source/drain 4a and body region 4c of a non-selected memory cell increases. Similarly, holes flow from bit line BL to body region 4c to be stored.

Increase of the potential of body region 4c greatly depends on the reverse bias leakage current at the PN junction between source/drain 4b and body region 4c of transistor 4. This reverse bias leakage current flowing in a reverse direction is an inevitable phenomenon at the PN junction. Improvement of this junction characteristic is a problem difficult to overcome.

There is a "body fixing" method as a countermeasure of solving the problem of majority carriers (holes) being accumulated into body region 4c. An electrode is formed in contact with body region 4c so that body region 4c is fixed at a predetermined potential level. This "body fixing" method of draining majority carriers (holes) stored in body region 4c causes problems set forth in the following.

FIG. 39 shows a planar layout of a memory cell according to the "fixed body" approach. Referring to FIG. 39, source/drains 4a and 4b and body region 4c are isolated from another memory cell active region (not shown) by an element isolation insulation film 6. Body region 4c has an L-shaped configuration surrounding source/drain 4b. A contact hole 4ca is provided in a region of body region 4c where a channel is not formed. A ground voltage is applied to body region 4c from a power supply line (not shown) via contact hole 4ca. By fixing body region 4c at the ground voltage level, storage of majority carriers in body region 4c can be prevented.

In the memory cell structure shown in FIG. 39, an extra area for forming contact hole 4ca is required. A channel with a sufficient width must be formed between source/drains 4b and 4a, and the width of source/drain 4b cannot be reduced. Therefore, in the body fixing method, the layout area of the memory cell must be increased corresponding to the region for forming an electrode for potential fixation. Although this increase in area of the memory cell is small for a memory cell of 1 bit, the total layout area as the entire memory is considerably increased since 1 G ($2^{30}$) thin film SOIMOSFETs are provided in an SOIDRAM of 1 G bit. This results in increase of the chip occupying area to become a great bottleneck in increasing the integration density.

SUMMARY OF THE INVENTION

An object of the present invention is to provide a semiconductor memory device that can have storage of majority carriers in a body region suppressed without increasing the memory cell occupying area.

Another object of the present invention is to provide a semiconductor memory device that can have majority carriers which are stored in a body region discharged easily without increasing the memory cell occupying area.

According to the present invention, a semiconductor memory device includes a plurality of memory blocks, each including a plurality of memory cells arranged in a matrix of rows and columns. Each of the plurality of memory cells is formed on a semiconductor layer with an insulation film thereunder, and includes a first impurity region, a second impurity region, a body region formed between the first and second impurity regions, a gate electrode formed on the body region with a gate insulation film thereunder, and a capacitor having one electrode electrically connected to the first impurity region for storing information.

According to the present invention, the semiconductor memory device further includes a plurality of column lines provided in each of the plurality of memory blocks, each column line having one column of memory cells of a corresponding memory block connected, a plurality of word lines provided in each of the plurality of memory blocks, each word line having a gate electrode of one row of memory cells of a corresponding block connected, a data refresh circuit activated in response to a refresh mode designating signal for refreshing stored information of a memory cell in a memory block specified according to a refresh address, and a body refresh circuit activated in activation of the refresh mode designating signal for applying a body refresh voltage to a column line so that a word line maintains a non-selected state and the charge stored in the body region is transmitted to a corresponding column line in a memory block differing from the memory block specified by the refresh address.

By applying a predetermined voltage to the column line, a potential difference between the body region of the memory cell and the column line is generated, whereby the majority carriers stored in the body region can be discharged as forward leakage current onto the column line. When the potential of the column line is restored to the original potential level, the majority carriers in the body region are discharged. Therefore, acceleration of the minority carriers due to the majority carriers in the body region is suppressed. As a result, the sub threshold leakage current is suppressed.

By carrying out the operation of discharging majority carriers from the body region (referred to as "body refresh operation" hereinafter) in a memory block differing from the refresh memory block when a refresh mode is specified, it is not necessary to specify a particular operation mode to carry out body refresh. A body refresh operation can be carried out in parallel to data refresh (or carried out transparent to the data refresh operation). When data refresh is to be carried out at a predetermined interval in activation of the refresh mode designating signal, simply a data retaining operation is carried out in the SOIDRAM. By carrying out a body refresh operation together here, data can be reliably held to improve the data retaining characteristics in a data retaining mode.

By carrying out a body refresh operation in a memory block in response to the refresh operation of the last row in another memory block, the time period starting from a body refresh operation to a data refresh operation can be reduced. Therefore, data can be refreshed under a state where the amount of majority carriers stored in the body region is small. As a result, the sub threshold leakage current occurring after data refresh is suppressed to improve the data retaining characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
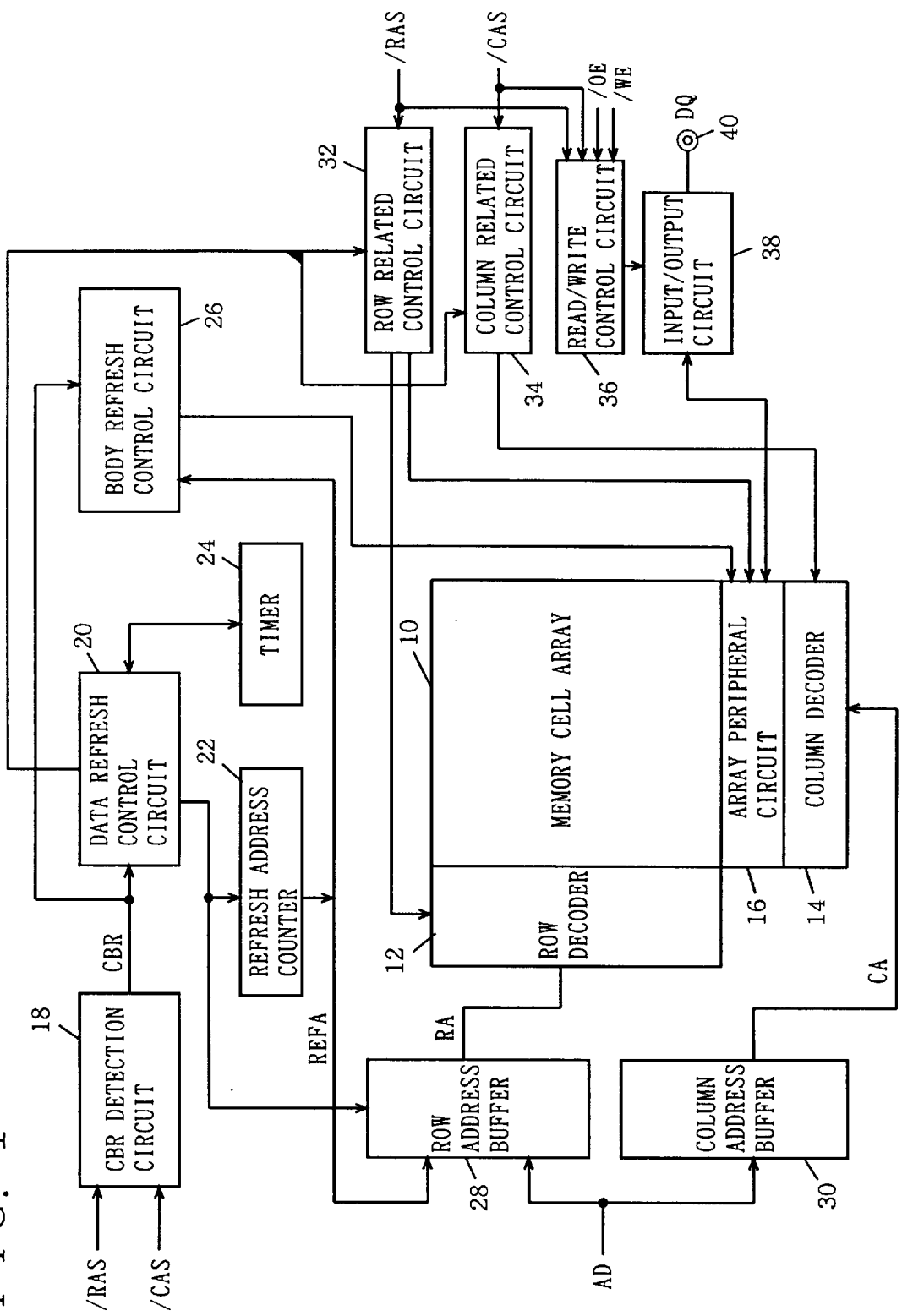
FIG. 1 is a schematic diagram showing an entire structure of an SOIDRAM according to a first embodiment of the present invention.

FIG. 1 is a block diagram schematically showing an entire structure of an SOIDRAM according to a first embodiment of the present invention. Referring to FIG. 1, an SOIDRAM includes a memory cell array 10 having a memory cell of an SOI structure arranged in a matrix, a row decoder 12 for driving a row of memory cell array 10 to a selected state according to an applied internal row address signal RA, a column decoder for driving a column of memory cell array 10 to a selected state according to an applied internal column address signal CA, and an array peripheral circuit 16.

Memory cell array 10 is divided into a plurality of memory blocks. The internal structure of memory cell array 10 will be described in detail afterwards. Row decoder 12 includes a row decode circuit provided for each memory block. Array peripheral circuits 16 includes an equalize/precharge circuit for a bit line functioning as a column line provided in each memory block and an IO gate connecting a sense amplifier and a selected column to an internal data line. Array peripheral circuits 16 are disposed in a separated manner corresponding to each memory block of memory cell array 10. For the sake of simplifying the drawing, it is illustrated as 1 block in FIG. 1.

The SOIDRAM further includes refresh related circuitry. This refresh related circuitry includes a CBR detection circuit 18 receiving a row address strobe signal /RAS and a column address strobe signal /CAS for providing a CBR detection signal CBR as a refresh mode designating signal when a CBR condition (CAS-before-RAS condition) is satisfied, a data refresh control circuit 20 for generating a signal required for data refresh in activation of CBR detection signal CBR, a refresh address counter 22 for generating a refresh address that addresses a row where data refresh is carried out under control of data refresh control circuit 20, a timer 24 for providing a refresh request at a predetermined time interval under the control of data refresh control circuit 20, and a body refresh control circuit 26 activated in activation of CBR detection signal CBR for carrying out a control operation required for body refresh according to a refresh address REFA from refresh address counter 22.

Refresh address signal REFA from refresh address counter 22 is provided to row address buffer 28. Row address buffer 28 also receives an externally applied address signal AD to select refresh address signal REFA in data refresh, and select an externally applied address signal AD in a normal operation mode to generate an internal row address signal RA under control of data refresh control circuit 20. Address signal AD is also applied to column address buffer 30. Column address buffer 30 does not receive a refresh address signal, and generates an internal column address signal CA from an externally applied address signal AD in activation (in normal operation mode).

The SOIDRAM further includes a row related control circuit 32 for performing control required for the row select operation of memory cell array 10 according to row address strobe signal /RAS and a refresh activation designating signal from data refresh control circuit 20, a column related control circuit 34 for performing control required for the column select operation of memory cell array 10 according to column address strobe signal /CAS, a read/write control circuit 36 receiving row address strobe signal /RAS, column address strobe signal /CAS, output enable signal /OE, and write enable signal /WE for generating a control signal required for data writing/reading, and an input/output circuit 38 for data transfer between a selected memory cell of memory cell array 10 and the outside world under control of read/write control circuit 36.

Row related control circuit 32 effects the active/inactive operation of row address buffer 32, row decoder 12, the sense amplifier and the bit line equalize/precharge circuit in array peripheral circuit 16 during activation of row address strobe signal /RAS and a data refresh activation designation signal from data refresh control circuit 20. Column related control circuit 34 has its operation inhibited during activation of CBR detection signal CBR, and has the column select operation inhibited in a data refresh operation.

Read/write control circuit 36 has its operation inhibited during activation of CBR detection under CBR under control of data refresh control circuit 20. In a normal operation, the activation timing of a preamplifier included in array peripheral circuit 16 for carrying out amplification of internal readout data is determined by activation of column address strobe signal /CAS. The data write operation timing towards selected memory cell by a write driver in peripheral circuit 16 is determined by the activation timing of both column address strobe signal /CAS and write enable signal /WE. Input/output circuit 38 includes an output buffer for providing external data and an input buffer for receiving externally applied data.

In FIG. 1, input/output circuit 38 is coupled to a data input/output terminal 40 to have data DQ input/output via data input/output terminal 40. Alternatively, individual terminals for data input and for data output can be provided.

Figure 2:
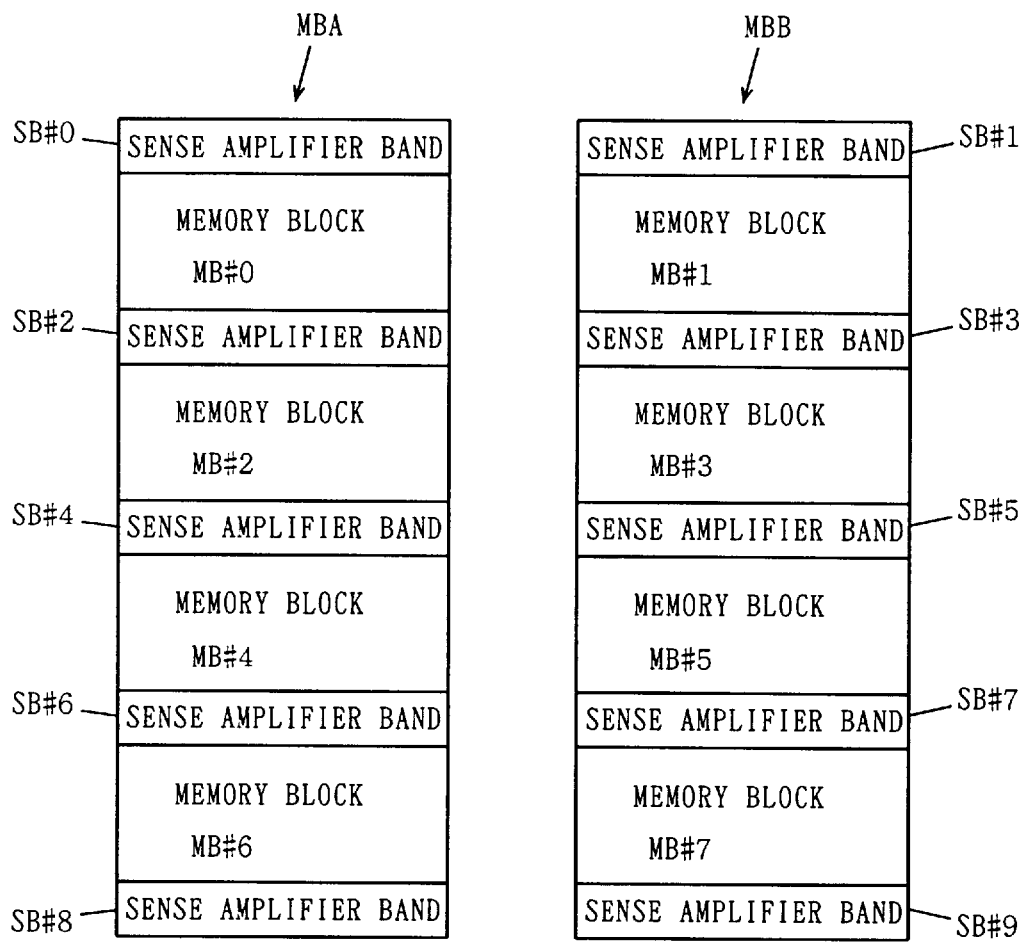
FIG. 2 is a schematic diagram showing a specific structure of the memory cell array of FIG. 1.

FIG. 2 schematically shows a structure of memory cell array 10 of FIG. 1. Referring to FIG. 2, memory cell array 10 includes two global memory blocks MBA and MBB. Global memory block MBA includes memory blocks MB#0, MB#2, MB#4 and MB#6, each having a memory cell of an SOI structure arranged in a matrix. Global memory block MBB includes memory blocks MB#1, MB#3, MB#5, and MB#7.

Global memory blocks (memory mat) MBA and MBB respectively have a sense amplifier band provided between adjacent memory blocks. More specifically, a sense amplifier band SB#2 is disposed between memory blocks MB#0 and MB#2. A sense amplifier band SB#4 is disposed between memory blocks MB#2 and MB#4. A sense amplifier band SB#6 is disposed between memory blocks MB#4 and MB#6. Sense amplifier bands SB#0 and SB#8 are disposed at the outer sides of memory blocks MB#0 and MB#6, respectively.

Similarly, in global memory block MBB, a sense amplifier band SB#3 is disposed between memory blocks MB#1 and MB#3. A sense amplifier band SB#5 is disposed between memory blocks MB#3 and MB#5. A sense amplifier band SB#7 is disposed between memory blocks MB#5 and MB#7. Sense amplifier bands SB#1 and SB#9 are disposed adjacent to and outer of memory blocks MB#1 and MB#7, respectively.

The arrangement of the sense amplifiers shown in FIG. 2 is known as a "shared sense amplifier" structure. One sense amplifier band is shared by the two adjacent memory blocks. In operation, the memory block including a selected memory cell is connected to the sense amplifier band. The memory block companion to the selected memory block is disconnected from the corresponding sense amplifier band. The remaining non-selected memory blocks are connected to the respective corresponding sense amplifier bands, and maintain a precharge state.

A row decode circuit is provided for each of memory blocks MB#0–MB#7. The row decode circuit is rendered active according to a block specify address to drive a row (word line) in a corresponding memory block to a selected state.

Figure 3:
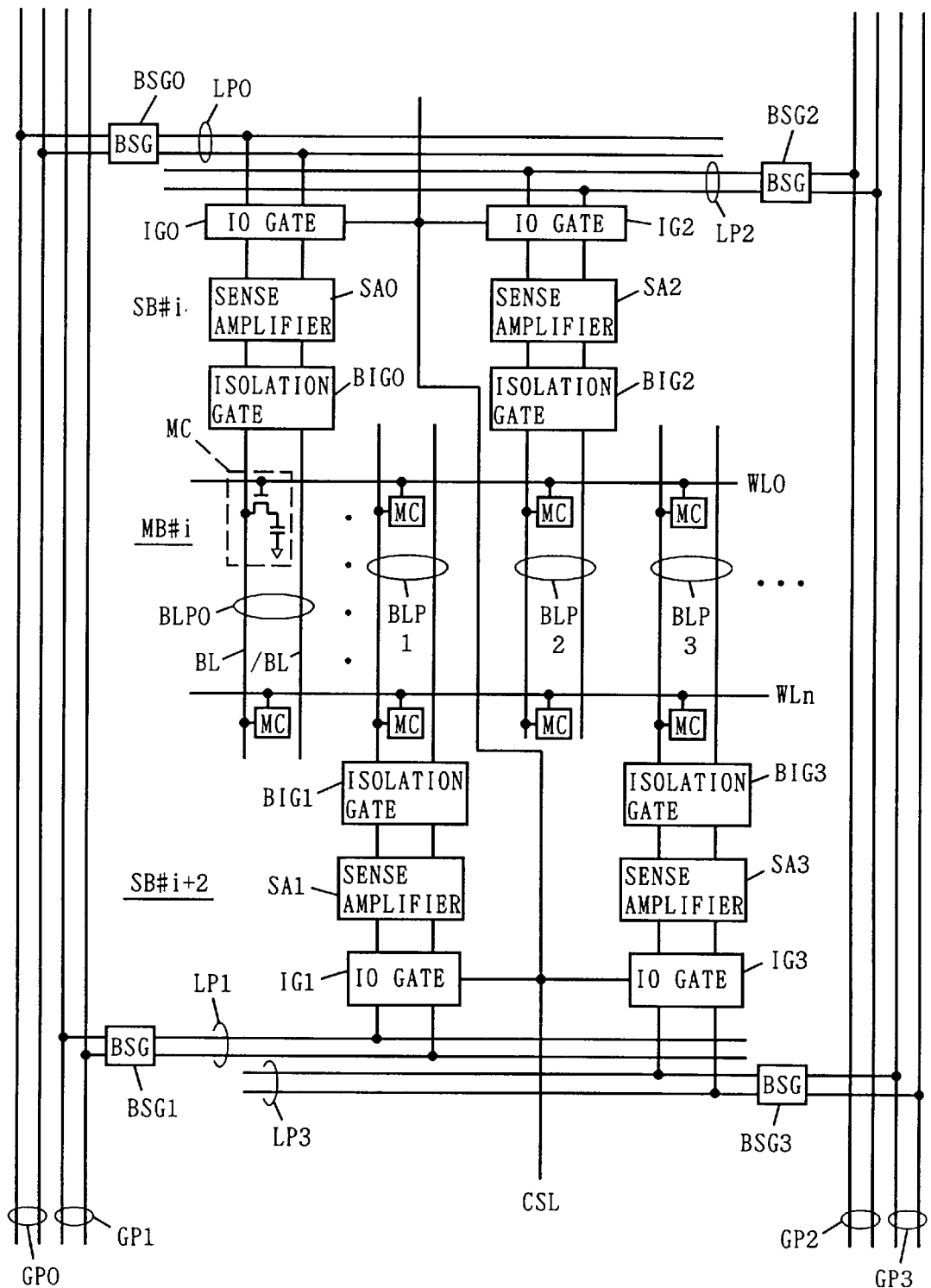
FIG. 3 is a schematic diagram of a structure of a sense amplifier band and memory block of FIG. 2.
Figure 38:
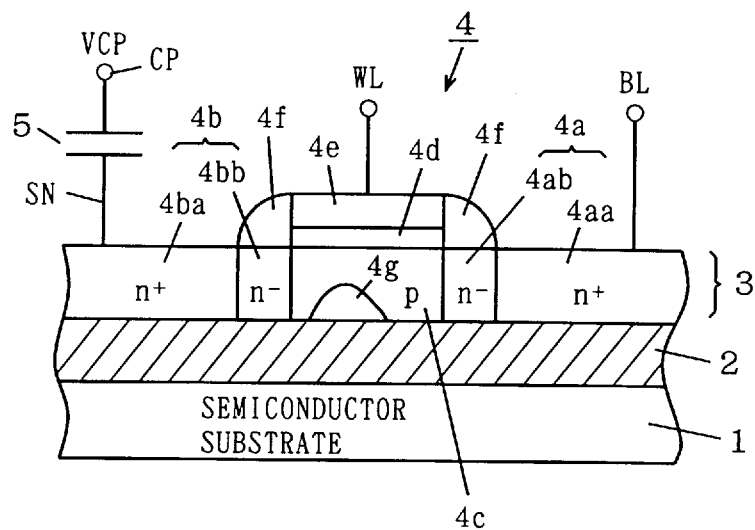
FIG. 38 is a schematic sectional view of a conventional SOI structure memory cell.
Figure 39:
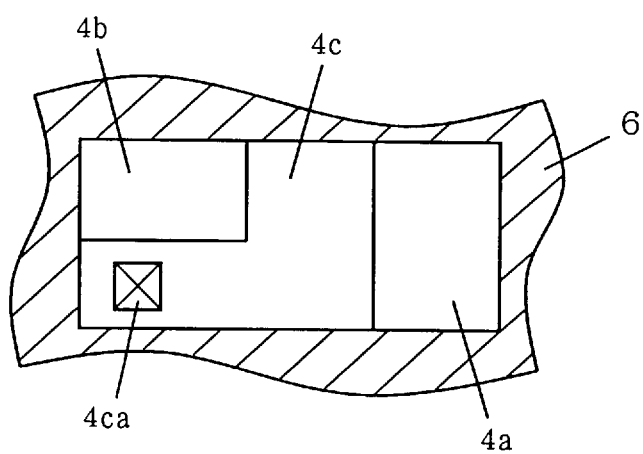
FIG. 39 is a diagram used for describing problems of a conventional SOI structure memory cell.

FIG. 3 schematically shows the structure of the portion associated with memory block MB#i. Referring to FIG. 3, memory block MB#i includes memory cells MC arranged in a matrix. Memory cell MC has an SOI structure already described with reference to FIG. 38. A word line WL is arranged corresponding to each row of memory cells MC. A bit line pair BLP is arranged as a column line for each column of memory cells MC. In FIG. 3, (n+1) word lines WL0, . . . , WLn and bit line pairs BLP0, BLP1, BLP2, and BLP3 corresponding to 4 columns of memory cells are shown. Each of bit line pairs BLP0–BLP3 includes a pair of bit lines BL and /BL. Data signals complementary to each other are transmitted to the pair of bit lines BL and /BL.

Sense amplifier bands SB#i and SB#i+2 are disposed at opposite sides of memory block MB#i. Sense amplifier band SB#i includes sense amplifiers SA0 and SA2 connected to bit line pairs BLP0 and BLP2 via isolation gates BIG0 and BIG2, respectively. Sense amplifier band SB#i+2 includes sense amplifiers SA1 and SA3 connected to bit line pairs BLP1 and BLP3 via isolation gates BIG1 and BIG3, respectively. More specifically, sense amplifier band SB#i includes a sense amplifier SA2k provided corresponding to an even numbered bit line pair BLP2k of memory block MB#i.

Sense amplifier band SB#i+2 includes a sense amplifier SA2k+1 provided corresponding to an odd numbered bit line pair BLP2k+1 of memory block MB#i.

Local IO line pairs LP0, LP1, LP2, and LP3 are disposed for memory block MB#i as internal data lines for data input/output. Local IO line pair LP0 is connected to sense amplifier SAO via IO gate IGO. Local IO line pair LP2 is connected to sense amplifier SA2 via IO gate IG2. Local IO line pair LP1 provided corresponding to sense amplifier band SB#i+2 is connected to sense amplifier SA1 via IO gate IG1. Local IO line pair LP3 is connected to sense amplifier SA3 via IO gate IG3. IO gates IG0–IG3 are selected simultaneously by a column select line CSL that transmits a column select signal from a column decoder not shown. Therefore, in the structure shown in FIG. 3, 4 bits of memory cells are selected simultaneously by one column select line CSL.

Column select line CSL is arranged extending in the column direction all over the global memory block. Local IO line pairs LP0–LP3 are disposed along the row direction only in a corresponding memory block.

Global IO line pairs GP0–GP3 are disposed by 2 pairs at each side of memory block MB#i in parallel to column select line CSL, common to each memory block in one global memory block. Global IO line pair GP0 is connected to local IO line pair LPO via block select gate BSG0. Global IO line pair GP1 is connected to local IO line pair LP1 via block select gate BSG1. Global IO line pair GP2 is connected to local IO line pair LP2 via block select gate BSG2. Global IO line pair GP3 is connected to local IO line pair LP3 via block select gate BSG3.

Block select gates BSG0 and BSG2 provided for sense amplifier band SB#i are driven conductive when memory block MB#i or MB#i−2 is selected (when including selected memory cell). Block select gates BSG1 and BSG3 provided for sense amplifier band SB#i+2 are driven conductive when memory block MB#i or MB#i+2 is selected.

Isolation gates BIG0 and BIG2 are rendered nonconductive when memory block MB#i−2 is selected. Isolation gates BIG1 and BIG3 are rendered non-conductive when memory block MB#i+2 is selected. More specifically, sense amplifier band SB#i is shared by memory blocks MB#i and MB#i−2. Sense amplifier band SB#i+2 is shared by memory blocks MB#i and MB#i+2.

In the structure of the memory block of FIG. 3, only the memory block containing an entire word line is illustrated. A structure can be provided where memory block MB#i is further divided into sub memory blocks in the unit of a plurality of columns, and have a global IO line pair and a local IO line pair arranged for each sub block. In the case of such a sub block structure, column selection is carried out in the unit of a sub block (word line is common to each sub block).

Figure 4:
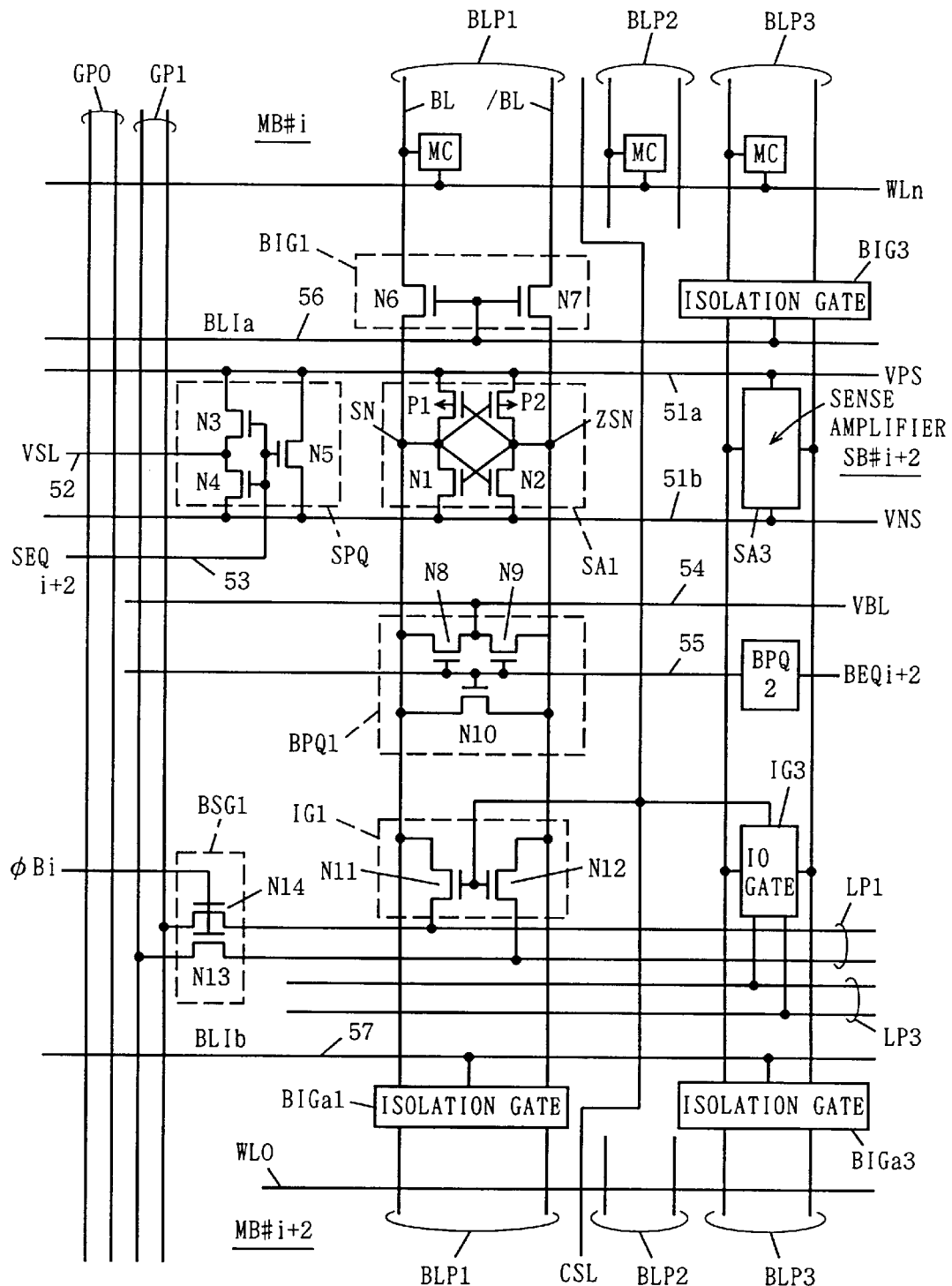
FIG. 4 specifically shows the structure of a sense amplifier band, an isolation gate, an IO gate, and a block select gate of FIG. 3.

FIG. 4 specifically shows a structure of the portion of sense amplifier band SB#i+2 of FIG. 3. In FIG. 4, only the structure of sense amplifier SA1 provided corresponding to bit line pair BLP1, bit line isolation gate BIG1, and IO gate IG1 is shown.

Sense amplifier SA1 includes a PMOS sense amplifier portion activated when a sense drive signal VPS transmitted on a sense drive signal line 51a is activated for driving either sense node SN or ZSN having the higher potential to an H level, and an NMOS sense amplifier portion activated when a sense drive signal VNS on a sense drive signal line 51b is activated for driving the potential of either sense node SN or ZSN having the lower potential to an L level. The PMOS sense amplifier portion includes a p channel MOS transistor P1 having a gate connected to sense node ZSN, one conduction node (source) connected to sense drive signal line 51a, and another conduction node connected to sense node SN, and a p channel MOS transistor P2 having a gate connected to sense node SN, one conduction node connected to sense drive signal line 51a, and another conduction node connected to sense node ZSN.

The NMOS sense amplifier portion includes an n channel MOS transistor N1 having a gate connected to node ZSN, one conduction node connected to sense drive signal line 51b, and another conduction node connected to sense node SN, and an n channel MOS transistor N2 having a gate connected to sense node SN, one conduction node connected to sense drive signal line 51b, and another conduction node connected to sense node ZSN. Sense amplifier SA3 indicated by only a block has a structure similar to that of sense amplifier SA1. Sense amplifier SA included in all sense amplifier bands is formed of a cross-coupled p channel MOS transistor and a cross-coupled n channel MOS transistor, similar to sense amplifier SA1.

A sense equalize circuit SPQ is provided for sense drive signal lines 51a and 51b to drive these signal lines 51a and 51b to a predetermined precharge potential level during inactivation of the sense amplifier. Sense equalize circuit SPQ is activated, when a sense equalize designating signal SEQi+2 on a sense equalize signal line 53 is activated, to transmit intermediate voltage VSL applied on signal line 52 and to electrically short-circuit sense drive signal lines 51a and 51b. More specifically, sense equalize circuit SPQ includes n channel MOS transistors N3 and N4 rendered conductive in response to sense equalize designating signal SEQi+2, to transmit intermediate voltage VSL to sense drive signal lines 51a and 51b, respectively, and an n channel MOS transistor N5 rendered conductive in response to activation of sense equalize designating signal SEQi+2, to electrically short-circuit sense drive signal lines 51a and 51b. Intermediate voltage VSL is generally ½ the sum voltage of operating power supply voltage VCC and ground voltage VSS.

Isolation gate BIG1 for connecting bit line pair BLP1 to sense nodes SN and ZSN includes n channel MOS transistors N6 and N7 rendered conductive in response to bit line isolation designating signal BLIa, to connect bit lines BL and /BL to sense nodes SN and ZSN, respectively. Isolation gate BIG3 has a structure similar to that of isolation gate BIG1.

A bit line equalize circuit BPQ (BPQ1, BPQ2, . . . ) is provided with respect to sense nodes SN and ZSN for precharging bit line pair BLP to the level of intermediate voltage VSL in a precharge operation. Bit line equalize circuit BPQ1 includes n channel MOS transistors N8 and N9 rendered conductive at activation (H level) of bit line equalize designating signal BEQi+2 on equalize signal transmission line 55 for transmitting voltage VBL applied on signal line 54 to sense nodes SN and ZSN, respectively, and an n channel MOS transistor N10 rendered conductive, in response to activation of bit line equalize designating signal BEQi+2, for electrically short-circuiting sense nodes SN and ZSN. In a precharged state, bit line isolation gate BIG (BIG1, BIG3, . . . ) attains a conductive state. Therefore, each bit line is precharged to a predetermined intermediate potential level by bit line equalize circuit BPQ.

IO gate IG1 includes n channel MOS transistors N11 and N12 rendered conductive, in response to a column select signal on column select line CSL, for connecting sense nodes SN and ZSN to local IO line pair LP1. IO gate IG3 similarly includes a pair of n channel MOS transistors. Block select gate BSG1 includes n channel MOS transistors N13 and N14 rendered conductive, in response to activation of block select signal φBi, for connecting local IO line pair LP1 to global IO line pair GP1. Block select signal φBi is rendered active when memory block MB#i or memory block MB#i+2 is selected.

FIG. 4 also shows bit line pairs BLP1, BLP2, and BLP3 included in memory block MB#i+2. Bit line pairs BLP1 and BLP3 are connected to corresponding sense amplifiers SA1 and SA3 via isolation gates BIGa1 and BIGa3, respectively. In a normal operation mode or in a data refresh operation mode, a selected memory block is connected to a sense amplifier band. Sensing and amplification of data of a selected memory cell is carried out by the sense amplifier in the sense amplifier band. Bit line isolation designating signal BLI for the memory block companion (sharing a sense amplifier band) to the selected memory block is rendered inactive to be disconnected from the corresponding sense amplifier. When the memory blocks sharing a sense amplifier band are both non-selected, bit line isolation designating signal BLI (BLIa, BLIb) maintains an H level. These non-selected memory blocks maintain a precharged state. Each bit line pair BLP is precharged to the level of intermediate voltage VBL.

In the present embodiment, body refresh is executed in another memory block parallel to data refresh using this bit line equalize circuit BPQ.

Figure 5A:
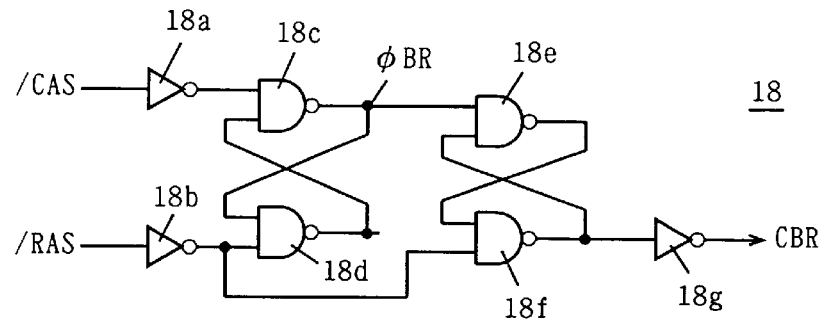
FIG. 5A shows an example of a structure of a CBR detection circuit of FIG. 1.
Figure 5B:
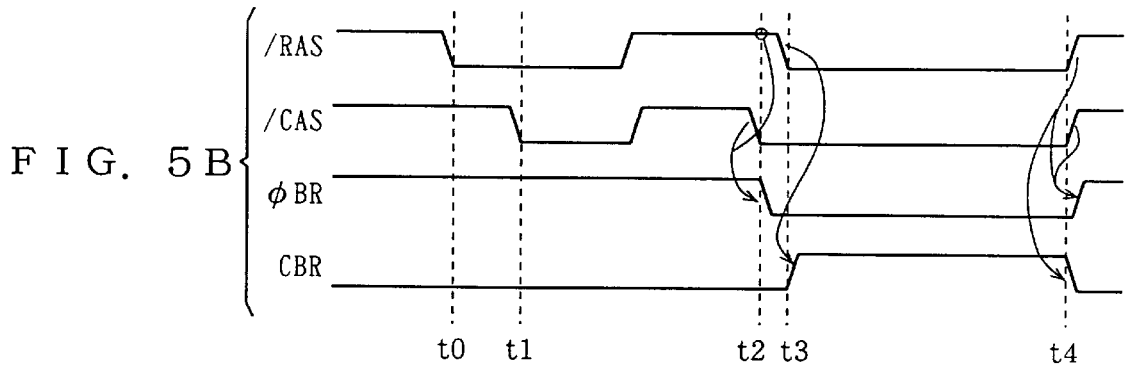
FIG. 5B is an operational waveform diagram thereof.

FIG. 5A shows an example of a structure of CBR detection circuit 18 of FIG. 1. Referring to FIG. 5A, CBR detection circuit 18 includes an inverter 18a receiving column address strobe signal /CAS, an inverter 18b receiving a row address strobe signal /RAS, a NAND circuit 18c receiving an output signal of inverter 18a, a NAND circuit 18d receiving an output signal of inverter 18b and an output signal φBR of NAND circuit 18c, a NAND circuit 18e receiving output signal φBR of NAND circuit 18c at one input, a NAND circuit 18f receiving an output signal of inverter 18b and output signal of NAND circuit 18e, and an inverter 18g receiving an output signal of NAND circuit 18f. CBR detection signal CBR is output from inverter 18g. NAND circuit 18e receives an output signal of NAND circuit 18f at the other input. The operation of CBR detection circuit 18 of FIG. 5A will be described with reference to the waveform diagram of FIG. 5B.

When address strobe signals /RAS and /CAS both attain an H level, the output signals of inverters 18a and 18b both attain an L level, and signal φBR attains an H level. Also, the output signal of NAND circuit 18f attains an H level, and CBR detection signal CBR attains an L level.

At time t0 when row address strobe signal /RAS is pulled down to an L level, signal φBR maintains an H level when column address strobe signal /CAS is at an H level, and the output signal of NAND circuit 18f is maintained at an L level since the output signal of NAND circuit 18e is at an H level.

At time t1 when column address strobe signal /CAS is pulled down to an L level, the output signal of NAND circuit 18d maintains an L level even when the output signal of inverter 18a is driven to an H level. Signals φBR and CBR do not change. In this state, a normal operation is carried out for data writing/reading.

At time t2 when column address strobe signal /CAS is pulled down to an L level during an H level period of row address strobe signal /RAS, both inputs of NAND circuit 18c are driven to an H level since the output signal of NAND circuit 18d attains an H level. As a result, signal φBR is driven to an L level. In response, the output signal of NAND circuit 18e is pulled up to an H level. In this state, CBR detection signal CBR which is an output signal of inverter 18g still maintains an L level.

At time t3 when row address signal /RAS is driven to an L level, the output signal of NAND circuit 18f is driven to an L level. CBR detection signal CBR from inverter 18b is pulled up to an H level. Signal CBR maintains an H level during the L level period of row address strobe signal /RAS.

At time t4 when row address strobe signal /RAS is pulled up to an H level, CBR detection signal CBR is driven to an L level. In response to this rise of row address strobe signal /RAS, the output signal of NAND circuit 18d is pulled up to an H level. Therefore, signal φBR is pulled up to an H level when column address strobe signal /CAS and row address strobe signal /RAS both attain an H level.

Data refresh is carried out at a predetermined interval during the period CBR detection signal CBR is at an H level. The refresh operation carried out during activation of signal CBR includes data refresh (CBR refresh) carried out in response to a rise of signal CBR, and data refresh (self refresh) carried out internally at a predetermined interval at an elapse of a predetermined time from the rise of signal CBR. In the first embodiment, the self refresh mode is employed. The operation employing a CBR refresh mode will be described in the second embodiment.

Figure 6:
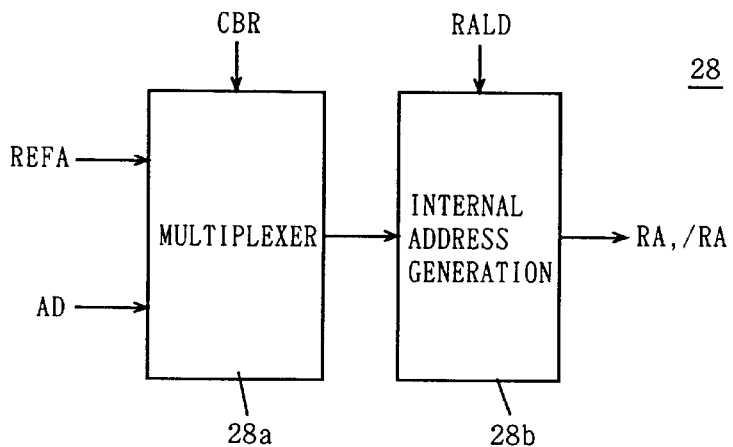
FIG. 6 schematically shows a structure of a row address buffer of FIG. 1.

FIG. 6 schematically shows a structure of the row address buffer of FIG. 1. Referring to FIG. 6, a row address buffer 28 includes a multiplexer 28a responsive to CBR detection signal CBR for selecting either a refresh address signal REFA from a refresh address counter or an externally applied address signal AD, and an internal address generation circuit 28b responsive to activation of an address latch/decode enable signal RALD provided from a row related control circuit that will be described afterwards to take in an address signal provided from multiplexer 28a for generating internal row address signals RA, /RA. Multiplexer 28a selects refresh address signal REFA and an externally applied address signal AD when CBR detection signal CBR is active (H level) and inactive, respectively. Internal row address signals RA and /RA are complementary to each other, and include both a block address specifying a memory block and an address specifying a word line in the specified memory block.

Figure 7:
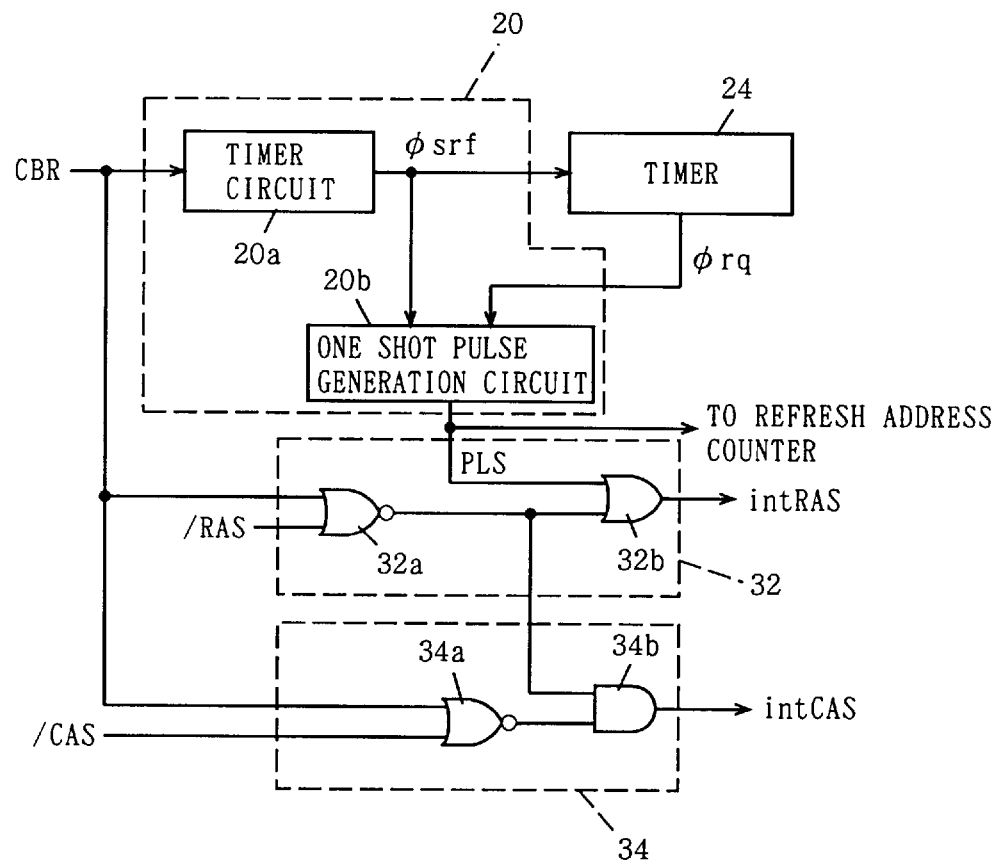
FIG. 7 schematically shows a structure of a data refresh control circuit, a body refresh control circuit, a row related control circuit, and a column related control circuit of FIG. 1.

FIG. 7 schematically shows the structure of data refresh control circuit 20, row related control circuit 32, and column related control circuit 34 of FIG. 1. Referring to FIG. 7, data refresh control circuit 20 includes a timer circuit 20a actuated, in response to activation of CBR detection signal CBR, for activating a self refresh mode designating signal φsrf at an elapse of a predetermined time period to provide this signal φsrf to timer 24, and a one shot pulse generation circuit 20b responsive to a rise of self refresh mode designating signal φsrf from timer circuit 20a and a refresh activation designating signal φfrq from timer 24 for generating a one shot pulse signal having a predetermined time width. Timer 24 responds to activation of self refresh mode designating signal φsrf to render refresh activation designating signal φrq active at a predetermined time interval. The pulse width generated by one shot pulse generation circuit 20b corresponds to a time width in which a word line is selected in one memory block, and detection, amplification and rewriting of data of a memory cell connected to the selected word line are carried out. One shot pulse generation circuit 20b includes a structure where a pulse generation circuit that generates a pulse signal in response to a rise of a signal and includes a well-known delay circuit and gate circuit is provided for self refresh mode designating signal φsrf and for refresh activation designating signal φrq and the outputs of these pulse generation circuits are ORed. The pulse signal from one shot pulse generation circuit 20b is provided to a refresh address counter (refer to FIG. 1) to update a refresh address. The refresh address may have its value updated at the end of one data refresh operation.

Row related control circuit 32 includes an NOR circuit 32a receiving CBR detection signal CBR and row address strobe signal /RAS, and an OR circuit 32b receiving a one shot pulse from one shot generation circuit 20b and an output signal of NOR circuit 32a. An internal row address strobe signal intRAS is provided from OR circuit 32b. A control signal related to row selection is sequentially rendered active in a predetermined sequence according to internal address strobe signal intRAS.

Column related control circuit 34 includes an NOR circuit 34a receiving CBR detection signal CBR and column address strobe signal /CAS, and an AND circuit 34b receiving output signals of NOR circuit 32a and NOR circuit 34a. An internal column address strobe signal intCAS is provided from AND circuit 34b. In response to activation (rise to an H level) of internal column address strobe signal intCAS, an operation related to column selection (including data writing/reading) is carried out. The operation will be described briefly herein below.

In a normal operation mode, CBR detection signal CBR is at an L level. NOR circuit 32a of row related control circuit 32a and NOR circuit 34a of column related control circuit 34b function as inverters respectively. When CBR detection signal CBR is inactive (L level), data refresh control circuit 20 is in an inactive state, and the output signal of one shot pulse generation circuit 20b is at an L level. Therefore, internal row address strobe signal intRAS is rendered active/inactive according to row address strobe signal /RAS. Internal column address strobe signal intCAS is rendered active/inactive according to column address strobe signal /CAS when the output signal of NOR circuit 32a attains an H level, i.e. when row address strobe signal /RAS attains an L level of an active state. In this state, access to a memory cell is carried out according to row address strobe signal /RAS and column address strobe signal /CAS.

In a refresh mode, timer circuit 20a is actuated in response to activation of CBR detection signal CBR. In row related control circuit 32, the output signal of NOR circuit 32a is fixed at an L level to inhibit control by an external row address strobe signal /RAS. In column related control circuit 34, the output signal of NOR circuit 34a is fixed at an L level, and internal column address strobe signal intCAS is kept in an inactive state. In other words, operation associated with column selection is inhibited during activation of CBR detection signal CBR.

Timer circuit 20a counts a predetermined time period when actuated, and drives self refresh mode designating signal φsrf to an active state of an H level at an elapse of a predetermined time period to indicate entry of a self refresh mode. One shot pulse generation circuit 20b responds to activation of self refresh mode designating signal φsrf to generate a one shot pulse signal PLS having a predetermined time width. Therefore, in row related control circuit 32, an internal row address strobe signal intRAS is output from OR circuit 32b according to the pulse signal output from one shot pulse generation circuit 20b to carry out a row select operation and sense amplifier activation. Timer 24 outputs refresh activation designating signal φrq at a predetermined time interval during activation of self refresh mode designating signal φsrf. In response, one shot pulse generation circuit 20b generates a one shot pulse at a predetermined time interval to activate internal row address strobe signal intRAS. Thus, memory cell data is refreshed at a predetermined interval in a memory cell array.

Figure 8:
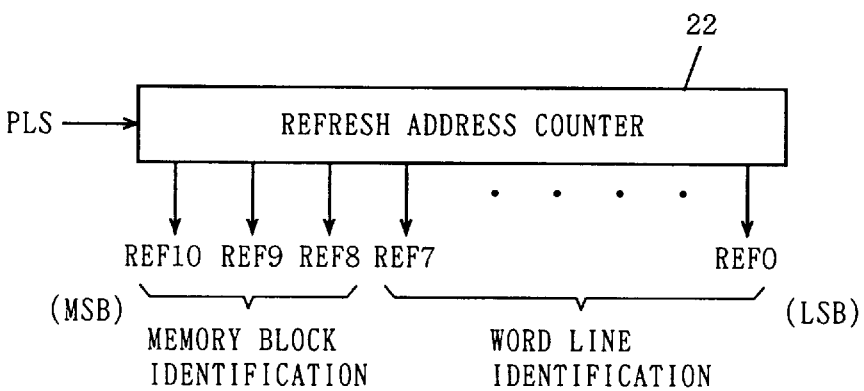
FIG. 8 schematically shows a structure of a refresh address bit output from a refresh address counter of FIG. 1.

FIG. 8 shows a structure of refresh address bits provided from refresh address counter 22 of FIG. 1. In FIG. 8, a structure of refresh address bits is shown in the case where one memory block includes 256 word lines corresponding to the structure of memory cell array 10 of FIG. 2. The less significant 8 bits REF <7:0> of refresh address REF <10:0> is used for specifying a word line. The more significant address bits REF <10:8> are used for specifying a memory block. Refresh address bit REF0 is the least significant bit (LSB), and refresh address bit REF10 is the most significant address bit (MSB). Refresh address counter 22 carries out a count operation according to activation of pulse signal PLS from one shot pulse generation circuit 20b shown in FIG. 7. Therefore, a word line is sequentially selected in one memory block for data refresh. Following the refresh operation of the memory cells connected to all the word lines in one memory block, the data refresh operation of the next memory block is initiated.

Figures 9, 10:
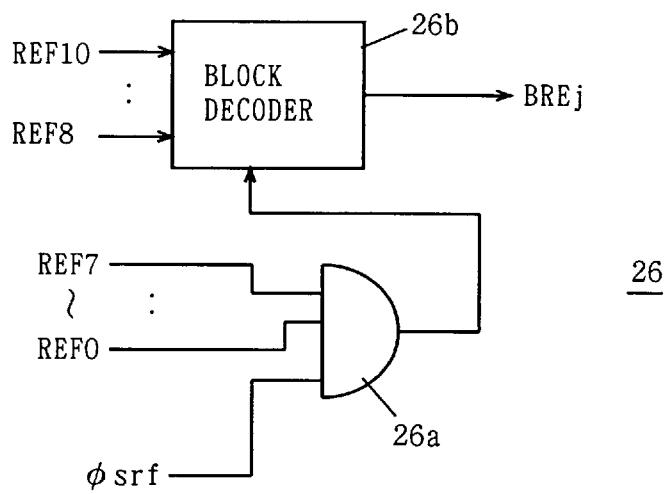
FIG. 9 schematically shows a structure of a body refresh control signal generation unit included in a body refresh control circuit of FIG. 1.
FIG. 10 is a diagram used for describing an operation of a block decoder of FIG. 9.

FIG. 9 shows an example of the structure of body refresh control circuit 26 of FIG. 1. Referring to FIG. 9, body refresh control circuit 26 includes an AND circuit 26a receiving the less significant 8-bits address REF0–REF7 from the refresh address counter (refer to FIG. 8) and self refresh mode designating signal φsrf, and a block decoder 26b activated, when the output signal of AND circuit 26a is activated, for decoding the more significant 3-bit addresses REF8–REF10 from the refresh address counter. Block decoder 26b provides a body refresh block designating signal BREj designating a memory block that is to be subjected to body refresh.

According to the structure of the body refresh control circuit shown in FIG. 9, the output signal of AND circuit 26a is rendered active of an H level to enable block decoder 26b when the memory cell of the last word line (word line WL 255) in one memory block is refreshed. Therefore, when data of memory cells of the last word line in one memory block are refreshed, body refresh in another block is carried out. FIG. 10 shows a decode manner of block decoder 26b of FIG. 9.

As the count values of the more significant 3 bit refresh addresses REF <10:8> are incremented one by one sequentially from (0, 0, 0) to (1, 1, 1), the memory block subjected to data refresh is sequentially updated from memory block MB#0 to memory block MB#7. As the memory block to which a body refresh operation is applied, the memory block subjected to the next data refresh operation is specified. More specifically, when refresh address bits REF <10:8>0 are sequentially incremented from (0, 0, 0) to (1, 1, 0), the body refresh memory block is sequentially updated from memory block MB#1 to memory block MB#7. When refresh address bits REF <10:8> specify (1, 1, 1), memory block MB#0 is specified as the body refresh memory block.

The structure of a block decoder for a body refresh operation shown in FIG. 10 is implemented by making the connection of the block refresh address signal bits in each decode circuit in block decoder 26b such that the number of the memory block differs by 1 from that in the block decoder for specifying the data refresh memory block.

Figure 11:
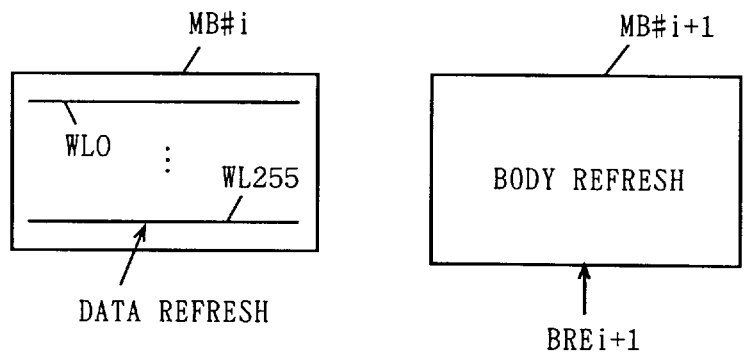
FIG. 11 schematically shows the correspondence between a data refresh operation and a body refresh operation according to the first embodiment of the present invention.

FIG. 11 shows the operation timing of data refresh and body refresh. When data refresh is carried out on the last word line WL255 in one memory block MB#i, the next memory block MB#i+1 for data refresh is selected, and a body refresh operation is carried out. This operation is carried out simultaneously for the memory cells in memory block MB#i+1, as will be described in detail afterwards. Therefore, only one body refresh operation is carried out during the data refresh operation of one memory block. This means that the number of body refresh operations is 1/256 of the number of data refresh operations. Thus, power consumption for a body refresh operation can substantially be neglected.

By carrying out body refresh in the next memory block, data can be refreshed in a state where few majority carriers are accumulated in the body region. The sub threshold leakage current for refresh data is suppressed in improve the data retaining characteristics. More specifically, by discharging the majority carriers in the body region, a self refresh operation is carried out under the state where the potential of the body region is low. In this self refresh operation, each bit line potential is driven to an H level or an L level. A disturbance operation will occur where majority carriers are injected into the body region of a memory cell that is not subjected to data refresh and is connected to a bit line of an H level in the same memory block. However, since a memory block that is subjected to data refresh is already subjected to body refresh immediately before, the amount of majority carriers stored in the body region is minimized.

Data refresh is carried out in a state where the sub threshold leakage current is smallest, so that data can be reliably refreshed. Furthermore, since the number of majority carriers stored in the body region is small after the refresh operation, the sub threshold leakage current is extremely small. Since the rate of the data to be altered by this sub threshold leakage current after the refresh operation is minimized, the refreshed data can be reliably retained over a long time period.

In the case where the number of refresh address bits increases according to increase in the memory capacity in the structure of body refresh control circuit 26 of FIG. 9, a structure may be employed where a counter which is activated during activation of self refresh mode designating signal φsrf for counting activation of internal row address strobe signal intRAS is used, whereby block decoder 26b carries out a decode operation according to the output of this counter.

Although it has been described that data refresh is sequentially carried out in one memory block, in the case where a plurality of memory blocks are subjected to data refresh at the same time a structure may be employed that a plurality of memory blocks differing from those subjected to data refresh and to be subjected to the next data refresh can be subjected to body refresh simultaneously.

Furthermore, it is not necessary to carry out body refresh and data refresh at identical timing. Body refresh operation may be carried out after data refresh operation. In a self refresh mode, the data refresh interval is sufficiently longer than the time required for data refresh. A data refresh operation and a body refresh operation can be executed with sufficient margin during two consecutive data refresh operations.

Figure 12:
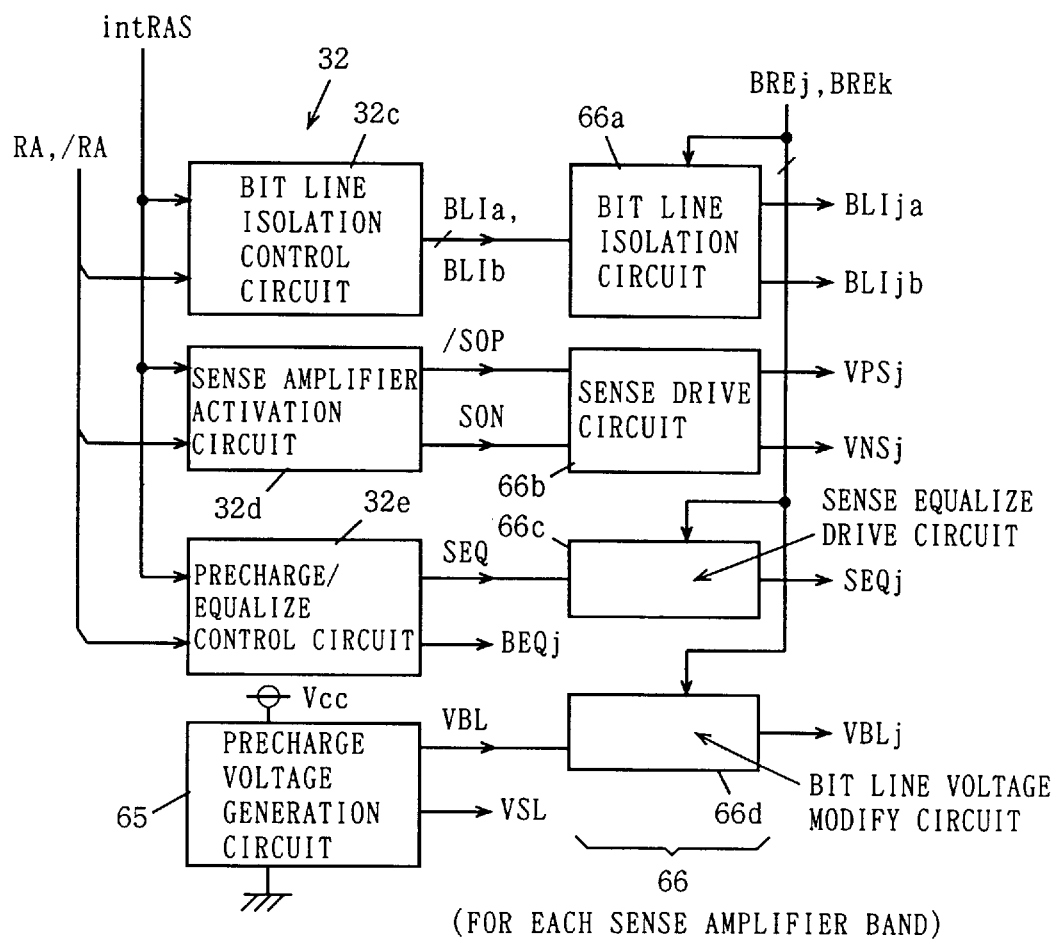
FIG. 12 schematically shows a structure of a body refresh control unit with respect to one sense amplifier band according to the first embodiment of the present invention.

FIG. 12 schematically shows a structure of row related control circuit 32 shown in FIG. 1 and a body refresh execution unit included in the array peripheral circuit provided for one sense amplifier band.

Referring to FIG. 12, row related control circuit 32 includes a bit line isolation control circuit 32c for providing a bit line isolation signal BLI controlling connection/disconnection between a memory block and a sense amplifier band according to internal row address strobe signal intRAS and internal row address signals (including block address) RA and /RA, a sense amplifier activation circuit 32d for generating a signal activating a sense amplifier band for a selected memory block according to internal row address strobe signal intRAS and internal row address signals RA and /RA, and a precharge/equalize control circuit 32e for controlling precharge/equalize of a bit line and sense amplifier drive signal line according to internal row address strobe signal intRAS and internal row address signals RA and /RA.

Bit line isolation control circuit 32c, sense amplifier activation circuit 32d and precharge/equalize control circuit 32e have a structure similar to that used in a general DRAM. In response to activation of internal row address strobe signal intRAS, activation of a sense amplifier provided for a selected memory block and inactivation of the bit line precharge/equalize circuit and sense amplifier drive signal line precharge/equalize circuit for the selected memory block are effected, and the selected memory block is connected to a corresponding sense amplifier band.

A precharge voltage generation circuit 65 is provided for generating an intermediate voltage Vcc/2 from power supply voltage vcc and the ground voltage to precharge a bit line and a sense drive signal line to a predetermined potential. Bit line precharge voltage VBL and sense drive signal line precharge voltage VSL are provided from precharge voltage generation circuit 65. Precharge voltage generation circuit 65 can be provided for each global memory block, or in common to all global memory blocks.

Body refresh circuit 66 for carrying out a body refresh operation is activated according to body refresh designating signals BREj and BREk. Body refresh designating signal BREj designates body refresh of memory block MB#j, and body refresh designating signal BREk designates body refresh of memory block MB#k. Memory blocks MB#j and MB#k indicate adjacent memory blocks sharing a sense amplifier band in one global memory block.

Body refresh circuit 66 includes a bit line isolation circuit 66a for providing bit line isolation designating signals BLIja and BLIjb according to body refresh designating signals BREj and BREk and bit line isolation signals BLIa and BLIb, a sense drive circuit 66b for providing sense amplifier drive signals VPSj and VNSj according to body refresh designating signals BREj and BREk and sense amplifier activation signals /SOP and SON, a sense equalize drive circuit 66c for providing a sense amplifier drive signal line equalize designating signal SEQj according to body refresh designating signals BREj and BREk and sense amplifier drive signal line equalize designating signal SEQ, and a bit line voltage modifying circuit 66d for setting the bit line precharge voltage to either intermediate voltage (Vcc/2) or body refresh potential VBR according to body refresh designating signals BREj and BREk and bit line precharge voltage VBL. Sense amplifier drive signal line precharge voltage VSL from precharge voltage generation circuit 65 is directly provided to a sense amplifier drive signal line precharge/equalize circuit of a corresponding sense amplifier band.

Figure 13:
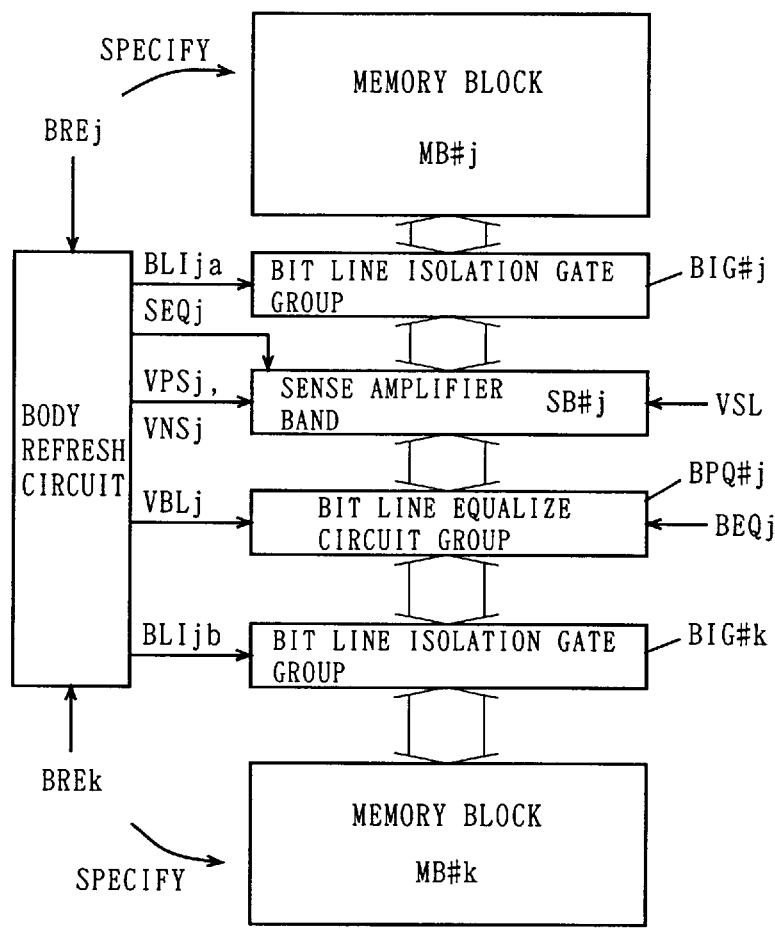
FIG. 13 shows the correspondence between the output signal/voltage of the body refresh control unit of FIG. 12 and the portion receiving the signal/voltage.

FIG. 13 schematically shows the circuitry to which the output signal/voltage of body refresh circuit 66 is applied. In FIG. 13, a sense amplifier band SB#j is provided between memory blocks MB#j and MB#k. Bit line isolation gate group BIG#j is disposed between memory block MB#j and sense amplifier band SB#j. Bit line isolation gate group BIG#k is disposed between sense amplifier band SB#j and memory block MB#k. Bit line equalize circuit group BEQ#j is disposed between sense amplifier band SB#j and bit line isolation gate group BIG#k. Although not explicitly illustrated, a sense amplifier drive signal line equalize circuit is arranged in sense amplifier band SB#j.

Bit line isolation designating signal BLIja is applied to bit line isolation gate group BIG#j. Sense amplifier drive signals VBSj and VNSj are applied to sense amplifier band SB#j. Bit line precharge voltage VBLj is applied to bit line equalize circuit group BPQ#j. Bit line isolation designating signal BLIjb is applied to bit line isolation gate group BIG#k. Control of activation/inactivation of bit line equalize circuit group BPQ#j is carried out by bit line equalize/precharge designating signal BEQJ provided from precharge/equalize control circuit 32e included in row related control circuit 32 of FIG. 12.

Although not explicitly illustrated, sense amplifier drive signal line precharge voltage VSL from precharge voltage generation circuit 65 of FIG. 12 is applied to the sense amplifier drive signal line precharge/equalize circuit. Sense amplifier drive signal line precharge/equalize designating signal SEQj from body refresh circuit 66 is applied to this sense amplifier drive signal line precharge/equalize circuit. Body refresh circuit 66 controls bit line isolation gate groups BIG#j and BIG#k so that a memory block for body refresh is connected to bit line equalize circuit group BEQ#j and also controls the operation of sense amplifier band SB#j and the sense amplifier drive signal line precharge/equalize circuit according to body refresh designating signals BREj and BREk.

Figure 14:
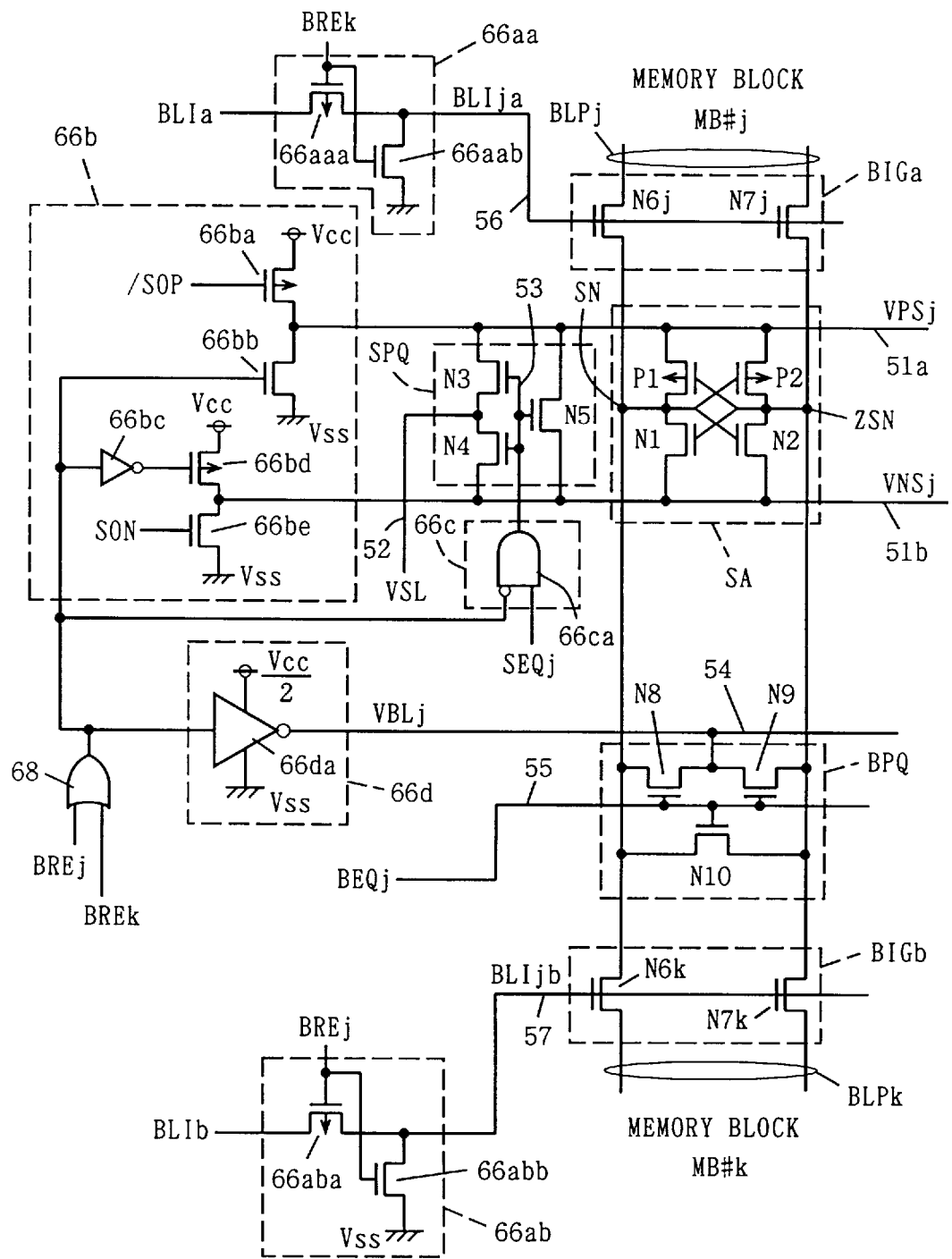
FIG. 14 specifically shows a structure of the body refresh circuit of FIG. 13.

FIG. 14 shows a specific structure of body refresh circuit 66 shown in FIGS. 12 and 13. Referring to FIG. 14, bit line isolation circuit 66a includes a sub bit line isolation circuit 66aa for providing bit line isolation designating signal BLIja for memory block MB#j on a signal line 56, and a sub bit line isolation circuit 66ab for providing a bit line isolation designating signal BLIjb for memory block MB#k on a signal line 57. Sub bit line isolation circuit 66aa includes a p channel MOS transistor 66aaa rendered conductive, during inactivation of body refresh designating signal BREk, to transmit bit line isolation signal BLIa onto signal line 56, and an n channel MOS transistor 66aab rendered conductive, when body refresh designating signal BREk is active, to drive signal line 56 to the level of the ground voltage. Sub bit line isolation control circuit 66ab includes a p channel MOS transistor 66aba rendered conductive, when body refresh designating signal BREj is inactive, to transmit bit line isolation signal BLIjb on signal line 57, and an n channel MOS transistor 66abb rendered conductive, when body refresh designating signal BREj is active, to drive signal line 57 to the level of ground potential Vss.

Sense drive circuit 66b includes a p channel MOS transistor 66ba rendered conductive, when sense amplifier activation signal /SOP is active, to transmit power supply voltage Vcc onto a sense amplifier drive signal line 51a; an n channel MOS transistor 66bb rendered conductive when the output signal of OR gate 68 receiving body refresh designating signals BREj and BREk is active, to drive sense amplifier drive signal line 51a to the level of ground voltage Vss; an inverter 66bc receiving an output of OR circuit 68, a p channel MOS transistor 66bb rendered conductive, when the output signal of inverter 66bc attains an L level, to transmit power supply voltage Vcc onto sense amplifier drive signal line 51b; and an n channel MOS transistor 66be rendered conductive, when sense amplifier activation signal SON is active (H level), to drive sense amplifier drive signal line 51b to the level of ground voltage Vss.

Sense equalize drive circuit 66c includes a gate circuit 66ca receiving an output signal of OR gate 68 and a sense amplifier drive signal line equalize designating signal SEQj. Gate circuit 66ca operates as a buffer when the output signal of OR circuit 68 attains an L level, and provides a signal of an L level when the output signal of OR gate 68 attains an H level.

Bit line voltage modify circuit 66d includes an inverter buffer 66da operating with intermediate voltage Vcc/2 and ground voltage Vss as operating power supply voltages to invert the output signal of OR circuit 68. Inverter buffer 66da can be substituted with a multiplexer that selects either intermediate voltage Vcc/2 or ground voltage Vss according to an output signal of OR circuit 68 to transmit the selected voltage onto signal line 54.

In FIG. 14, one bit line pair BLPj of memory block MB#j and one bit line pair BLPk of memory block MB#k are representatively shown. The structure of bit line precharge/equalize circuit BPQ, sense amplifier SA, sense amplifier drive signal line precharge/equalize circuit SPQ, and bit line isolation gates BIGa and BIGb are similar to those shown in FIG. 4. Corresponding components have same reference characters allotted, and detailed description thereof will not be repeated. The operation of circuitry shown in FIGS. 12–14 will now be described with reference to the operational waveform diagrams of FIGS. 15 and 16.

Figure 15:
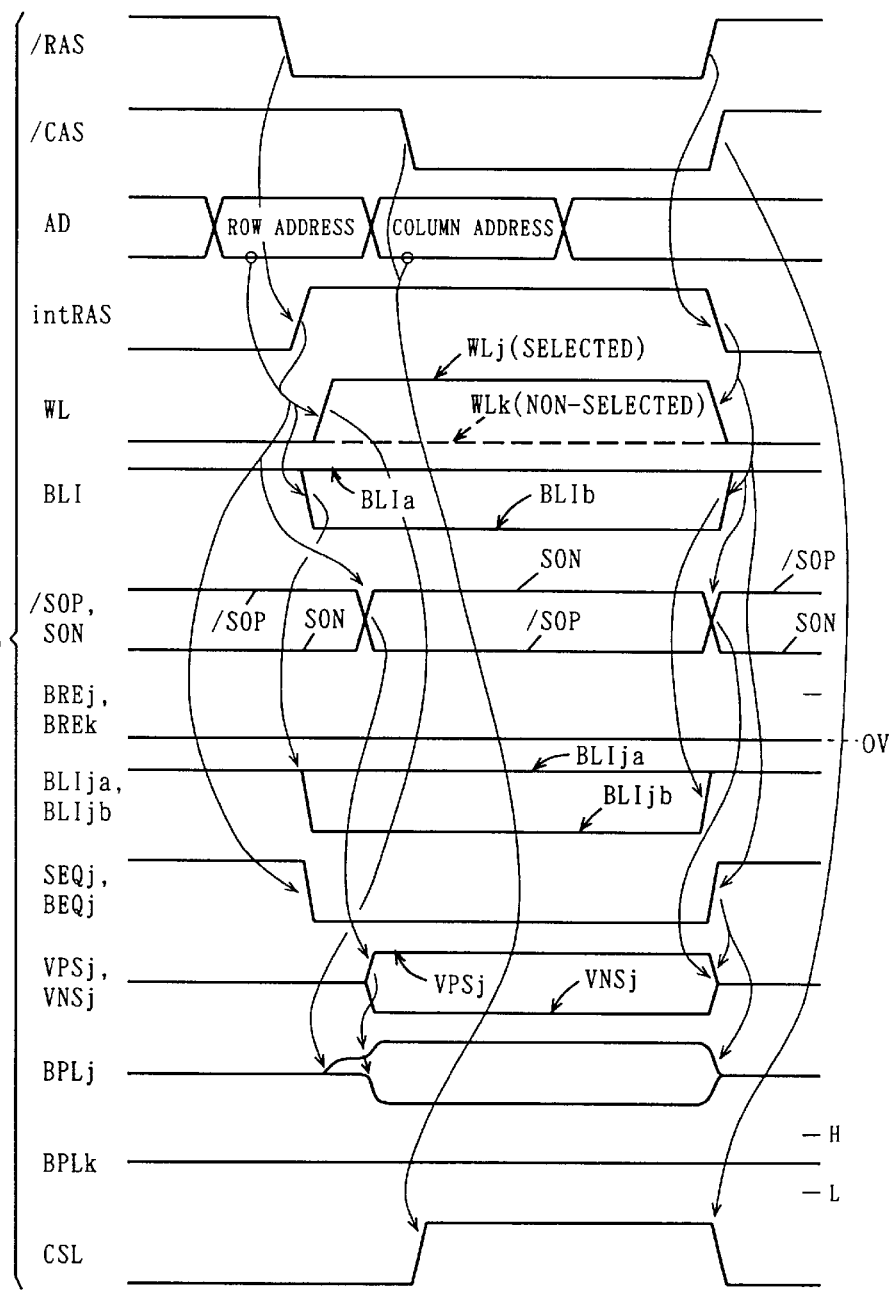
FIG. 15 shows a signal waveform of the SOIDRAM according to the first embodiment of the present invention in a normal operation.

FIG. 15 represents the operation in a normal operation mode. Row address strobe signal /RAS is rendered active at an L level, and then column address strobe signal /CAS is rendered active of an L level. This signal sequence does not satisfy the CBR condition. In response to a fall of row address strobe signal /RAS, internal row address strobe signal intRAS is driven to an active state of an H level. In response to a rise of internal row address strobe signal intRAS, address signal AD is taken as a row address for execution of a row select operation. It is now assumed that memory block MB#j includes a selected memory cell. In this case, bit line isolation signal BLIa maintains an H level according to the row address and internal row address strobe signal intRAS. In contrast, bit line isolation signal BLIb for non-select memory block MB#k is driven to an L level.

According to internal row address strobe signal intRAS and the row address, sense amplifier drive signal line precharge designating signal SEQj and bit line equalize designating signal BEQj for sense amplifier band SB#j are rendered inactive at an L level. Body refresh designating signals BREj and BREk both attain an L level, and the output signal of OR gate 68 shown in FIG. 14 attains an L level. Therefore, according to bit line isolation signals BLIa and BLIb, sub bit line isolation control circuits 66aa and 66ab function to transmit bit line isolation designating signals BLIja and BLIjb onto signal lines 56 and 57 via p channel MOS transistors 66aaa and 66aba, respectively. As a result, memory block MB#j is connected to sense amplifier band SB#j and memory block MB#k is isolated from sense amplifier band SB#j. Also, according to equalize designating signals SEQj and BEQj, sense amplifier drive signal line precharge/equalize circuit SPQ and bit line precharge/equalize BPQ are both rendered inactive, whereby sense amplifier drive signal lines 51a and 51b and bit line pair BLPj attain an electrically floating state.

According to internal address strobe signal intRAS and the row address, the word line (WLj) in memory block MB#j is driven to a selected state. The word line (WLk) in memory block MB#k is kept in a non-selected state. When word line WLj is selected, the data of the memory cell connected to word line WLj is read onto bit line pair BLPj. The potential of bit line pair BLPj makes a transition from the precharged potential of the intermediate potential level according to the readout data. In FIG. 15, a waveform in the case where data of an H level is readout is shown.

When the signal potential of bit line pair BLPj is increased sufficiently, sense amplifier activation signals /SOP and SON are driven to an active state of an L level and an H level, respectively, according to internal row address strobe signal intRAS.

P channel MOS transistor 66ba and n channel MOS transistor 66be in sense drive circuit 66b conduct. Signal VPSj on signal line 51a is driven to an H level of power supply voltage Vcc. Signal VNSj on signal line 51b is driven to the level of the ground voltage. In response, sense amplifier SA is activated, whereby the potential difference on bit line pair BLPj is amplified and latched by p channel MOS transistors P1 and P2 and n channel MOS transistors N1 and N2. In memory block MB#k, bit line pair BLPk maintains a precharged state.

In response to a fall of column address strobe signal /CAS, address signal AD is taken as a column address, whereby a column select operation is initiated after a sense operation is completed. By this column select operation, the potential of the signal on column select line CSL corresponding to the addressed column is driven to an H level to select a memory cell. Data is written or readout from the selected memory cell.

Upon completion of a memory cycle, row address strobe signal /RAS is driven to an inactive state of an H level. Also, column address strobe signal /CAS is driven to an inactive state of an H level. In response to inactivation of row address strobe signal /RAS, internal row address strobe signal intRAS is driven to an inactive state of an L level, and selected word line WLj is driven to an non-selected state. Then, sense amplifier activation signals SON and /SOP are driven to an L level and an H level of inactivation, respectively and sense amplifier SA is rendered inactive. Precharge/equalize signals BEQj and SEQj are also driven to an H level of an active state. Precharge/equalize circuits SPQ and BPQ are activated to precharge/equalize the potential of bit line pair BLPj to intermediate potential VBL, and sense amplifier drive signal lines 51a and 51b to an intermediate power supply potential VSL. Then, bit line isolation signal BLIb at a non-selected state rises to an H level, whereby memory block MB#k (bit line pair BLPk) is connected to sense amplifier band SB#j (sense amplifier SA). In response to inactivation of column address strobe signal /CAS, the column select signal on column select line CSL also falls to an L level. As a result, memory block MB#j returns to a precharged state.

The data refresh operation of a memory block is carried out according to the same operation waveform of FIG. 15 provided that column address strobe signal /CAS is driven to an L level at a timing earlier than falling of row address strobe signal /RAS, a refresh address REF is used as a row address, and column selection is not carried out (column select line CSL maintains an L level). Therefore, description of the operation for data refresh is not repeated. The operation of body refresh will now be described with reference to FIG. 16.

When column address strobe signal /CAS is driven to an L level at a timing earlier than the falling of row address strobe signal /RAS, a refresh mode is entered, and CBR detection signal CBR is pulled up to an H level. At an elapse of predetermined time T from the rise of CBR detection signal CBR to an H level, self refresh mode designating signal φsrf attains an H level. The SOIDRAM enters a self refresh mode. In the self refresh mode, refresh activation designating signal φrq is rendered active at an H level at a predetermined time interval. In response to activation of refresh activation signal φrq, internal row address strobe signal intRAS attains an H level for a predetermined time.

Figure 16:
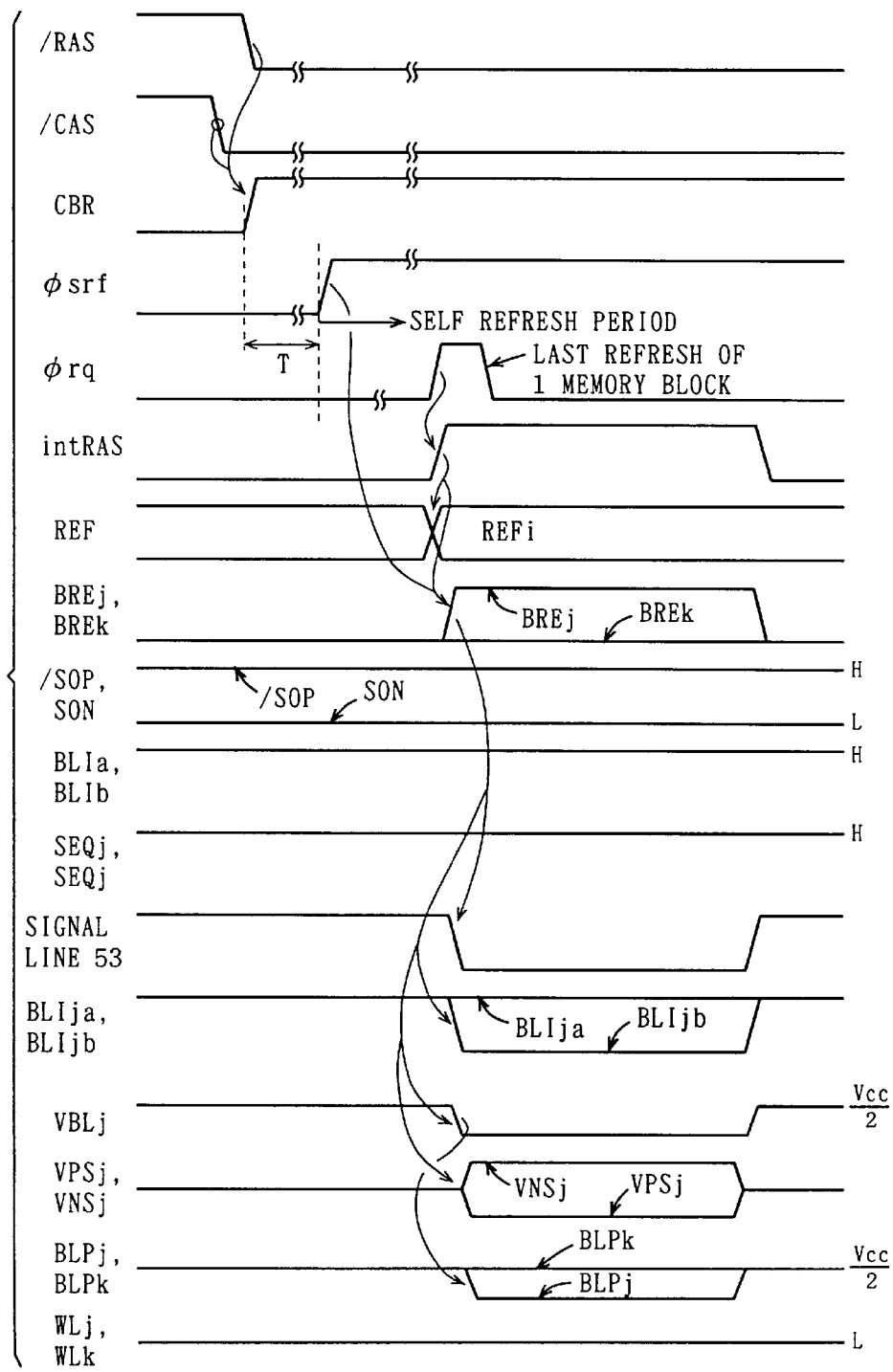
FIG. 16 shows each signal waveform in a body refresh operation according to the first embodiment of the present invention.

When refresh activation designating signal φrq attains an active state of an H level and internal row address strobe signal intRAS attains an active state for a predetermined time, body refresh operation is activated when refresh address REFi designates the last word line in one memory block (memory block MB#i). FIG. 16 shows the operational waveform where body refresh is carried out for memory block MB#j. Therefore, body refresh designating signal BREj for memory block MB#j attains an H level, and body refresh designating signal BREk for memory block MB#k attains an L level. Since data refresh is not carried out even if body refresh designating signal BREj is activated, sense amplifier activation signals /SOP and SON maintain the inactive state of an H level and an L level, respectively. Also, bit line isolation signals BLIa and BLIb maintain an H level, and precharge/equalize designating signals SEQj and BEQj maintain an active state of an H level.

When body refresh designating signal BREj rises to an H level, the signal transmitted on signal line 53 from sense equalize drive circuit 66c shown in FIG. 14 attains an L level, whereby sense amplifier drive signal line precharge/equalize circuit SPQ is rendered inactive.

In sense drive circuit 66b, MOS transistors 66bb and 66bd are turned on according to an output signal of OR circuit 68. Sense amplifier drive signals VPSj and VNSj on sense amplifier drive signal lines 51a and 51b are driven to an L level and an H level, respectively, from the level of intermediate voltage VSL.

Since MOS transistor 66aaa attains a conductive state and MOS transistor 66aab attains an non-conductive state in sub bit line isolation circuit 66aa, isolation designating signal BLIja on signal line 56 maintains an H level according to bit line isolation signal BLIa of an H level. Therefore, bit line pair BLPj is connected to sense amplifier SA via bit line isolation gate BIGa. In sub bit line isolation circuit 66ab, MOS transistor 66aba is rendered non-conductive, and MOS transistor 66abb is rendered conductive. Bit line isolation designating signal BLIjb on signal line 57 is pulled down to an L level. In response, bit line pair BLPk of memory block MB#k is disconnected from sense amplifier SA. More specifically, memory block MB#k is isolated from sense amplifier band SB#j, and memory block MB#j is connected to sense amplifier band SB#j.

Bit line voltage modify circuit 66d responds to an output signal of an H level from OR circuit 68 to drive bit line precharge voltage VBLj to the level of ground voltage. Bit line precharge voltage VBLj of the ground voltage level is transmitted to each bit line pair BLPj, . . . of memory block MB#j via isolation gate BIGa (bit line isolation gate group BIG#j). Since data refresh is not carried out in memory blocks MB#j and MB#k, the word line (WLj and WLk) is in an inactive state of an L level.

In a memory cell of an SOI structure, forward bias is established between the body region where the potential is increased by storage of majority carriers and bit line BL or /BL, whereby the majority carriers stored in the body region are discharged towards bit lines BL and /BL. The reason why the voltages of sense amplifier drive signals VPSj and VNSj are driven to a voltage level of a polarity opposite to that of activation from the intermediate voltage level in a body refresh operation is set forth in the following. In a body refresh operation, sense nodes SN and ZSN attain an L level. When the level of the voltage on sense amplifier drive signal line 51a is higher than this ground voltage, PMOS transistors P1 and P2 conduct, whereby current is supplied from signal line 51a to sense nodes SN and ZSN. Power consumption will be increased, and the bit line potential is increased to impede the body refresh operation.

In MOS transistors N1 and N2, current will not be conducted when the voltage level of sense amplifier drive signal VNSj on signal line 51b is higher than the voltage level of sense nodes SN and ZSN. However, since the gate and source of MOS transistors N1 and N2 attain the same potential level in a body refresh operation, there is a possibility that noise is generated at sense nodes SN and ZSN by some cause to result in conduction of one of MOS transistors N1 and N2. In order to prevent such a current flow via sense amplifier band SA in a body refresh operation, sense amplifier drive signal line VPSj and sense amplifier drive signal line VNSj are driven to an L level and an H level, respectively. Therefore, even if the potentials of sense nodes SN and ZSN rise due to noise generation in sense nodes SN and ZSN or discharge of majority carriers in a body refresh operation, sense amplifier SA can be rendered inactive reliably to suppress generation of power consumption by this sense amplifier band (sense amplifier SA).

Figure 17:
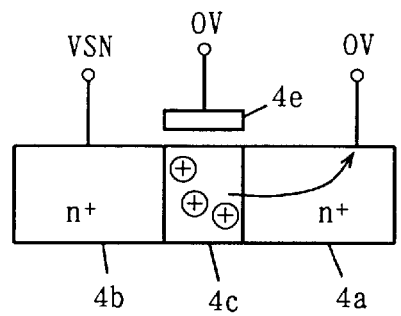
FIG. 17 is a diagram used for describing a body refresh operation according to the first embodiment of the present invention.

FIG. 17 is a diagram used for describing a body refresh operation. Referring to FIG. 17, the gate of an access transistor of an SOI memory cell is maintained at 0V with the word line at an inactive state. Source/drain 4a connected to the bit line is maintained at 0V. The other source/drain 4b is maintained at voltage VSN according to the stored information. In this state, body region 4c has a potential higher than 0V due to the storage of the majority carriers (holes). By maintaining source/drain 4a at the ground potential of 0V, the PN junction between body region 4c and source/drain 4a can be biased in the forward direction. The majority carriers stored in body region 4c can be discharged onto the bit line by the forward current. As a result, the potential of body region 4c can be reduced.

Bit line precharge voltage VBLj is applied to memory block MB#j entirely. By one body refresh operation, all memory cells in memory block MB#j can be subjected to body refresh simultaneously. This body refresh is carried out only once during the data refresh operation carried out for all memory cells of one memory block. Therefore, the current required for this body refresh operation is considerably smaller than the current required for data refresh. Therefore, the increase in power consumption of the entire chip can be substantially neglected.

[Modification]

Figure 18:
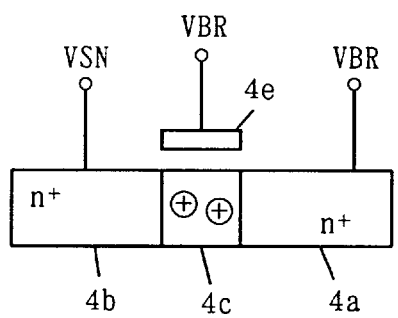
FIG. 18 shows a memory cell application voltage in a body refresh operation according to a modification of the first embodiment of the present invention.

FIG. 18 shows voltages applied to a memory cell in a body refresh operation in a modification 1 of the first embodiment. Referring to FIG. 18, a negative body refresh voltage VBR is applied to a control electrode 4e and source/drain 4a of the memory cell in a body refresh operation. More specifically, a negative voltage VBR is applied to word line WL and bit lines BL and /BL in the memory block subjected to body refresh. By applying negative voltage VBR to source/drain 4a of a memory cell via a bit line, the forward bias voltage across body region 4c and source/drain 4a becomes greater. Therefore, a greater forward leakage current can be conducted. Thus, the majority carriers stored in body region 4c can reliably be discharged.

Similarly, by applying negative voltage VBR to control electrode 4e in a body refresh operation, increase in the sub threshold leakage current with respect to voltage VSN in the storage node can be suppressed. The majority carriers in the body region can be discharged efficiently without degrading the data retaining characteristic of a memory cell.

Figure 19:
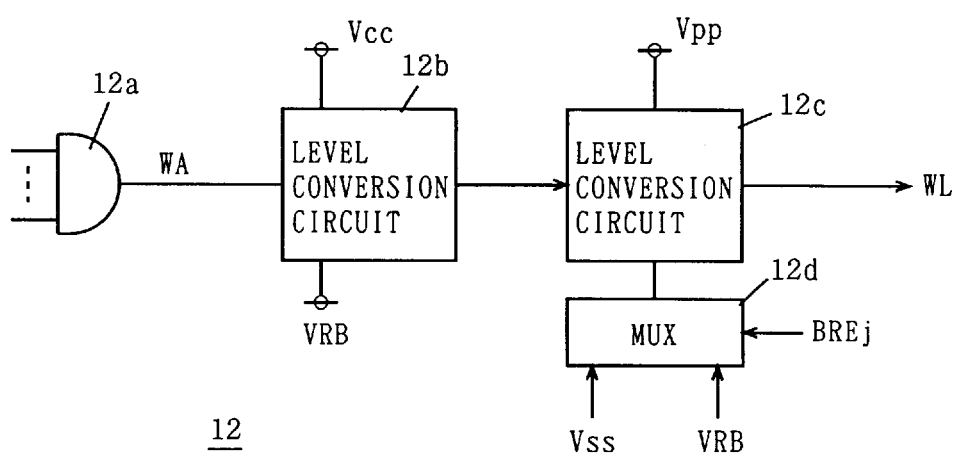
FIG. 19 schematically shows a structure of a row decoder in a modification of the first embodiment of the present invention.

FIG. 19 shows a structure for applying a negative voltage to word line WL in a body refresh operation. Only the structure for one word line WL is shown in FIG. 19. The structure of FIG. 19 includes a decode circuit 12a for decoding an applied address signal to generate a row select signal WA designating a corresponding row, a level conversion circuit 12b for converting the L level potential of signal WA from decode circuit 12a to a negative voltage VRB level, a level conversion circuit 12c for converting the H level voltage of the output signal of level conversion circuit 12b to the level of boosted voltage Vpp, and a multiplexer 12d for transmitting one of ground voltage Vss and negative voltage VRB to the other power supply node of level conversion circuit 12c. Multiplexer 12d selects negative voltage VRB and ground voltage Vss when body refresh designating signal BREj attains an active state of an H level and an inactive state, respectively.

A general structure, particularly the circuitry that will be described afterwards, can be employed for level conversion circuits 12b and 12c.

According to the structure of FIG. 19, word line select signal WA attains an inactive state and word line select signal WA is driven to an L level of negative voltage VRB in a body refresh operation. In other operation modes, word line WL of a non-selected state is maintained at the level of ground voltage Vss.

Figure 20:
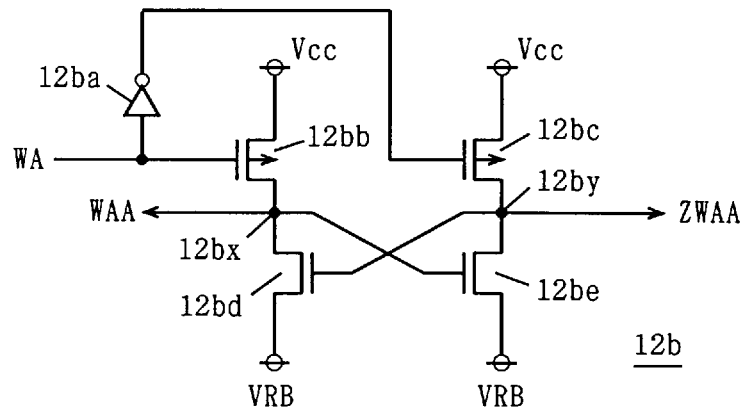
FIG. 20 schematically shows a structure of a level conversion circuit of FIG. 19.

FIG. 20 shows an example of the structure of level conversion circuit 12b of FIG. 19. Referring to FIG. 20, level conversion circuit 12b includes an inverter 12ba receiving word line select signal WA, a p channel MOS transistor 12bb connected between power supply node Vcc and a node 12bx and receiving word line select signal WA at its gate, a p channel MOS transistor 12bc connected between power supply node Vcc and a node 12by, and receiving an output signal of inverter 12ba at its gate, an n channel MOS transistor 12bb connected between node 12bx and negative voltage supply node VRB, and having its gate connected to a node 12by, and an n channel MOS transistor 12be connected between node 12by and negative voltage supply node VRB, and having a gate connected to 12bx. A level-converted signal WAA is provided from node 12bx. A level-converted and logic-inverted signal ZWAA is provided from node 12by. The operation of level conversion circuit 12b of FIG. 20 will now be described briefly.

Word line select signal WA makes a transition between power supply voltage Vcc and ground voltage Vss. When word line select signal WA attains an H level, the output signal of inverter 12ba attains an L level (ground voltage level). MOS transistor 12bc is rendered conductive, and MOS transistor 12bb is rendered non-conductive. Charging of node 12by by MOS transistor 12bc causes the gate potential of MOS transistor 12bd to increase, and MOS transistor 12bd is made conductive to cause the potential of node 12bx to be lowered to the level of negative voltage VRB. MOS transistor 12be makes a transition to an non-conductive state corresponding to reduction of the potential at node 12bx. In response, node 12by is charged at high speed to the level of power supply voltage Vcc by MOS transistor 12bc. Eventually, signal ZWAA from node 12by attains the level of power supply voltage Vcc, and signal WAA from node 12bx attains the level of negative voltage VRB.

When word line select signal WA attains an L level, MOS transistor 12bb is rendered conductive and MOS transistor 12bc is rendered non-conductive. Under this state, opposite to the previous operation, node 12by is discharged by MOS transistor 12be to the level of negative voltage VRB, and node 12bx is charged by MOS transistor 12bb up to the level of power supply voltage Vcc.

Thus, a signal making a transition between power supply voltage Vcc and ground voltage Vss can be converted into a signal making a transition between power supply voltage Vcc and negative voltage VRB.

Figure 21:
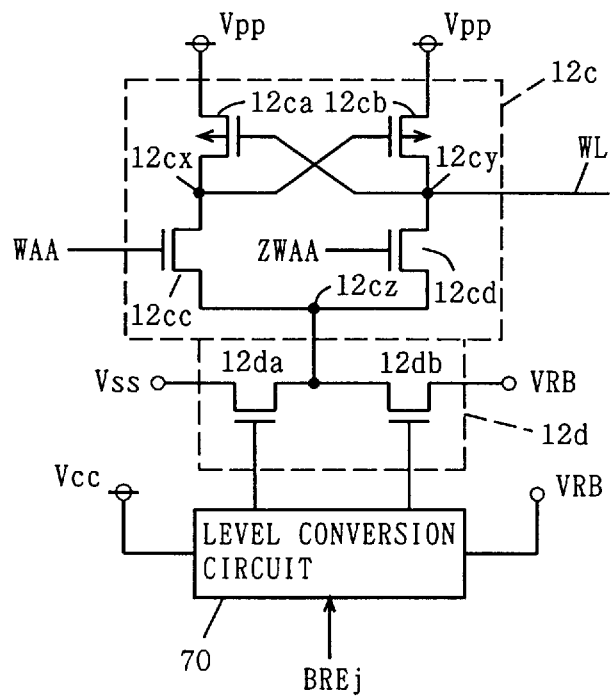
FIG. 21 shows an example of a specific structure of a level conversion circuit and multiplexer of FIG. 19.

FIG. 21 schematically shows a structure of level conversion circuit 12c and multiplexer 12d of FIG. 19. Referring to FIG. 21, level conversion circuit 12c includes a p channel MOS transistor 12ca connected between boosted voltage supply node Vpp and node 12cx, and having a gate connected to node 12cy, a p channel MOS transistor 12cb connected between boosted voltage supply node Vpp and node 12cy, and having a gate connected to node 12cx, an n channel MOS transistor 12cc connected between node 12cx and node 12cz, and receiving word line select signal WAA at its gate, and an n channel MOS transistor 12cd connected between node 12cy and node 12cz and receiving word line select signal ZWAA at its gate.

Multiplexer 12d includes an n channel MOS transistor 12da for transmitting ground voltage Vss to node 12cz when conducts, and an n channel MOS transistor 12bd for transmitting negative voltage VRB to node 12cz when conducts. Control of conduction/non-conduction of MOS transistors 12da and 12db in multiplexer 12d is carried out by level conversion circuit 70 receiving body refresh designating signal BREj. Level conversion circuit 70 alters the amplitude of body refresh designating signal BREj to that between power supply voltage Vcc and negative voltage VRB. The structure of level conversion circuit 70 is similar to that of level conversion circuit 12c of FIG. 20. The operation of level conversion circuit 12c and multiplexer 12d of FIG. 21 will now be described.

When word line select signal WAA attains an H level, MOS transistor 12cc attains a conductive state and MOS transistor 12cd attains an non-conductive state. Node 12cx is discharged down to the level of the voltage on node 12cz via MOS transistor 12cc. In response, MOS transistor 12cb conducts, whereby node 12cy is charged to the level of boosted voltage Vpp. MOS transistor 12ca makes a transition to a non-conductive state according to increase in potential of node 12cy. Eventually, node 12cx is discharged to the level of the voltage on node 12cz, and boosted voltage Vpp is provided from node 12cy onto word line WL.

When word line select signal WAA attains an L level, MOS transistor 12cc is rendered non-conductive and MOS transistor 12cb is rendered conductive. Under this state, node 12cy is discharged to the level of the voltage on node 12cz via MOS transistor 12cb, and node 12cx is charged to the level of boosted voltage Vpp via MOS transistor 12ca. The L level of signals WAA and ZWAA corresponds to negative voltage VRB. Therefore, MOS transistors 12cc and 12cd can be maintained at a non-conductive state reliably even when the level of the voltage of node 12cz is negative voltage VRB.

Level conversion circuit 70 provides a signal of power supply voltage Vcc level to the gate of MOS transistor 12db, and a signal of negative voltage VRB level to the gate of MOS transistor 12da when body refresh designating signal BREj attains an H level. In this state, MOS transistor 12db conducts to transmits negative voltage VRB to node 12cz. Therefore, word line WL attains the level of negative voltage VRB when a body refresh operation is carried out.

When body refresh designating signal BREj attains an L level, level conversion circuit 70 provides a signal of power supply voltage Vcc level to the gate of MOS transistor 12da and a signal of negative voltage VRB level to the gate of MOS transistor 12db. In response, MOS transistor 12da is rendered conductive, and MOS transistor 12db is rendered non-conductive, whereby ground voltage Vss is transmitted to node 12cz. Therefore, non-selected word line WL is maintained at the level of ground voltage Vss.

Figure 22:
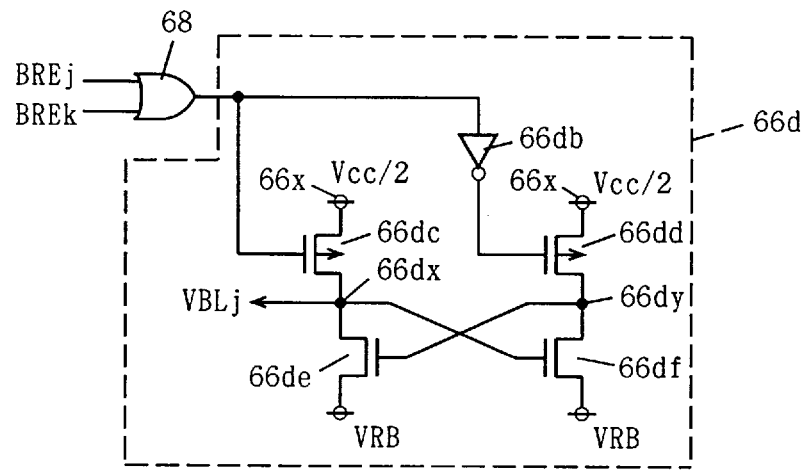
FIG. 22 specifically shows an example of a structure of an intermediate voltage modify circuit according to the first embodiment of the present invention.

FIG. 22 shows an example of a structure of bit line voltage modify circuit 66d for a body refresh operation using a negative voltage. Referring to FIG. 22, bit line voltage modify circuit 66d includes an inverter 66db receiving an output signal of OR circuit 68; a p channel MOS transistor 66dc connected between intermediate voltage supply node 66x and node 66dx, and receiving an output signal of OR circuit 68 at its gate; a p channel MOS transistor 66dd connected between intermediate voltage supply node 66x and node 66dy, and receiving an output signal of inverter 66bb at its gate; an n channel MOS transistor 66de connected between node 66bx and negative voltage supply node VRB, and having a gate connected to node 66dy; and an n channel MOS transistor 66df connected between node 66dy and negative voltage supply node VRB, and having a gate connected to node 66dx. Bit line precharge voltage VBLj is output from node 66dx.

Bit line voltage modify circuit 66d of FIG. 22 is substantially a level conversion circuit. When the output signal of OR circuit 68 attains an L level, MOS transistor 66bc attains a conductive state, and MOS transistor 66dd attains a non-conductive state. Node 66dx is charged by MOS transistor 66dc. Node 66dy is discharged to the level of negative voltage VRB by MOS transistor 66df. In this state, bit line precharge voltage VBLa attains the voltage level of intermediate voltage Vcc/2.

When the output signal of OR circuit 68 attains an H level, MOS transistor 66dc is rendered non-conductive and MOS transistor 66dd is rendered conductive. Under this state, node 66dx is discharged to the level of negative voltage VRB by MOS transistor 66de. Node 66dy is charged by MOS transistor 66dd to the voltage level of intermediate voltage Vcc/2. Under this state, bit line precharge voltage VBLj attains the level of negative voltage VRB. Thus, negative voltage VRB can be transmitted to each bit line pair of a memory block subjected to body refresh.

Figure 23:
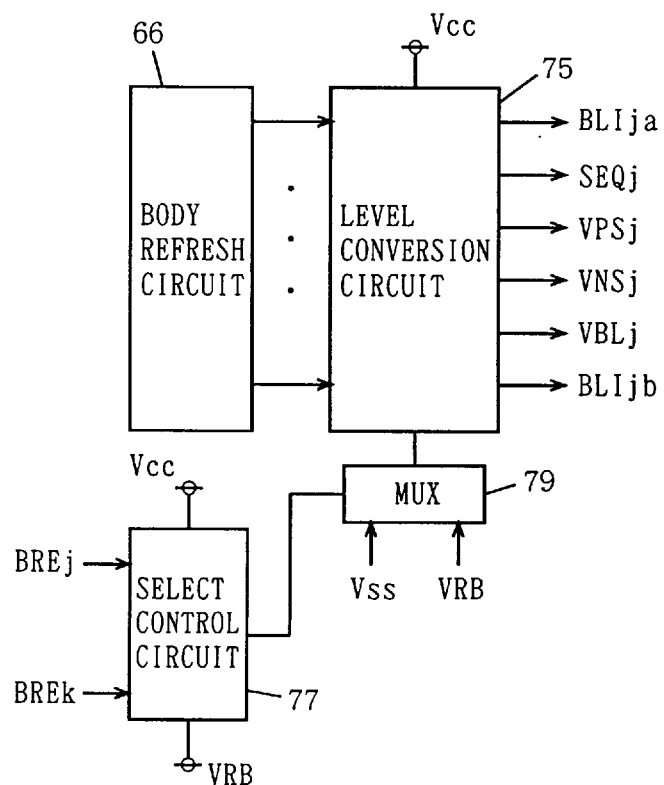
FIG. 23 schematically shows a structure of a body refresh circuit according to the first embodiment of the present invention.

FIG. 23 schematically shows a structure of a body refresh control block according to the modification of the first embodiment. Only the structure with respect to one sense amplifier band is shown in FIG. 23. Body refresh circuit 66 is similar to that described in the first embodiment. In the present modification of the first embodiment, a level conversion circuit 75 is further provided to convert the level of the output signal of body refresh circuit 66. Level conversion circuit 75 operates with power supply voltage Vcc as one operating power supply voltage, and the voltage applied via multiplexer 79 as the other operating power supply voltage. Various signals BLIja, SEQj, BPSj, VNSj, VBLj and BLIjb are provided from level conversion circuit 75. Level conversion circuit 75 has a structure similar to the level conversion circuit of FIG. 20.

Level conversion circuit 75 sets the L level of the signal output from body refresh circuit 66 to ground voltage Vss level or negative voltage VRB level according to the level of ground voltage Vss or negative voltage VRB of the voltage applied via multiplexer 79. Multiplexer 79 has a structure similar to that of multiplexer 12d in FIG. 21. Multiplexer 79 has its select operation controlled by an output signal of a select control circuit 77 having a level conversion function.

Select control circuit 77 includes an OR circuit receiving body refresh designating signals BREj and BREk, and a level conversion circuit for converting the L level of the output signal from this OR circuit to negative voltage VRB level. Therefore the prior structure shown in FIG. 20 can be employed for select control circuit 77. An output signal of the OR circuit that receives body refresh designating signals BREj and BREk is used instead of word line select signal WA. Multiplexer 79 selects negative voltage VRB when a body refresh operation is specified, and ground voltage Vss when other operations are specified.

Figure 24:
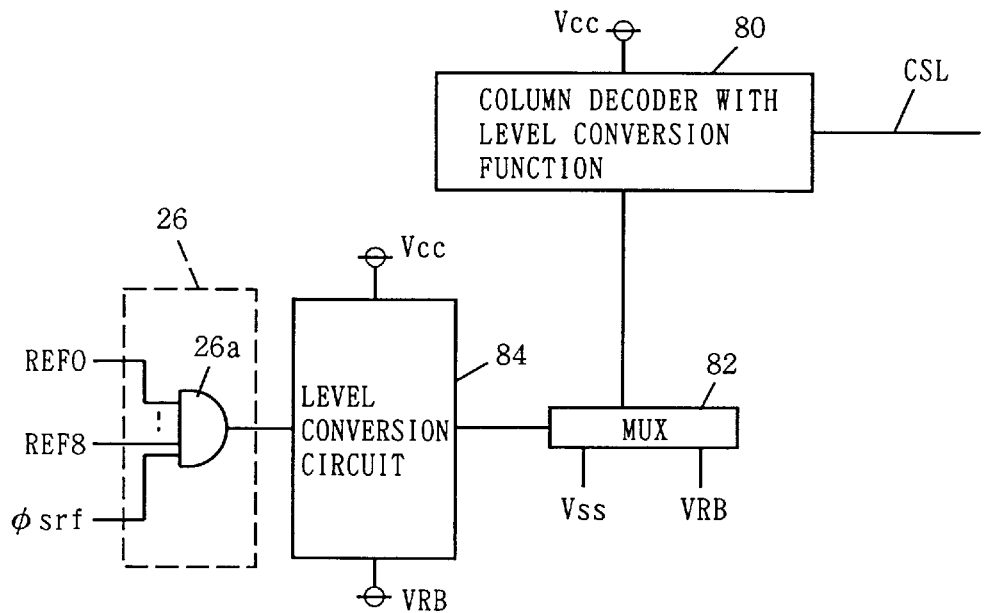
FIG. 24 schematically shows a structure of a column decoder according to a modification of the first embodiment of the present invention.

FIG. 24 schematically shows a structure of a column decoder. The column decoder has a level conversion function. This column decoder 80 with a level conversion function simply converts the L level to ground voltage Vss or negative voltage VRB level, and includes the level conversion circuit shown in FIG. 20 at its output portion. Column decoder 80 with a level conversion function provides a column select signal on column select line CSL. Column decoder 80 with a level conversion function operates with power supply voltage Vcc and the voltage applied via multiplexer 82 as both operating power supply voltages. Multiplexer 82 selects ground voltage Vss or negative voltage VRB, which is provided to column decoder 80. Multiplexer 82 has its select manner determined by the output signal of level conversion circuit 84.

Level conversion circuit 84 converts the output signal of body refresh control circuit 26 into a signal of power supply voltage Vcc level and negative voltage VRB level. Body refresh control circuit 26 includes an AND circuit 26a receiving the less significant 8 bits REF0–REF7 of the refresh address counter and self refresh mode designating signal φsrf. Level conversion circuit 84 controls the operation of multiplexer 82 so that negative voltage VRB is selected when the last row in one memory block is subjected to data refresh. At other operations, multiplexer 82 selects ground voltage Vss.

Figure 25:
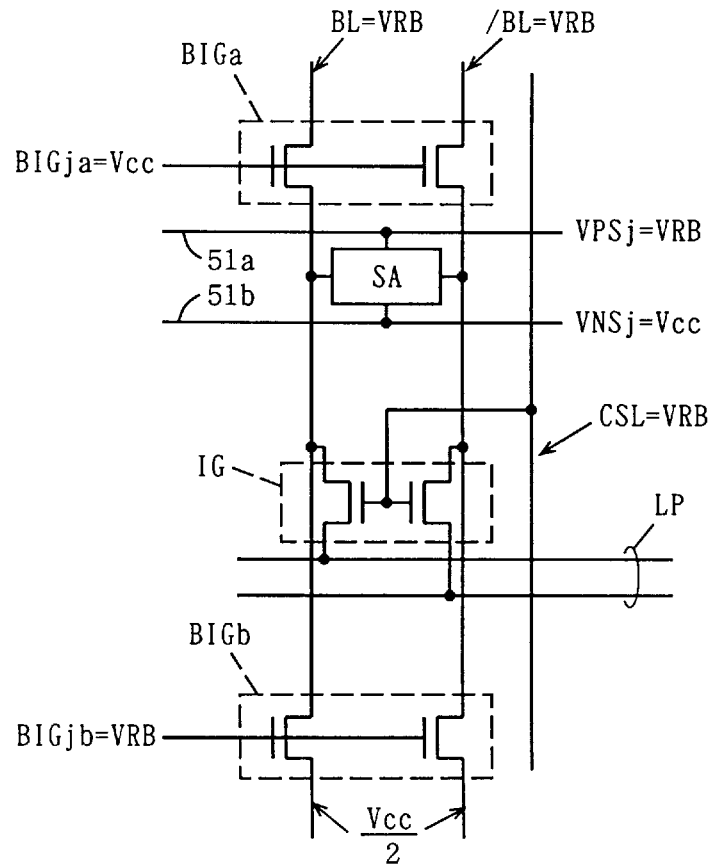
FIG. 25 shows a voltage applied to each portion in each body refresh operation according to a modification of the first embodiment of the present invention.

FIG. 25 shows the voltages of the portions associated with one bit line pair in a body refresh operation using a negative voltage. Referring to FIG. 25, negative voltage VRB is transmitted to bit lines BL and /BL via bit line isolation gate BIGa. A column select signal of negative voltage VRB level is transmitted to column select (IO) gate IG. Bit lines BL and /BL are driven to the level of negative voltage VRB and column select gate IG is reliably rendered non-conductive. Thus, connection of bit lines BL and /BL with local IO line pair LP can be prevented. Bit line isolation designating signal BIGja attains the level of power supply voltage Vcc. Sense amplifier drive signal VPSj on sense amplifier drive signal line 51a attains the level of negative voltage VRB. Sense amplifier drive signal VNSj on sense amplifier drive signal line 51b attains the level of power supply voltage Vcc. Bit line isolation designating signal BIGjb applied to the other bit line isolation gate BIGb attains the level of negative voltage VRB. Therefore, when negative voltage VRB is applied to a bit line and body refresh is carried out in a memory block, the other memory block can be isolated from the sense amplifier reliably. The bit line potential of the other memory block maintains the voltage level of intermediate potential Vcc/2.

By providing the above-described level conversion function, body refresh can be carried out using a negative voltage VRB. Therefore, majority carriers in the body region can be discharged more efficiently.

In the above-described embodiment, negative voltage VRB is applied to word line and a bit line only in a body refresh operation. A structure may be provided where negative voltage VRB is applied to a non-selected word line even in a normal operation mode. The sub threshold leakage current of a memory transistor can be reduced by a negative voltage word line to improve the refresh characteristics.

According to the first embodiment of the present invention, body refresh can be carried out via a bit line precharge/equalize circuit in parallel to a data refresh operation. Body refresh can be carried out easily without any extra circuitry. Furthermore, this body refresh operation can be carried out transparent to or hidden by the data refresh operation. No extra time is required for this body refresh operation. It is also not necessary to specify a particular operation mode. Therefore, control is simplified.

By carrying out body refresh prior to self refresh, a disturbance operation is entered by the self refresh (word line selection and bit line potential amplification are carried out) under a state where the potential of the body region is lowered. Sub threshold leakage current at this time can be suppressed to realize a memory superior in refresh characteristics.

The number of times of body refresh operations to be carried out is extremely fewer than the number of times of data refresh operations to be carried out. Increase in power consumption by a body refresh operation can be substantially neglected.

Second Embodiment

Figure 26A:
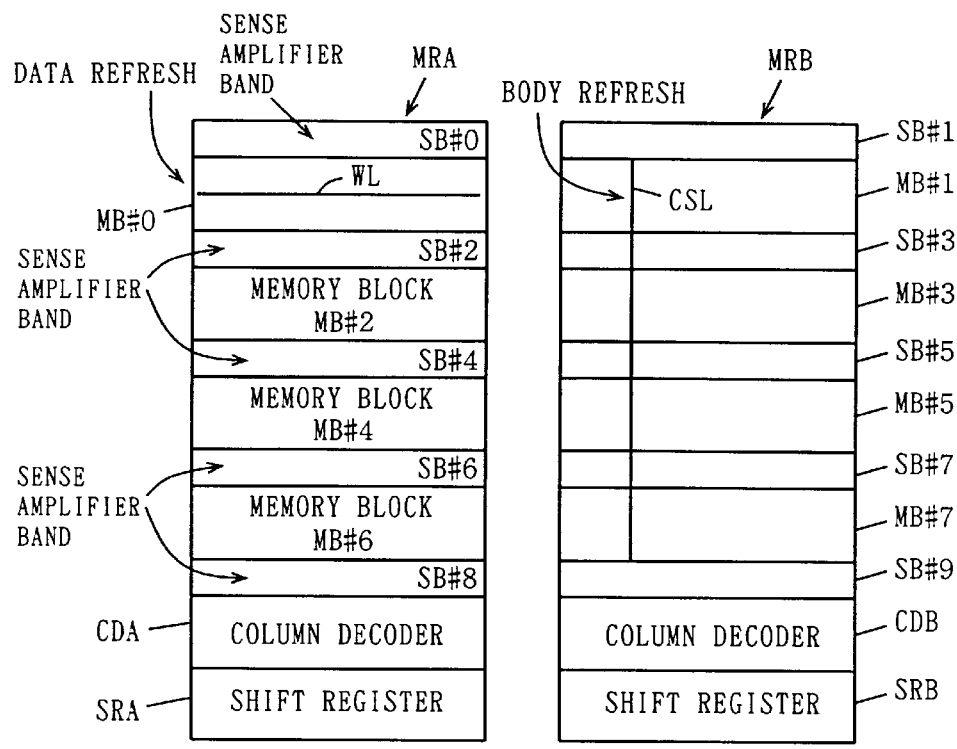
FIG. 26A is a diagram used for describing the structure of a memory cell array and the operation of data refresh and body refresh according to a second embodiment of the present invention.

FIG. 26A schematically shows an entire structure of a semiconductor memory device according to a second embodiment of the present invention. Similar to the first embodiment, the memory array in FIG. 26A is divided into two global memory blocks of MRA and MRB. The structure of global memory blocks MRA and MRB is similar to that of the first embodiment. Corresponding components have the same reference characters allotted, and detailed description will not be repeated. A column decoder CDA and a shift register SRA for sequentially driving the output node of the column decoder to a selected state in a body refresh operation are provided for global memory block MRA. Similarly, a column decoder CDB and a shift register SRB are provided for global memory block MRB. Column select line CSL from each of column decoders CDA and CDB is provided common to all memory blocks in the corresponding global memory block.

When data refresh is carried out in a memory block according to the structure of FIG. 26A, column select line CSL in a memory block differing from that subjected to data refresh is driven to a selected state, and each bit line of the bit line pair is forcefully set to an L level via an internal data line (global IO line and local IO line).

When word line WL is selected in memory block MB#0 and data refresh is carried out, column select line CSL is driven to a selected state in a memory block different from memory block MB#0, i.e. in global memory block MRB. The bit line selected by column select line CSL is connected to the internal data line, whereby each bit line of the bit line pair is driven to an L level via a write drive circuit connected to the internal data line. Therefore, in memory blocks MB#1, MB#3, MB#5 and MB#7, a body refresh operation for the memory cell connected to the bit line pair connected to column select line CSL is carried out simultaneously. When four bit line pairs are connected to one column select line CSL, a total of 16 pairs of bit lines are selected in global memory block MRB. When there are 256 word lines WL in one memory block and 256 bit line pairs in one memory block, the body refresh cycle is 1/16 times the data refresh cycle. Therefore, body refresh can be carried out efficiently, and storage of majority carriers in the body region can be prevented.

Figure 26B:
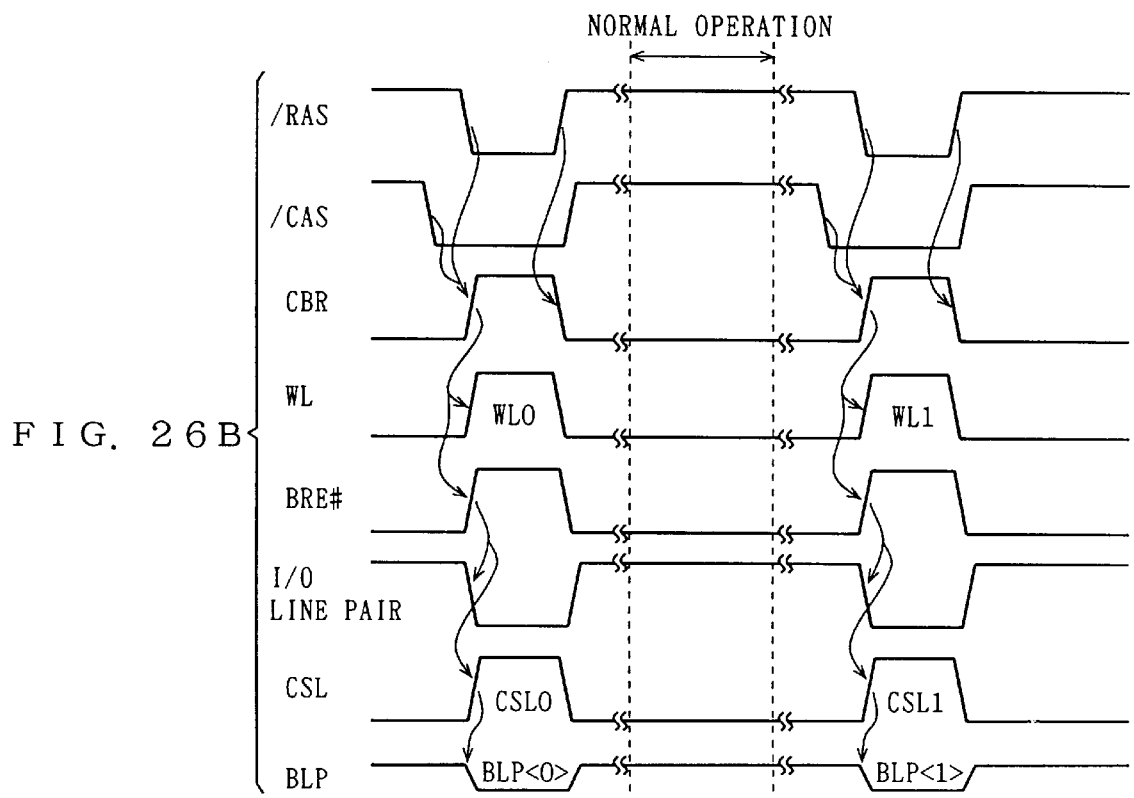
FIG. 26B is a signal waveform diagram representing a body refresh operation of the memory cell array of FIG. 26A.

FIG. 26B is a waveform diagram showing a body refresh operation of the SOI-DRAM of FIG. 26A. A body refresh operation will now be described briefly.

Prior to a fall of row address strobe signal /RAS, column address strobe signal /CAS is pulled down, and CBR detection signal CBR is set to an active state of an H level. In response to activation of CBR detection signal CBR, "CBR refresh" is carried out. A word line WL (WL0) is selected in the memory block where data refresh is to be carried out. Data in the memory cell connected to this word line WL (WL0) is refreshed. In this CBR refresh operation, body refresh designating signal BRE# designating a memory block differing from a global memory block including the memory block subjected to data refresh according to a generated refresh address is rendered active at an H level.

A case is considered where data refresh is carried out in memory block MB#0. Body refresh is carried out in global memory block MRB. According to body refresh designating signal BRE#, column select line CSL from column decoder CDB is driven to a selected state according to an output signal of shift register SRB. In response to selected column select line CSL (CSL0), each selected bit line of memory blocks MB#1, MB#3, MB#5, and MB#7 of global memory block MRB is connected to an internal data line. Data of an L level is written via a write circuit connected to the internal data line. As a result, the potential of each bit line of bit line pair BLP is pulled down to carry out body refresh. When row address strobe signal /RAS rises to an H level, the CBR refresh cycle is completed.

Then, a normal operation is carried out for data access.

At an elapse of a predetermined time, column address strobe signal /CAS is pulled down to an L level to specify CBR refresh prior to the next fall of row address strobe signal /RAS. According to the rise (activation) of CBR detection signal CBR, word line WL (WL1) is selected according to a refresh address for data refresh. Body refresh designating signal BRE# is activated again according to a refresh address for this data refresh to specify a global memory block including a memory block differing from the memory block subjected to data refresh. According to body refresh designating signal BRE#, a shift operation of shift register SRB is carried out again, and another column select line CSL1 is driven to a selected state. Under this state, the data signal of an L level is transmitted onto each bit line of the selected bit line pair via the write circuit. The potential of bit line pair BLP <1> is reduced and a body refresh operation is executed. Similar to the previous first embodiment, all word lines are in a non-selected state in this body refresh operation.

The structure of the entire SOIDRAM according to the second embodiment of the present invention is similar to that of the first embodiment shown in FIG. 1. Only the structure of the portion differing from that of the first embodiment will now be described.

Figure 27A:
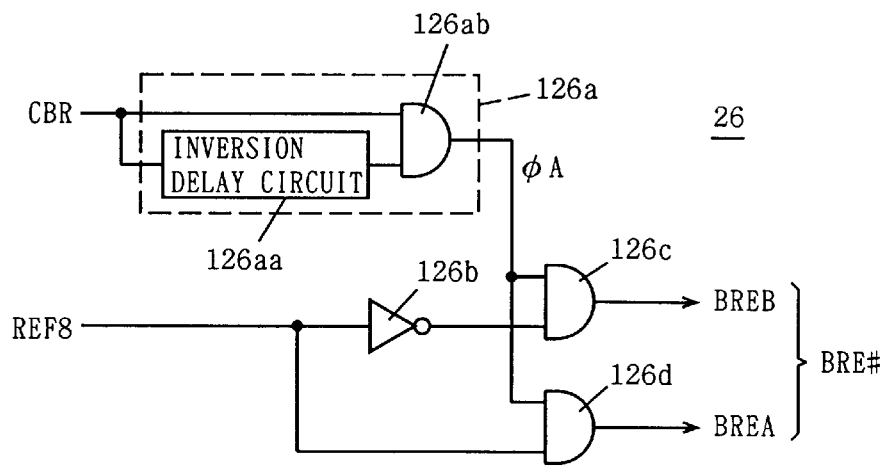
FIG. 27A shows an example of a structure of a body refresh control circuit according to the second embodiment of the present invention.

FIG. 27A shows a structure of body refresh control circuit 26 according to the second embodiment. Referring to FIG. 27A, body refresh control circuit 26 includes a one shot pulse generation circuit 126a responsive to a rise of CBR detection signal CBR for providing a pulse signal φA having a predetermined time width, an inverter 126b receiving refresh address signal bit REF8, an AND circuit 126c receiving one shot pulse signal φA from one shot pulse generation circuit 126a and an output signal of inverter 126b, and an AND circuit 126d receiving one shot pulse signal φA and refresh address signal bit REF8. Similar to the first embodiment, the number of memory blocks is 8. A memory block is identified by the most significant 3 bits REF <10:8> of a refresh address signal.

In this case, a global memory block can be identified by the least significant bit REF8 of the refresh block address (refer to FIG. 10). A body refresh designating signal BREA for global memory block MRA is provided from AND circuit 126c. A body refresh designating signal BREB for global memory block MRB is provided from AND circuit 126d.

One shot pulse generation circuit 126a includes an inversion delay circuit 126aa for delaying CBR detection signal CBR for a predetermined time and inverting the logic thereof, and an AND circuit 126ab receiving an output signal of inversion delay circuit 126aa and CBR detection signal CBR. The active state (H level) period of one shot pulse signal φA is determined by the delay time of this inversion delay circuit 126aa.

Figure 27B:
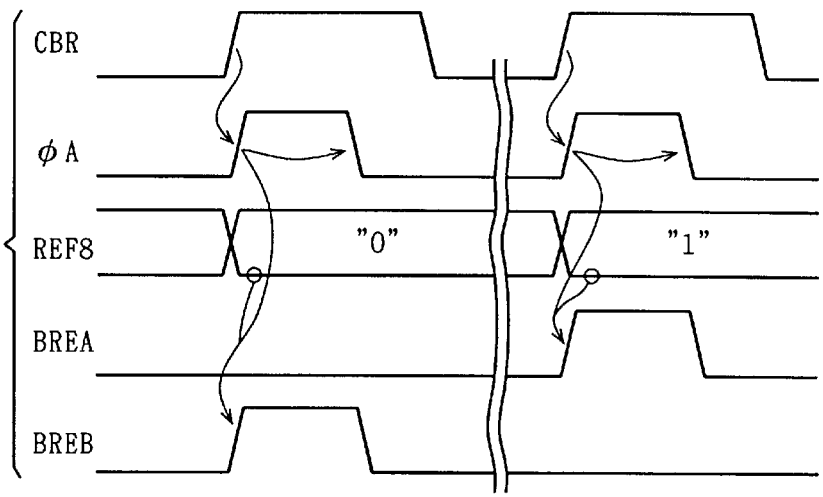
FIG. 27B is a signal waveform diagram representing an operation of a body refresh control circuit of FIG. 27A.

Similar to the first embodiment, CBR detection signal CBR is generated using a structure shown in FIG. 5A. The operation of body refresh control circuit 26 shown in FIG. 27A will now be described with reference to the waveform diagram of FIG. 27B.

Upon a rise of CBR detection signal CBR to an active state of an H level, one shot pulse φA from one shot pulse generation circuit 126a is rendered active at an H level for predetermined time. The activation period of one shot pulse φA is set longer than the period required for selection of an internal word line, activation of a sense amplifier, and a restore operation of the memory cell data.

Refresh address REF is provided in response to CBR detection signal CBR. When refresh address signal bit REF8 is 0, the output signal of inverter 126b attains an H level, and body refresh designating signal BREB attains an H level. Body refresh designating signal BREA attains an L level. In the present case, bit 0 corresponds to an L level. Under this state, data refresh is carried out in any memory block of global memory block MRA, and body refresh is carried out in global memory block MRB.

At the fall of CBR detection signal CBR to an L level, the CBR refresh cycle is completed and then a normal operation is performed. At an elapse of a predetermined time period, CBR detection signal CBR attains an active state of an H level again, and one shot pulse signal φA is rendered active of an H level. When refresh address signal bit REF8 is 1, the output signal of inverter 126b is pulled down to an L level. Body refresh designating signal BREA attains an H level, and body refresh designating signal BREB attains an L level. Under this state, a body refresh operation is carried out in global memory block MRA, and data refresh is carried out in global memory block MRB.

Figure 28:
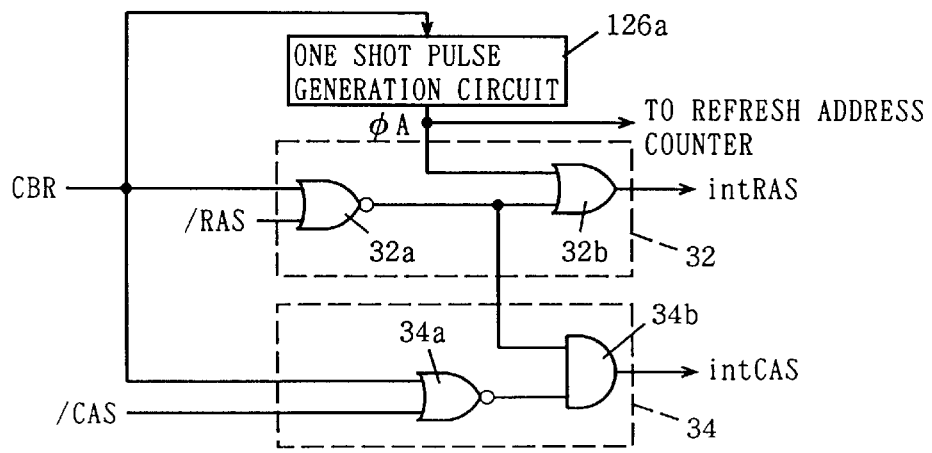
FIG. 28 schematically shows a structure of a row related control circuit and a column related control circuit according to the second embodiment of the present invention.

FIG. 28 shows the structure of main components of local control circuit 32, row related control circuit 32, and column related control circuit 34. Referring to FIG. 28, row related control circuit 32 includes an NOR circuit 32a receiving CBR detection signal CBR and row address strobe signal /RAS, and an OR circuit 32b receiving an output signal of NOR circuit 32a and one shot pulse φA from one shot pulse generation circuit 126a. Internal row address strobe signal intRAS is provided from OR circuit 32b. The structure of column related control circuit 34 is similar to that of the first embodiment. Column related control circuit 34 includes an NOR circuit 34a receiving CBR detection signal CBR and column address strobe signal /CAS, and an AND circuit 34b receiving output signals of NOR circuits 34a and 32a. Internal column address strobe signal intCAS is provided from AND circuit 34b.

According to the structure shown in FIG. 28, row related control circuit 32 provides internal row address strobe signal intRAS according to one shot pulse signal φA that is rendered active for a predetermined time period in response to a rise of CBR detection signal CBR. A select operation of a memory cell row in the memory block specified by the refresh address is carried out during activation of one shot pulse signal φA. Internal column address strobe signal intCAS maintains an inactive state to inhibit a column select operation during activation of CBR detection signal CBR.

Figure 29:
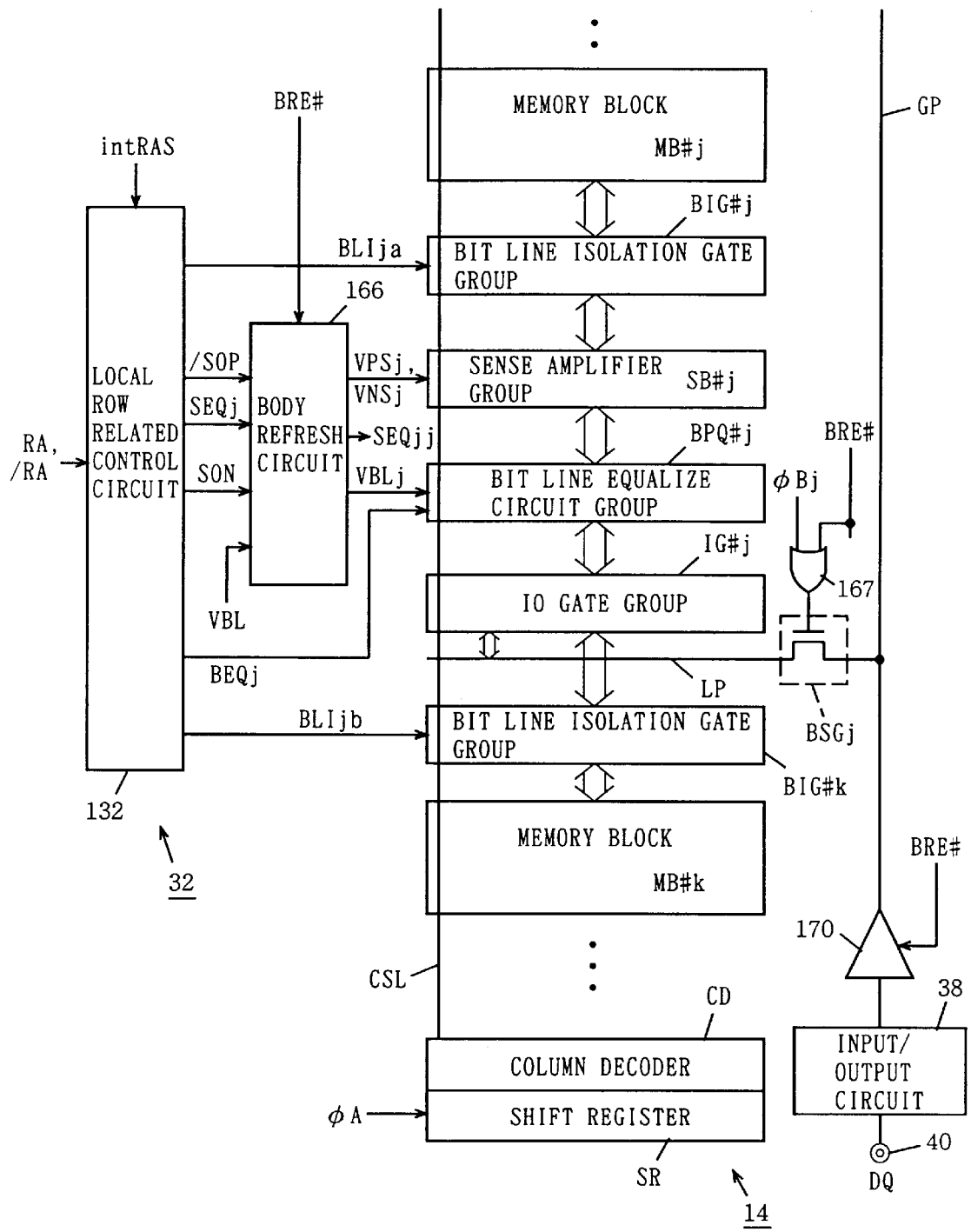
FIG. 29 schematically shows a structure of a body refresh circuit with respect to one sense amplifier band portion according to the second embodiment of the present invention.

FIG. 29 schematically shows a structure related to body refresh control for one sense amplifier band. Referring to FIG. 29, a bit line isolation gate group BIG#j, a sense amplifier band SB#j, a bit line equalize circuit group BPQ#j, IO gate group IG#j, and bit line isolation gate group BIG#k are disposed between memory blocks MB#j and memory block MB#k. IO gate group IG#j connects a selected row to a corresponding local IO line pair LP according to a signal on column select line CSL from column decoder CD. Local IO line pair LP is connected to global IO line pair GP via block select gate BSGj. Block select gate BSGj has its conduction/non-conduction controlled by an output signal of OR circuit 167 receiving block select signal φBj and body refresh designating signal BRE#.

Write circuit 170 is provided at global IO line pair GP. The internal structure of write circuit 170 will be described in details afterwards. Write circuit 170 transmits a signal of an L level onto global IO lines GIO and /GIO in global IO line pair GP when body refresh designating signal BRE# is active. Write circuit 170 receives internal write data from input/output circuit 38. A selector may be provided between write circuit 170 and input/output circuit 38.

Local row related control circuit 132 is provided for the peripheral circuit group. Local row related control circuit 132 is included in row related control circuit 32 of FIG. 1. Local row related control circuit 132 controls activation/inactivation of each control signal according to internal row address strobe signal intRAS and internal row address signals RA and /RA. The structure thereof is similar to that including bit line isolation control 32c circuit, sense amplifier activation circuit 32d, and precharge/equalize control circuit 32e shown in FIG. 12.

According to the second embodiment, bit line isolation signal BLIja provided from local row related control circuit 132 is applied directly to bit line isolation gate group BIG#j. Bit line isolation signal BLIjb is applied directly to bit line isolation gate group BIG#k. Bit line equalize designating signal BEQJ is applied to bit line equalize circuit group BPQ#j.

A body refresh circuit 166 is provided for sense amplifier band SB#j and bit line equalize circuit group BPQ#j. Body refresh circuit 166 is activated according to body refresh designating signal BRE# to generate and provide to sense amplifier band SB#j sense amplifier drive signals VPSj and VNSj from sense amplifier activation signals /SOP and SON from local row related control circuit 132, and inhibits supply of bit line precharge voltage VBL to bit line equalize circuit group BPQ#j. Body refresh circuit 166 also receives a sense drive signal line precharge/equalize designating signal SEQj from local row related control circuit 132 to render inactive a sense amplifier drive signal line equalize circuit not shown when body refresh designating signal BRE# is active.

Figure 30:
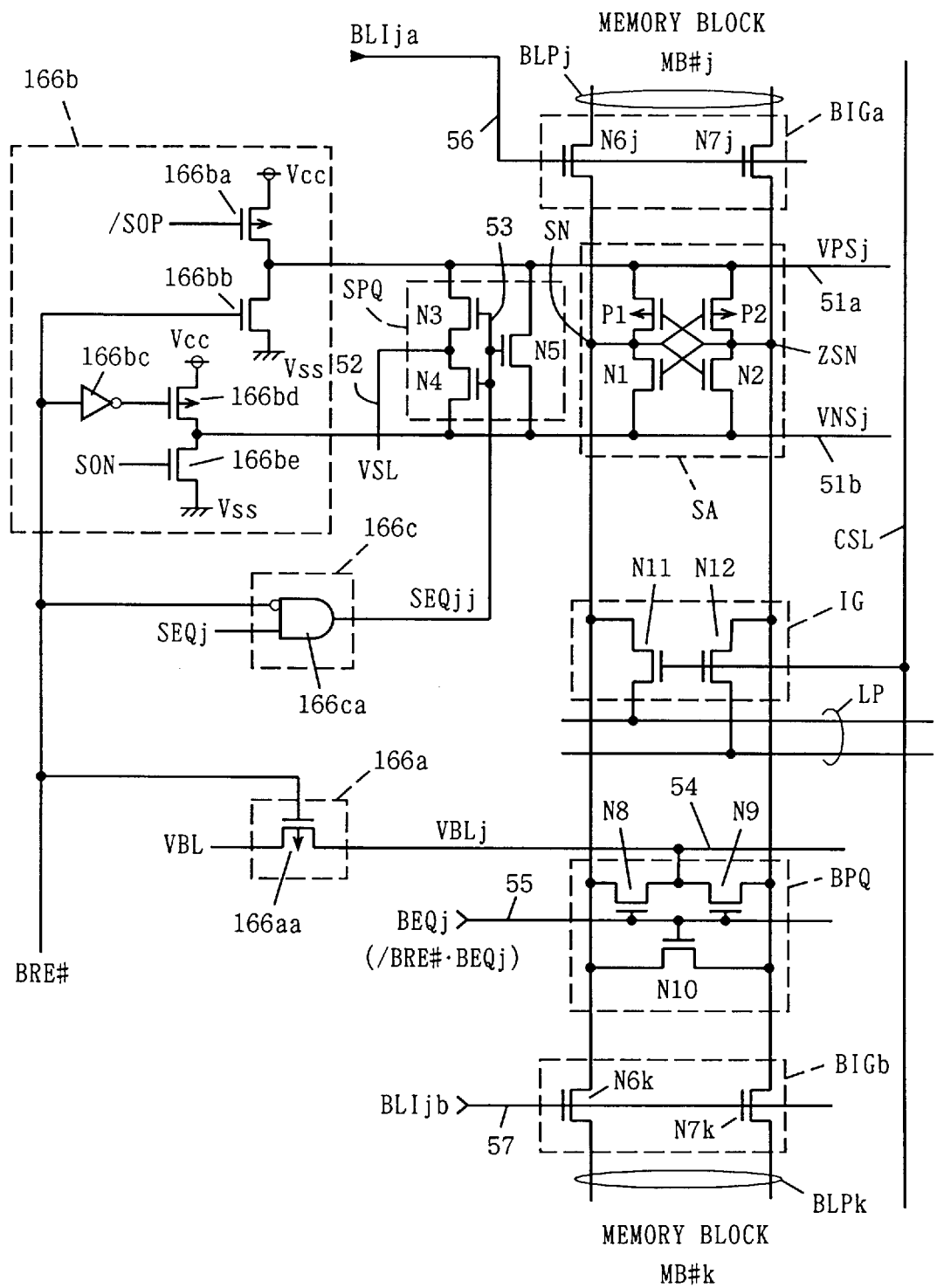
FIG. 30 specifically shows a body refresh circuit of FIG. 29.

FIG. 30 shows details of the structure of body refresh circuit 166 of FIG. 29. In FIG. 30, the structure of each of bit line isolation gate BIGa, sense amplifier SA, IO gate IG, bit line isolation gate BIGb, bit line precharge/equalize circuit BPQ, and sense amplifier drive signal line precharge/equalize circuit SPQ is similar to that shown in FIG. 14. Corresponding components have the same reference characters allotted, and their description will not be repeated.

Body refresh circuit 166 includes a sense drive circuit 166b for controlling the voltage level of sense amplifier drive signals VPSj and VNSj on sense amplifier drive signal lines 51a and 51b, a sense equalize drive circuit 166c for controlling activation/inactivation of a sense amplifier drive signal line precharge/equalize circuit SPQ, and a bit line voltage control circuit 166a for controlling supply of intermediate voltage VBL to bit line precharge voltage transmission line 54.

Bit line voltage control circuit 166a includes a p channel MOS transistor 166aa rendered non-conductive, when body refresh designating signal BRE# is active, to inhibit transmission of intermediate voltage VBL onto transmission line 54. In other words, precharge voltage VBL is not supplied to a selected memory block in a body refresh operation.

Sense equalize drive circuit 166c includes a gate circuit 166ca receiving body refresh designating signal BRE# and sense amplifier drive signal line equalize designating signal SEQj. Sense equalize circuit 166c renders control signal SEQjj inactive at an L level applied to sense amplifier drive signal line precharge/equalize circuit SPQ, when body refresh designating signal BRE# is active, to inhibits supply of intermediate voltage VSL to sense amplifier drive signal lines 51a and 51b. When body refresh designating signal BRE# is inactive, sense equalize drive circuit 166c provides a signal SEQjj according to sense amplifier drive signal line precharge/equalize designating signal SEQj.

Sense drive circuit 166b has a structure similar to that of sense drive circuit 66b of FIG. 14. More specifically, sense drive circuit 166b includes a p channel MOS transistor 166ba for charging sense amplifier drive signal line 51a to the level of power supply voltage Vcc when sense amplifier activation signal /SOP is active, an N channel MOS transistor 166bb for discharging sense amplifier drive signal line 51a to the level of ground voltage when body refresh designating signal BRE# is active, an n channel MOS transistor SON for discharging sense amplifier drive signal line 51b to the level of ground voltage when sense amplifier activation signal SON is active, and a p channel MOS transistor 166bd rendered conductive in response to a signal applied via inverter 166bc when body refresh designating signal BRE# is active, to charge sense amplifier drive signal line 51b to the level of power supply voltage Vcc.

IO gate (column select gate) IG includes n channel MOS transistors N11 and N12 rendered conductive, in response to the potential of the signal on column select line CSL to connect sense nodes SN and ZSN to local IO line pair LP. The operation of the structure of FIG. 30 will now be described.

In a normal operation mode, body refresh designating signal BRE# attains an L level of an inactive state. Therefore, memory cell access is carried out according to an operational waveform similar to that shown in FIG. 15. Description of a normal operation mode is identical to that described with reference to the waveform of FIG. 15, and will not be repeated.

Figure 31:
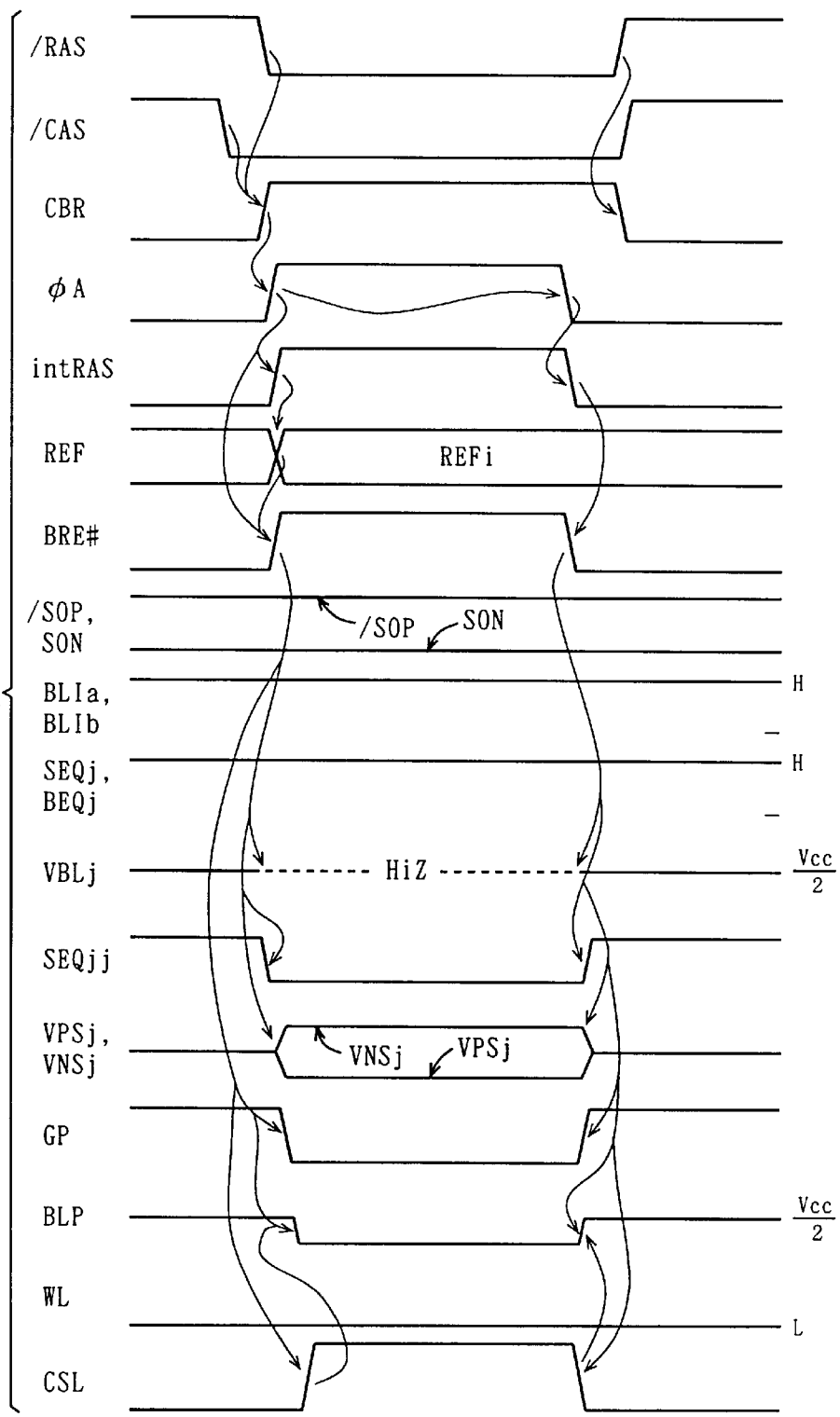
FIG. 31 shows a signal waveform in a body refresh operation according to the second embodiment of the present invention.

The operation in body refresh will be described hereinafter with reference to the operational waveform of FIG. 31.

When column address strobe signal /CAS falls prior to row address strobe signal /RAS, CBR detection signal CBR is activated. In response, one shot pulse signal φA is rendered active at an H level for predetermined time. In response to activation of one shot pulse signal φA, internal row address strobe signal intRAS is rendered active at an H level. In response to one shot pulse signal φA, refresh address REF is ascertained to refresh address REFi specifying the memory block subjected to the next data refresh operation. According to one shot pulse signal φA and refresh address REFi, body refresh designating signal BRE# attains an active state of an H level so that a global memory block not including the memory block subjected to data refresh is specified. Since word line selection and sense operation is not carried out in each memory block of the global memory block subjected to body refresh, word line WL is kept at an L level, and sense amplifier activation signal /SOP keeps an inactive state of an H level. Sense amplifier activation signal SON also keeps an inactive state of an L level. Also, bit line isolation signals BLIa and BLIb keep an H level. Bit line isolation gates BIGa and BIGb conduct. Each of bit line pairs BLPj and BLPk is connected to sense nodes SN and ZSN. Precharge/equalize designating signal SEQj and BEQj also keep an H level.

In response to activation of body refresh designating signal BRE#, output signal SEQjj of sense equalize control circuit 166c attains an L level. Sense amplifier drive signal line precharge/equalize circuit SPQ is rendered inactive. In sense drive circuit 166b, MOS transistors 166bb and 166bd conduct in response to activation of body refresh designating signal BRE#. Sense amplifier drive signals VPSj and VNSj are driven to the level of ground voltage and power supply voltage, respectively.

A write circuit transmits a signal of an L level to global bit line pair GP in response to activation of body refresh designating signal BRE#. Block select gate BSG conducts according to an output signal of OR circuit 167 to connect local IO line pair LP to global IO line pair GP, as shown in FIG. 29.

In response to body refresh designating signal BRE#, the potential of the signal on column select line CSL attains an H level. IO gate IG connected to column select line CSL conducts. Bit line pairs BLPj and BLPk (illustrated as BLP) are connected to local IO/ line pair LP. As a result, the potential of each bit line in bit line pair BLP (BLPj and BLPk) attains an L level. In memory blocks MB#j and MB#k, word line WL attains an L level of an inactive state. Under this state, the majority carriers stored in the body region are discharged on the bit line, resulting in reduction of the potential of the body region. At an elapse of a predetermined time, one shot pulse signal φA is rendered inactive at an L level. Body refresh designating signal BRE# attains an inactive state of an L level. The body refresh operation is completed, and each signal returns to a predetermined precharged state.

Figure 32A:
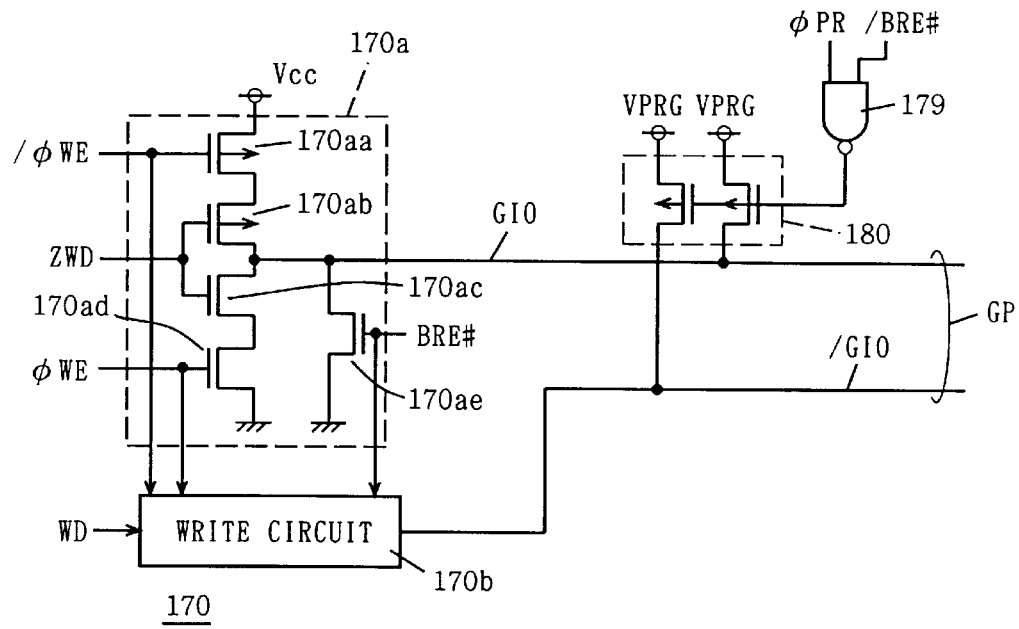
FIG. 32A schematically shows a structure of a write circuit according to the second embodiment of the present invention.

FIG. 32A shows an example of a structure of write circuit 170 of FIG. 29. Referring to FIG. 32A, write circuit 170 includes write circuits 170a and 170b provided corresponding to each of global IO lines GIO and /GIO of global IO line pair GP. Write circuits 170a and 170b have the same structure. Only the structure of write circuit 170a is shown in FIG. 32A.

Write circuit 170a includes p channel MOS transistors 170aa and 170ab connected in series between global IO line GIO and power supply node Vcc, n channel MOS transistors 170ac and 170ad connected in series between global IO line GIO and a ground node, and an n channel MOS transistor 170ae connected parallel to MOS transistors 170ac and 170ad and between global IO line GIO and the ground node.

A write designating signal φWE is applied to the gate of MOS transistors 170aa and 170ad. Write data ZWD is applied to the gates of MOS transistors 170ab and 170ac. A body refresh designating signal BRE# is applied to the gate of MOS transistor 170ae.

Write data WD is applied to write circuit 170b. Write data WD and ZWD are complementary to each other, and provided from input/output circuit shown in FIG. 29.

Figure 32B:
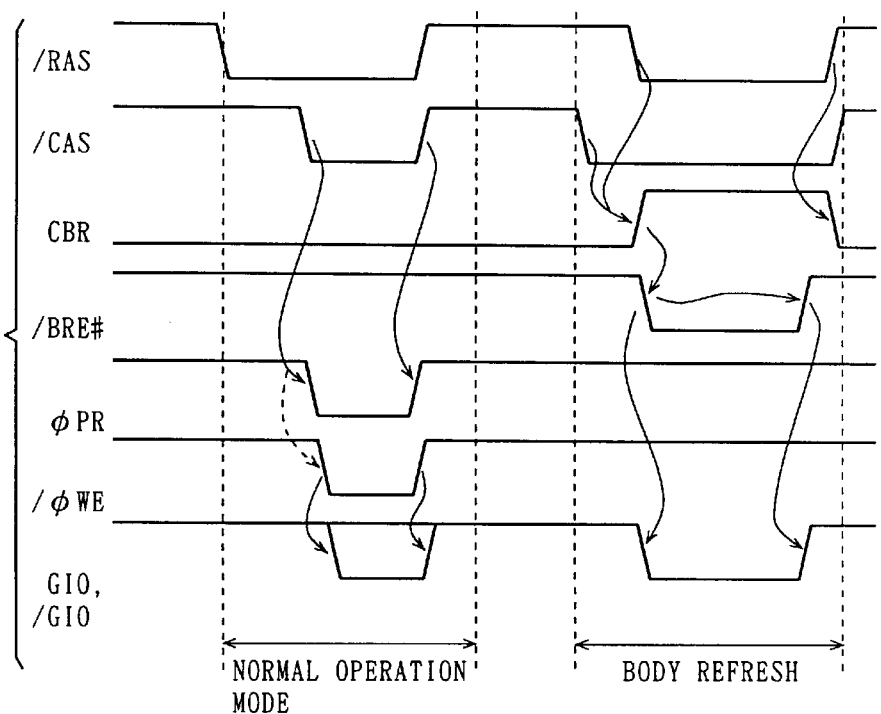
FIG. 32B shows an operational waveform thereof.

For global IO lines GIO and /GIO, a precharge circuit 18 is provided for charging global IO lines GIO and /GIO to a predetermined precharge voltage VPRG according to a precharge designating signal output from gate circuit 179. Gate circuit 179 is formed of a NAND circuit receiving precharge designating signal φPR and inverted body refresh designating signal /BRE#. Precharge circuit 180 includes a pair of p channel MOS transistors rendered conductive when the output signal of gate circuit 179 attains an L level. Precharge signal φPR and write designating signal φWE are signals related to signal /CAS. Write designating signal φWE is rendered inactive at an H level for a predetermined time period when column address strobe signal /CSA and write enable signal /WE both attain an active state. The operation of the write circuit of FIG. 32 will be described with the reference to the waveform diagram of FIG. 32B.

In a normal operation mode, row address strobe signal /RAS and column address strobe signal /CAS are sequentially driven to an active state of an L level. In a standby state, signal φWE attains an L level and signal /φWE attains an H level. Write circuits 170a and 170b attain an output high impedance state. Precharge designating signal φPR attains an H level, and body refresh designating signal /BRE# attains an H level. The output signal of gate circuit 179 attains an L level. Precharge circuit 180 charges global IO lines GIO and /GIO to predetermined precharge voltage VPRG respectively.

When a column address strobe signal /CAS is pulled down to an L level, precharge designating signal φPR is driven to an L level and the output signal of gate circuit 179 is driven to an H level. Precharge circuit 180 inhibits precharging of global IO lines GIO and /GIO. When write enable signal /WE not shown and column address strobe signal /CAS both attain an active state of an L level, write designating signal φWE attains an active state of an H level for a predetermined time. Accordingly, MOS transistors 170aa and 170ad conduct. Write circuits 170a and 170b drive global IO lines GIO and /GIO according to applied write data ZWD and WD. Under this state, body refresh designating signal BRE# attains an L level and MOS transistor 170ae maintains a non-conductive state. There is no effect on the data writing operation.

In a CBR refresh operation, first column address strobe signal /CAS and then row address strobe signal /RAS are pulled down to an L level. When this CBR condition is met, CBR detection signal CBR is pulled up to an H level. Body refresh designating signal BRE# attains an L level, and body refresh designating signal BRE# attains an H level, whereby the global memory block subjected to a body refresh operation is specified. Since the operation related to column selection is internally inhibited in the CBR refresh operation even when column address strobe signal ICAS attains an L level, precharge designating signal φPR maintains an H level, and write pulse signal /φWE maintains an H level.

According to activation (L level) of body refresh designating signal /BRE#, the output signal of gate circuit 179 attains an H level. Precharge circuit 180 inhibits the precharge operation of global IO lines GIO and /GIO. In write circuits 170a and 170b, MOS transistor 170ae conducts to drive global IO lines GIO and /GIO to an L level according to activation (H level) of body refresh designating signal BRE#. The potential of the signals on global IO lines GIO and /GIO is transmitted onto the bit line selected by column select line CSL, whereby body refresh is executed.

According to the structure of the write circuit shown in FIG. 32A, MOS transistor 170ac must drive global IO lines GIO and /GIO that extend over the entire global memory block. Therefore, the transistor is provided to have a relatively great current driving capability.

Figure 33A:
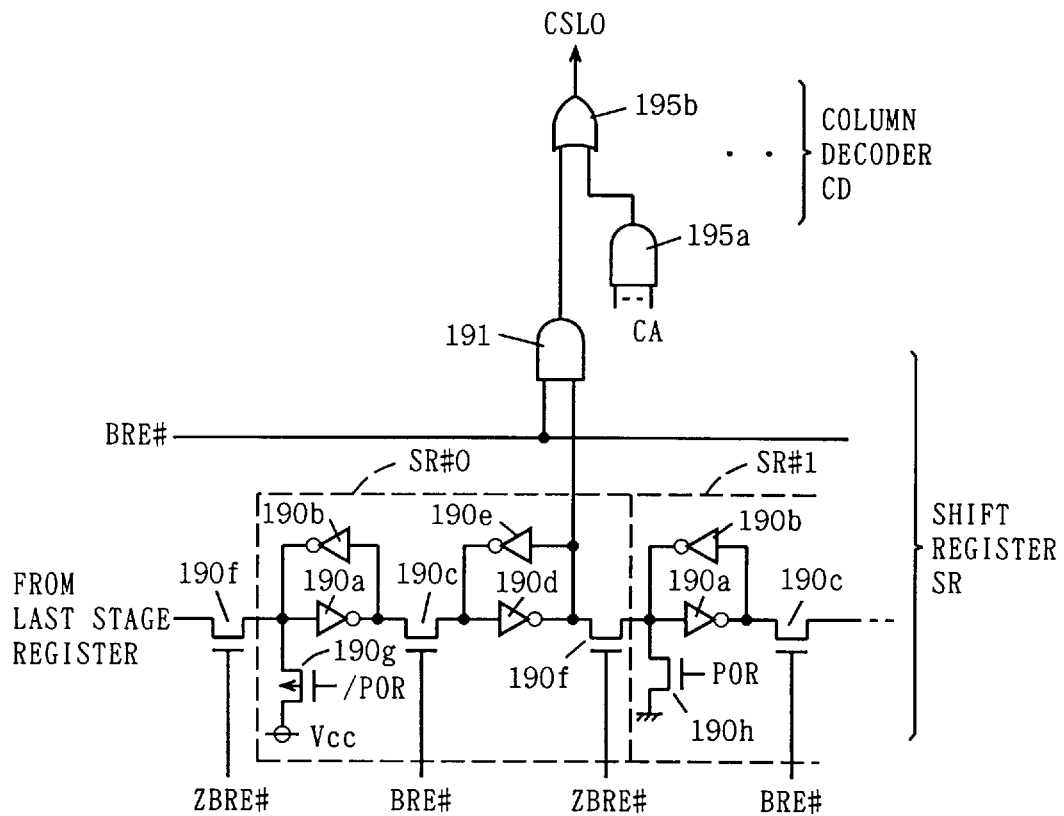
FIG. 33A schematically shows an example of a structure of a shift register and a column decoder according to the second embodiment of the present invention.

FIG. 33A shows a structure of the column decoder and shift register shown in FIG. 26A. In FIG. 33A, the circuitry of the column decoder associated with one column select line CSL0 and first stage register SR#0 of shift register SR of one stage are representatively shown. Shift register SR has a ring configuration. The output of the shift register of the last stage is fed back to shift register stage SR#0 of the first stage. First stage shift register SR#0 includes an inverter 190a, an inverter 190b forming a latch circuit with inverter 190a, a transfer gate 190c formed of an n channel MOS transistor, rendered conductive in response to activation of body refresh designating signal BRE# for transmitting an output signal of inverter 190a, an inverter 190d for inverting a signal applied from transfer gate 190c, an inverter 190e forming a latch circuit with inverter 190d, and a transfer gate 190f rendered conductive, in response to activation (H level) of body refresh designating signal /BRE#, to transmit the output signal of inverter 190d to shift register stage SR#1 at the next stage.

Shift register stage SR#1 has a structure similar to that of shift register stage SR#0, and includes inverters 190a and 190b forming a latch circuit, and a transfer gate 190c responsive to body refresh designating signal BRE# to transmit an output signal of inverter 190a.

First stage shift register SR#0 further includes a p channel MOS transistor 190g rendered conductive in response to activation (L level) of power-on detection signal /POR to transmit power supply voltage Vcc to the input portion of inverter 190a. The input portion of the remaining shift register stages (SR#1, . . . ) of shift register SR includes an n channel MOS transistor 190h rendered conductive during activation (H level) of power-on detection signal POR to transmit ground voltage to the input portion of inverter 190a. Initialization of shift register SR is carried out when power is turned on by these MOS transistors 190g and 190h. By this initialization, column select line CSL0 is set to a state driven to a selected state. In FIG. 33A, the output signal from the register of the last stage is transmitted to the input portion of shift register stage SR#0 of the first stage via transfer gate 190f.

Shift register SR further includes an AND circuit 191 receiving body refresh designating signal BRE# and an output signal of inverter 190d of shift register stage SR#0. AND circuit 191 is provided corresponding to respective shift register stages. When body refresh designating signal BRE# attains an H level, AND circuit 191 operates as a buffer circuit to transmit the data held in the output stage of each register stage in shift register SR to column decoder CD. When body refresh designating signal BRE# attains an inactive state (L level), transmission of the output signal of shift register SR is inhibited.

Figure 33B:
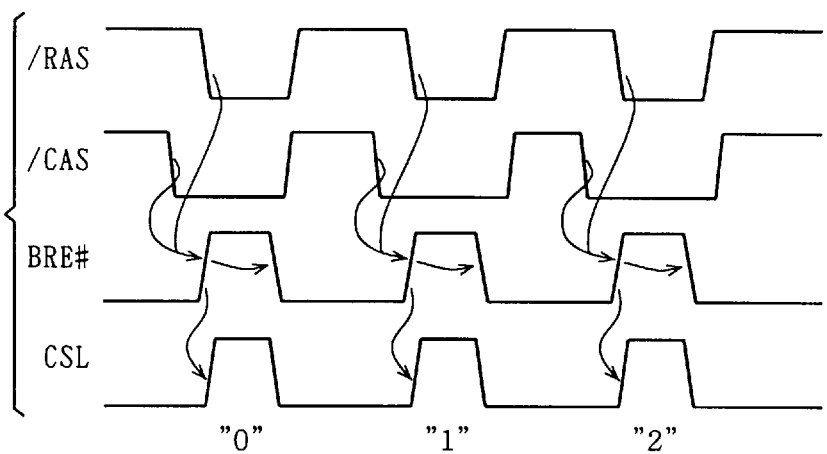
FIG. 33B is a signal waveform diagram representing an operation of the circuitry of FIG. 33A in a body refresh operation.

Column decoder CD includes an AND type decode circuit 195a for decoding an applied internal column address signal CA, and an OR circuit 195b receiving output signals of AND circuit 191 and decode circuit 195a. A column select signal is transmitted from OR circuit 195b onto column select line CSL0. The operation of column decoder CD and shift register SR of FIG. 33A will now be described with reference to the operational waveform diagram of FIG. 33B.

In a normal operation mode, body refresh designating signal BRE# attains an L level of an inactive state. Therefore, the output signal of AND circuit 19 attains an L level, and OR circuit 195b drives a corresponding column select line (CSL0) according to an output signal of decode circuit 195a.

When the CBR condition is satisfied, a body refresh designating signal BRE# is internally generated according to the generated refresh address signal REF and one shot pulse signal φA. Transfer gate 190c conducts according to activation of body refresh designating signal BRE# to transmit an output signal of inverter 190a to inverter 190d. In shift register stage SR#0 of the first stage, the signal of an H level initialized when the power is turned on is output via inverter 190d. In the remaining shift register stages SR#1, . . . , the signal of an L level at the input portion is transmitted and output. Therefore, only the AND circuit 191 provided corresponding to column select line CSL0 provides a signal of an H level, and the remaining AND circuits 191 provide a signal of an L level. As a result, the output signal of OR circuit 195b attains an H level, and column select line CSL0 attains an active state of an H level. The remaining column select lines CSL1, . . . maintain the non-selected state of an L level. In a body refresh operation, transfer gate 190f in shift register SR attains a non-conductive state. Therefore, the latched signal is not transferred to the succeeding shift register stage.

When one body refresh operation is completed and body refresh designating signal BRE# attains an L level, inversion body refresh designating signal ZBRE# is driven to an H level. In each shift register stage, the latched signal in the preceding shift register is transferred to the input stage of the next shift register to be latched thereat.

When body refresh designating signal BRE# is then driven to an active state of an H level, transfer gate 190c in each of shift register stages SR#0, SR#1, . . . conducts, whereby the latched signal at the input stage is transferred to the output stage. Under this state, first shift register stage SR#0 provides a signal of an L level, and the next shift register stage SR#1 provides a signal of an H level. Therefore, column select line CSL1 (not shown) is driven to a selected state. Column select line CSL0 maintains a non-selected state (a signal of an L level is transmitted from the last register stage).

Every time this CBR refresh is carried out thereafter, body refresh designating signal BRE# is rendered active according to an applied refresh address. Shift register SR carries out a shift operation, and a column select line is sequentially driven to a selected state.

During the CBR refresh operation, a column select operation is inhibited. The decode operation in column decoder CD is inhibited. Therefore, the output signal of decode circuit 195a is fixed at an L level. By virtue of this shift register SR, a column select line can reliably be driven to a selected state sequentially even when the decode operation of the column decoder is inhibited in a CBR refresh operation.

By arranging the initialization structure of shift register SR according to the structure shown in FIG. 33A such that a plurality of column select lines are driven to a selected state simultaneously, the required number of column select lines can be driven to a state selected to execute body refresh. Furthermore, by providing a structure wherein body refresh designating signal BRE# is directly applied to OR circuit 195*b*, body refresh can be carried out simultaneously for the memory cells in all the memory blocks in one global memory block.

In the body refreshing, it is described that the bit line equalized precharge designation signal BEQj is kept active. In this state, L level potential can be transferred to non-selected bit lines through a bit line equalize/precharge potential transmission line 54. The inverted version of body refresh signal BRE# and the bit line equalize/precharge signal BEQJ are ANDed as shown in the parentheses in FIG. 30, to execute body refreshing in a unit of selected bit lines. The second embodiment of the present invention has a structure wherein, when a CBR refresh is carried out, a column select line is driven to a selected state to transmit a voltage from a write circuit required for body refresh to each selected bit line in a global memory block differing from the memory block where data refresh is carried out. Therefore, body refresh can be carried out parallel to CBR refresh without providing any particular operation mode. Furthermore, when a plurality of bit line pairs are driven simultaneously to a selected state by one column select line, the body refresh cycle can be made shorter than the data refresh cycle in comparison with the structure where body refresh is carried out one column at a time. The majority carriers accumulated in the body region can be reliably discharged to prevent data loss caused by sub threshold leakage current in the memory cell transistor.

In the configuration of a memory block having 256 rows and 1024 columns, all the memory cells in a global memory block can be body-refreshed at the completion of data refresh of one memory block. Therefore, in the case where memory block MB#1 in global memory block MRB is to be data-refreshed after the data refresh of memory block MB#0, for example, body refresh is completed for all the memory cells prior to the data refresh operation. The sub threshold leakage current for refresh data can be reduced sufficiently to greatly improve the data retaining characteristics.

Third Embodiment

Figure 34:
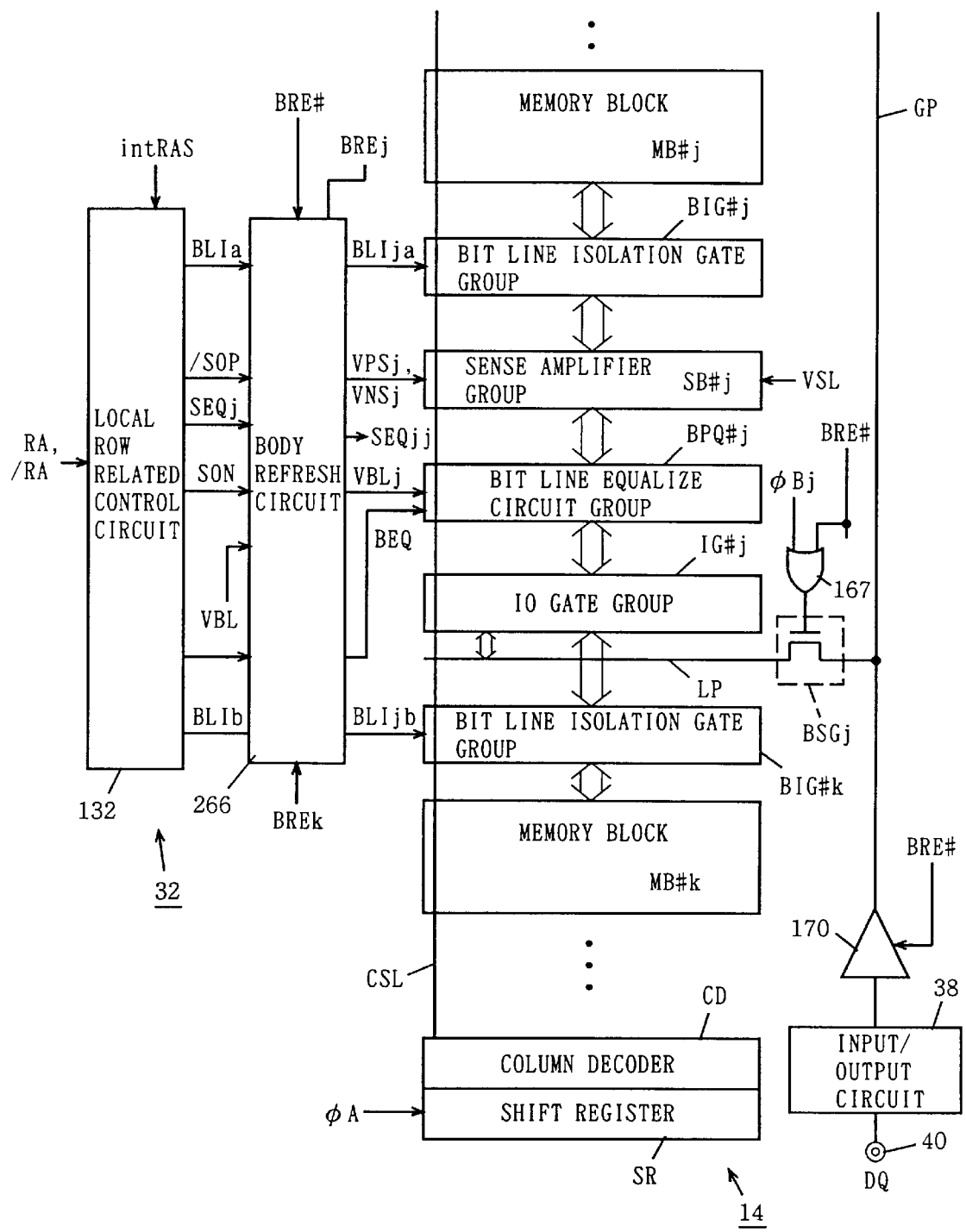
FIG. 34 schematically shows a structure of main components of an SOIDRAM according to a third embodiment of the present invention.

FIG. 34 schematically shows the main components of an SOIDRAM according to a third embodiment of the present invention. FIG. 34 shows the structure of a body refresh circuit 266 with respect to a bit line isolation gate group BIG#j, a sense amplifier band SB#j, a bit line equalize circuit group BPQ#j, an IO gate group IG#j and a bit line isolation gate group BIG#k between two memory blocks MB#j and MB#k. Body refresh circuit 266 adjusts and provides to each circuit group the control signal from a local row related control circuit 132 according to body refresh designating signals BRE#, BREj and BREk.

The circuitry of FIG. 34 differs from the circuitry of FIG. 29 in that body refresh circuit 266 receives body refresh designating signals BRE#k and BRE#j to control bit line isolation designating signals BRIja and BRIjb and alter the level of the bit line precharge voltage. The remaining structure is similar to that shown in FIG. 29. Corresponding components have the same reference characters allotted, and detailed description thereof will not be repeated.

Figure 35:
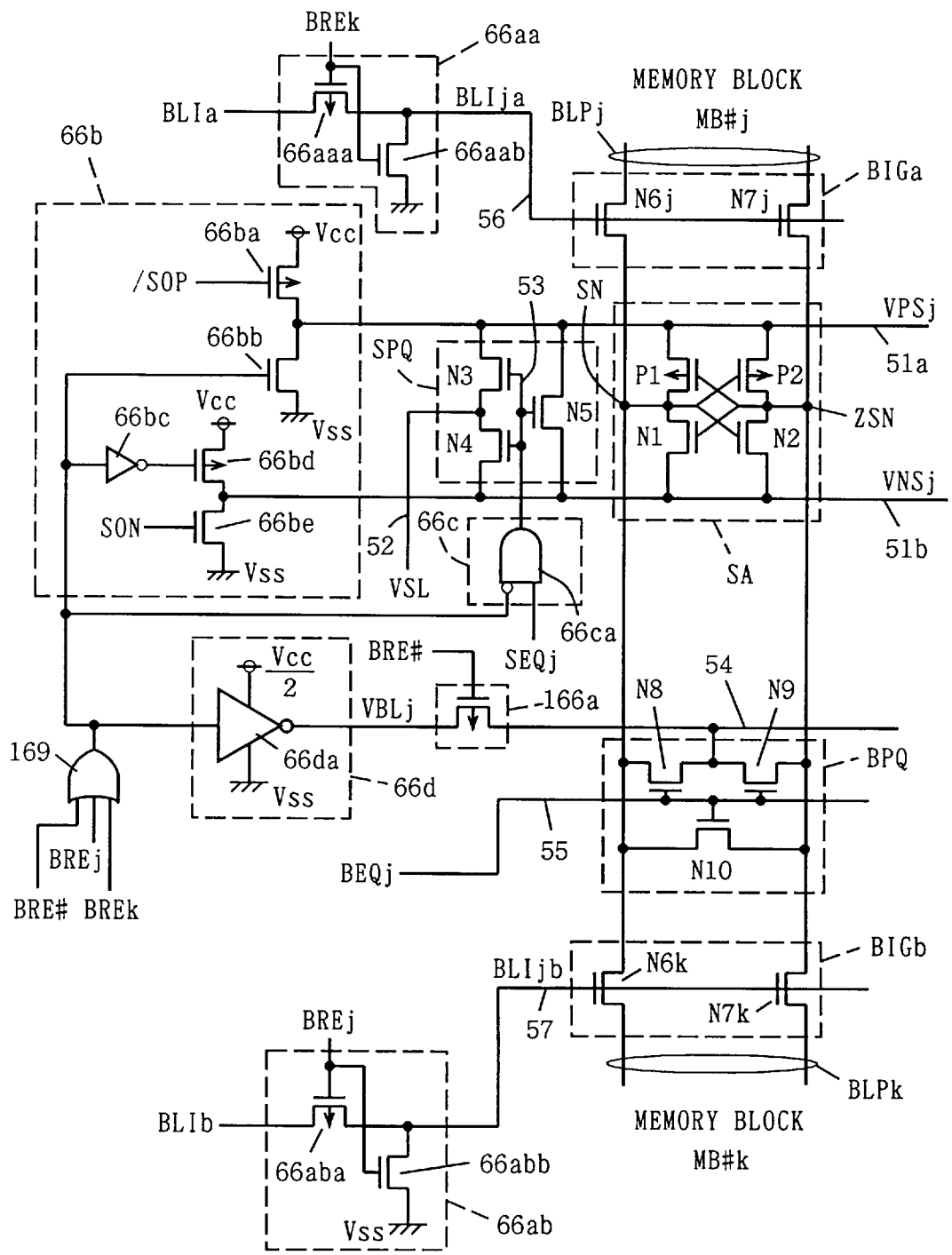
FIG. 35 shows an example of a specific structure of a body refresh circuit shown in FIG. 34.

FIG. 35 shows a detailed structure of body refresh circuit 266 of FIG. 34. Body refresh circuit 266 of FIG. 35 differs from the body refresh circuit of the first embodiment shown in FIG. 14 in the following points. A sense drive circuit 66*b* is controlled by an output signal of OR circuit 169 receiving body refresh designating signals BRE#, BREj and BREk.

Furthermore, a bit line voltage control circuit 166*a* is provided between bit line voltage modify circuit 66*d* and bit line voltage transmission line 54. Bit line voltage control circuit 166*a* is rendered non-conductive in activation of body refresh designating signal BRE#. The remaining structure is similar to that shown in FIG. 14. Corresponding components have the same reference characters allotted, and detailed description thereof will not be repeated.

The third embodiment of the present invention is a combination of the structures of the first and second embodiments. In a CBR refresh operation, a column select line is driven to a selected state, and the bit line potential from the write circuit is reduced to an L level to carry out body refresh. In a self refresh mode, bit line precharge voltage VBL is reduced to carry out body refresh in a memory block parallel to the last data refresh operation of another memory block.

Figure 36:
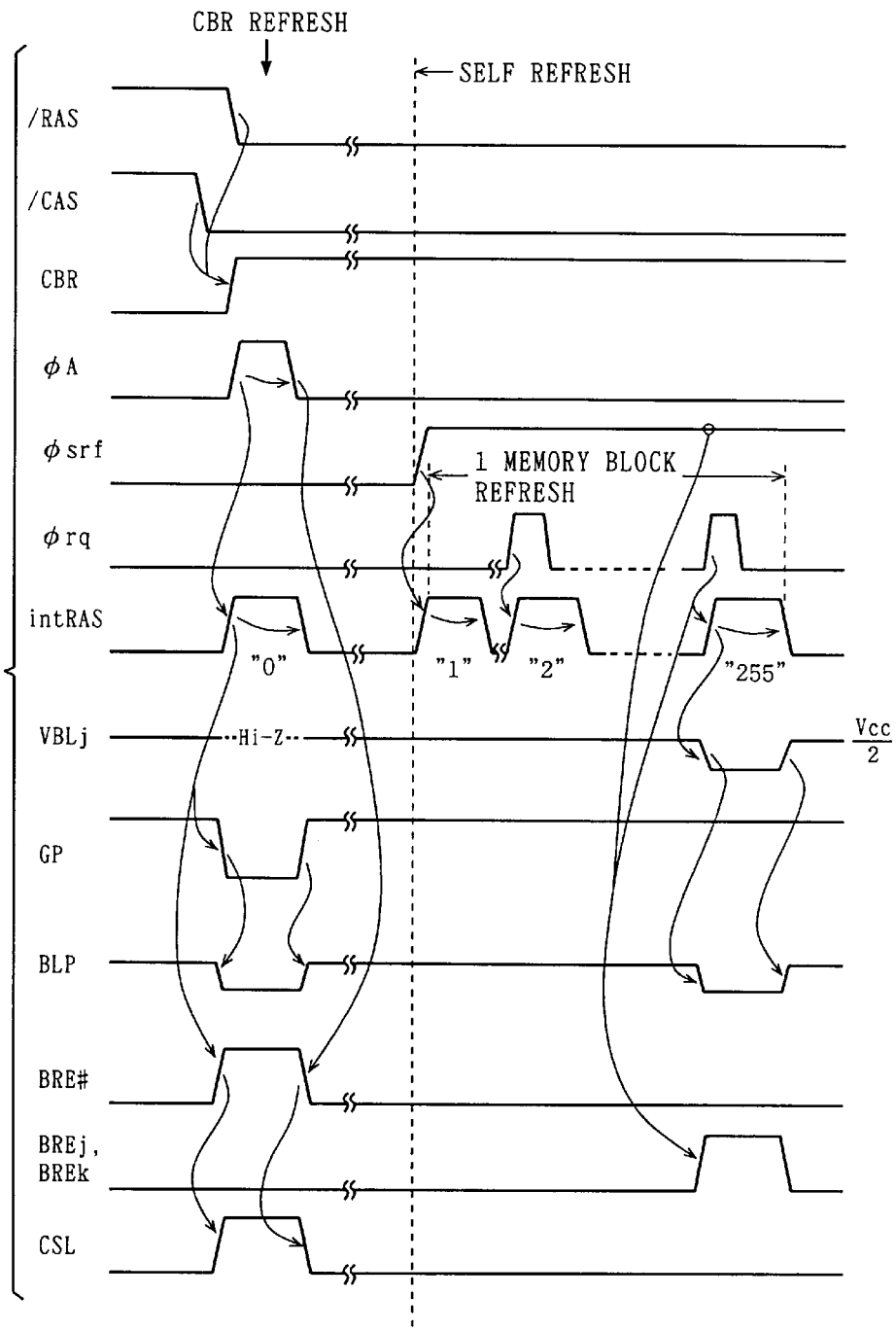
FIG. 36 is a signal waveform diagram used for describing a body refresh operation according to the third embodiment of the present invention.

FIG. 36 is a waveform diagram showing a body refresh operation of an SOIDRAM according to the third embodiment of the present invention. Referring to FIG. 36, a signal φA not shown in FIG. 35 is a one shot pulse signal rendered active during a CBR refresh operation of the second embodiment. Signal φsrf is a self refresh mode designating signal indicating entry of a self refresh mode of the first embodiment. Signal φrq is a refresh activation designating signal of the first embodiment rendered active at a predetermined time interval in a self refresh mode. The operation of the circuitry shown in FIGS. 34 and 35 will be described hereinafter with reference to the waveform diagram of FIG. 36.

The fall of column address strobe signal /CAS followed by the pull down of row address strobe signal /RAS to an L level causes CBR detection signal CBR to be driven to an active state of an H level. CBR detection signal CBR maintains an active state of an H level during the L level period of signal /RAS.

In response to the rise of CBR detection signal CBR, one shot pulse signal φA is driven to an H level of an active state for a predetermined time. In response to activation of one shot pulse signal φA, internal row address strobe signal intRAS is rendered active. Data refresh is carried out according to this internal row address strobe signal intRAS. In a global memory block not including a memory block subjected to this data refresh, body refresh designating signal BRE# attains an active state of an H level, whereby transmission of bit line precharge voltage BVLj on transmission line 54 is inhibited by bit line voltage control circuit 166*a* (bit line precharge voltage transmission line 54 attains an high impedance state (HiZ state)). Under this state, write circuit 170 of FIG. 34 is activated, whereby the potential of global IO line GP is driven to an L level. In response to activation of body refresh designating signal BRE#, column select line CSL is driven to a selected state. The L level data on this global IO line pair GP is transmitted to the bit line selected by column select line CSL, whereby the potential of each bit line of bit line pair BLP is reduced to an L level. Sense amplifier SA is rendered inactive under control of sense drive circuit 66*b* (output signal of OR circuit 169 attains an H level).

At completion of a CBR refresh cycle, one shot pulse signal φA is driven to an inactive state of an L level, and each signal returns to a predetermined precharge state.

At an elapse of a predetermined time period from the drive of CBR detection signal CBR to an active state of an H level, self refresh mode designating signal φsrf is rendered active at an H level (identical to the case of the first embodiment). In response to activation of self refresh mode designating signal φsrf, one shot pulse signal PLS from one shot pulse generating circuit 20b (refer to FIG. 7) is rendered active for a predetermined time period. In response, internal row address strobe signal intRAS is rendered active. In response to activation of internal row address strobe signal intRAS, a data refresh operation is carried out. During an active period of self refresh designating signal φsrf, data refresh activation designating signal φrq is rendered active at an H level at a predetermined time interval. In response to activation of this signal φrq, a one shot pulse signal PLS is generated. In response, internal row address strobe signal intRAS is rendered active, whereby data refresh is carried out. In this self refresh mode, body refresh designating signal BREj or BREk is rendered active in response to the 255th activation of refresh activation designating signal φrq. In response to activation of body refresh designating signal BREj or BREk, one of memory blocks MB#j or MB#k carrying out body refresh is connected to a sense amplifier band, and the other memory block is disconnected from the sense amplifier band (control of bit line isolation designating signals BLIja and BLIjb). Then, sense drive circuit 66b operates according to an output signal of OR circuit 169 to drive sense drive signals VPSj and VNSj to a deeply inactivated state (voltage of a polarity opposite to that of an active state). Then, under control of bit line voltage modify circuit 66d, bit line precharge voltage VBLj is driven to a level of a predetermined voltage (ground voltage Vss). As a result, a predetermined body refresh voltage (ground voltage) lower than the intermediate voltage is transmitted onto a bit line connected to bit line equalize circuit BPQ, whereby the potential of each bit line of bit line pair BLP of the memory block subjected to body refresh is reduced. Thus, a body refresh is carried out.

A CBR refresh operation and a self refresh operation are not carried out at the same time. Self refresh is carried out at an elapse of a predetermined time from execution of a CBR refresh. Therefore, body refresh designating signal BRE# and body refresh designating signals BREj and BREk will not be rendered active at the same time. Body refresh can be carried out in a different mode respectively refresh independent of each other. In self refresh mode, only a data retaining mode is implemented to reduce power consumption. The power consumption of a body refresh operation in a self refresh mode is reduced by not using a write circuit in the self refresh mode (since drive is not carried out on global IO line pair GP having a great load capacitance). In the third embodiment, the signal BEQj can be also replaced with logical product of the signals BEQj and /BRE# as shown in the parentheses in FIG. 35, to reliably execute body refreshing in a unit of selected bit line pairs.

In the second and third embodiments, body refresh voltage (the voltage transmitted to bit line in body refresh) is described as attaining the level of ground voltage. However, this body refresh voltage may be a negative voltage VRB as in the modification of the first embodiment. By providing a level conversion circuit at the portion where each signal of an L level is output, a body refresh voltage of this negative voltage level can be transmitted to each bit line in body refresh. This structure can easily be realized by a combination of the second embodiment and the modification of the first embodiment.

According to the third embodiment of the present invention, a structure is provided wherein, in CBR refresh, a column select line is driven to a selected state, and voltage required for body refresh is transmitted to each bit line from the write circuit, and in a self refresh mode, the level of the bit line precharge voltage is reduced to transmit a voltage required for a body refresh to each bit line. It is therefore not necessary to operate the write circuit that requires a great current driving capability in a self refresh operation. The current required for body refresh can be reduced.

Similar to the first embodiment, body refresh in a self refresh mode is carried out only once during data refresh of one memory block. The current required for body refresh can substantially be neglected in comparison to that of in a data refresh operation. In CBR refresh, only one column select line CSL is driven to a selected state, and the number of bit line pairs subjected to body refresh can be reduced than in a normal operation with the operation mode where the memory block is divided into a plurality of sub blocks with a global IO line provided corresponding to each sub block, and a column select line is selected in each sub block. Increase in power consumption for body refresh in a CBR refresh mode can be suppressed sufficiently.

Fourth Embodiment

Figure 37:
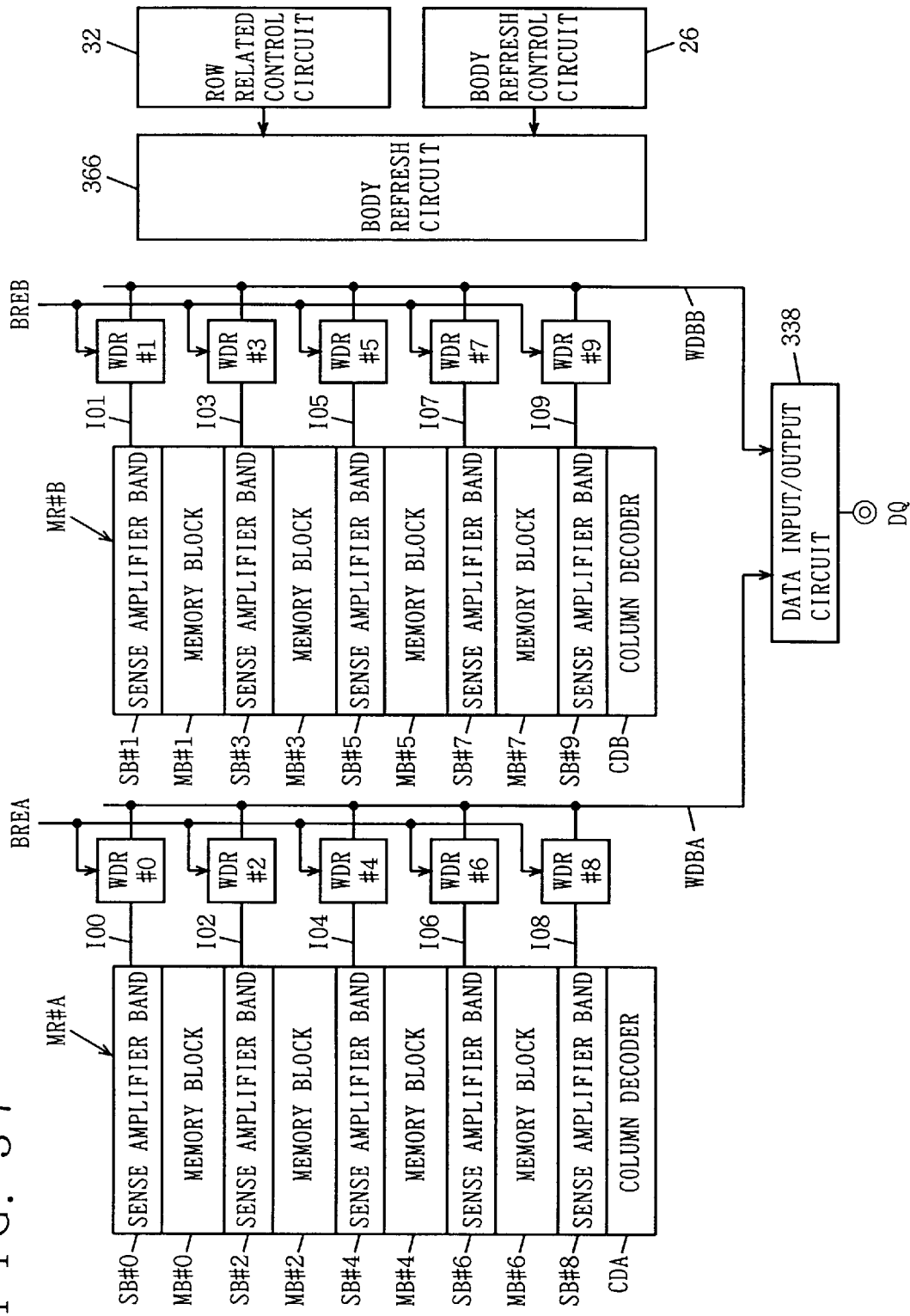
FIG. 37 shows a structure of main components of an SOIDRAM according to a fourth embodiment of the present invention.

FIG. 37 schematically shows an entire structure of an SOIDRAM according to a fourth embodiment of the present invention. Referring to FIG. 37, the SOIDRAM includes two global memory blocks MR#A and MR#B. Similar to the first to third embodiments, global memory block MR#A includes memory blocks MB#0, MB#2, MB#4, and MB#6, and global memory block MR#B includes memory blocks MB#1, MB#3, MB#5 and MB#7. Each of global memory blocks MR#A and MR#B has a shared sense amplifier structure. Sense amplifier bands SB#2, SB#4, SB#6, and SB#8 are provided for global memory block MR#A, and sense amplifier bands SB#1, SB#3, SB#5, SB#7 and SB#9 are provided for global memory block MR#B. A column decoder CDA is provided for global memory block MR#A. A column decoder CDB is provided for global memory block MB#B.

The SOIDRAM further includes an internal data line (IO line) provided corresponding to each sense amplifier band. Internal data lines IO0, IO2, IO4, IO6 and IO8 are provided for sense amplifier bands SB#0, SB#2, SB#4, SB#6 and SB#8. Internal data lines IO1, IO3, IO5, IO7 and IO9 are provided for sense amplifier bands SB#1, SB#3, SB#5, SB#7 and SB#9. Internal data lines IO0–IO9 transfer data to and from a selected memory block via a column select gate (IO gate) provided for a corresponding sense amplifier band. Write circuits (write driver) WDR#0–WDR#9 are provided for internal data lines IO0–IO9, respectively. Write circuits WDR#0, WDR#2, WDR#4, WDR#6 and WDR#8 provided for global memory block MR#A buffer the write data provided via internal write data transmission line WDBA and transmit the write data to corresponding memory blocks. Write circuits WDR#1, WDR#3, WDR#5, WDR#7 and WDR#9 are provided for global memory block MR#B. These write circuits WDR#1, WDR#3, WDR#5, WDR#7 and WDR#9 each buffers the internal write data provided via internal write data transmission line WDBB and transmits the write data to a selected memory cell of a corresponding memory block.

Each of write circuits WDR#0–WDR#9 is activated according to a block select signal in a normal operation. Only the write circuit provided corresponding to the specified memory block is activated to transmit write data to a corresponding memory block. In a non-selected state, each of write circuits WDR#0–WDR#9 attains an output high impedance state. A body refresh designating signal BREA is commonly applied to write circuits WDR#0, WDR#2, WDR#4, WDR#6 and WDR#8. Body refresh designating signal BREB is applied in common to write circuits WDR#1, WDR#3, WDR#5, WDR#7 and WDR#9.

Internal write data transmission lines WDBA and WDBB are coupled to a data input/output circuit 338. Data input/output circuit 338 can have a select function to select one of write data transmission lines WDBA and WDBB or can have a function of input/output data of 2 bits.

The SOIDRAM further includes a body refresh circuit 336 for executing body refresh according to output signals of body refresh control circuit 26, row related control circuit 32, and body refresh control circuit 26 controlling a body refresh operation. Although body refresh circuit 366 includes a sub circuit group provided corresponding to each sense amplifier band, only one block 366 is shown in FIG. 37 for the sake of simplification. Body refresh circuit 366 has a structure similar to that of the second embodiment.

In a normal operation mode, column decoders CDA and CDB are activated, whereby a column select operation is carried out in a corresponding global memory block MR#A and MR#B. According to a memory block specify signal (can be specified by a particular bit of a row address and column address, or specified by a column address signal), a corresponding write circuit is activated to write data towards a selected memory block.

In a body refresh operation, body refresh designating signal BREA or BREB corresponding to a global memory block not subjected to data refresh is rendered active. Corresponding write circuits (WDR#0, WDR#2, WDR#4, WDR#6 and WDR#8, or WDR#1, WDR#3, WDR#5, WDR#7 and WDR#9) are activated to transmit data of an L level onto a corresponding internal data line. Similar to the second embodiment, column decoders CDA and CDB include a shift register to drive a column select line SCL to a selected state in a global memory block according to the body refresh designating signal. Under such a state, data of an L level is transmitted onto each bit line to carry out body refresh via each write circuit.

The specific internal structure and control manner of the circuitry of FIG. 37 are similar to those of the second embodiment, provided that internal data line pairs IO0–IO9 are disposed instead of local IO line pair LP, internal write data transmission lines WDAA and WDBB are disposed instead of global IO line, and that a write circuit is provided for internal data lines IO0–IO9. A body refresh operation can be executed parallel to a data refresh (CBR refresh) operation even with such a structure.

By combining the first embodiment with the memory array structure of FIG. 37, body refresh can be carried out in a CBR refresh mode or a self refresh operation mode in the SOIDRAM of the single IO line structure as an alternative to the local/global hierarchy IO line structure of the third embodiment. In this case, the control is similar to that shown in the third embodiment, and description thereof will not be repeated.

In the first to fourth embodiments, the SOIDRAM is shown as including two global memory blocks. However, an appropriate number of global memory blocks can be applied according to the storage capacity of the SOIDRAM. Furthermore, data input/output can be carried out, not in the unit of one bit, but in the unit of several bits.

The internal structure of sense amplifier bands SB#0–SB#9 not shown in the structure of FIG. 37 is identical to that shown in the first to third embodiments.

The above first to fourth embodiments describe a structure where a memory cell has a P type body region and n type source/drain regions. A P channel MOS transistor having an N type body region and a P type source/drain region can be used as an memory cell transistor. In this case, the majority carriers stored in the body region are electrons, and a body refresh voltage of an H level is applied to the bit line to reduce the potential of the body region (in this case, the bit line precharge voltage must attain the level of ground voltage or negative voltage).

In an SOIDRAM according to the present invention, majority carriers stored in the body region can be discharged without increasing the area occupied by the memory cell since a voltage is applied to a bit line such that a bi-directional bias voltage is applied across a body region and a bit line. Discharge of majority carriers from the body region allows increase of sub threshold leakage current in a memory cell transistor to be suppressed in disturbance (when bit line potential is amplified to an H level and an L level). An SOIDRAM superior in refresh characteristics can be obtained. By carrying out body refresh in a memory block differing from that where data refresh is carried out, a body refresh operation can be executed transparent to or hidden by the data refresh operation. It is not necessary to provide a particular operation mode for body refresh and reduction of the access efficiency for the memory is suppressed. Furthermore, by executing body refresh in the memory block where the next data refresh operation is to be carried out, data can be refreshed in a state where the majority carriers in the body region are discharged. The data disappearance speed due to the sub threshold leakage current of the refreshed data can be reduced, and consequently sub threshold leakage current can be reliably suppressed. Thus, an SOIDRAM of favorable refresh characteristics can be realized.

By carrying out only one body refresh operation during the self refresh operation of one memory block, increase in the current required for body refresh can be substantially neglected. The low power consumption characteristics required in a self refresh mode is not degraded.

By providing a structure where a voltage required for a body refresh operation is transmitted to each bit line using a bit line precharge/equalize circuit or a write circuit, no particular circuitry is newly required. Body refresh can be carried out reliably with a structure similar to that of a conventional one.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory blocks each including a plurality of memory cells arranged in a matrix, each of said plurality of memory cells formed on a semiconductor layer with an insulating film thereunder and including a first impurity region, a second impurity region, a body region formed between said first and second impurity regions, a control electrode formed on said body region with a gate insulating film thereunder, and a capacitor having one electrode node electrically connected to said first impurity region for storing information,
   a plurality of column lines provided corresponding to each of said plurality of memory blocks and each having the second impurity regions of one column of memory cells of a corresponding memory block connected, a plurality of word lines provided corresponding to each of said plurality of memory blocks and each having the control electrodes of one row of memory cells of a corresponding memory block connected, data refresh means activated in response to a refresh mode designating signal to generate a refresh address specifying a memory block and a memory cell to be refreshed for refreshing stored information of the memory cell of the memory block specified according to said refresh address, and body refresh means activated in response to activation of said refresh mode designating signal for applying to at least one column line such a body refresh voltage that charge stored in the body region of the memory cell is transmitted to a corresponding column line while maintaining a corresponding word line at a non-selected state in a different memory block different from the memory block specified by said refresh address.

2. The semiconductor memory device according to claim 1, wherein said data refresh means comprises means activated in response to activation of said refresh mode designating signal for generating said refresh address such that a different row in a same common memory block is sequentially selected at a predetermined interval.

3. The semiconductor memory device according to claim 2, wherein said body refresh means comprises means activated in response to specification of a last row in one memory block by said refresh address for applying said body refresh voltage.

4. The semiconductor memory device according to claim 2, wherein said body refresh means comprises means receiving said refresh address for applying said body refresh voltage to a memory block to be refreshed subsequently to the memory block specified by said refresh address.

5. The semiconductor memory device according to claim 1, further comprising means provided corresponding to each of said plurality of column lines for maintaining a corresponding column line at a predetermined potential when activated, wherein said body refresh means comprises means provided corresponding to each said memory block for altering said predetermined potential to be applied to said different memory block to said body refresh voltage in response to activation of said refresh mode designating signal.

6. The semiconductor memory device according to claim 1, wherein said body refresh means comprises column select means responsive to activation of said refresh mode designating signal for selecting a column line in the different memory block, and write means responsive to activation of said refresh mode designating signal for transmitting data corresponding to said body refresh voltage to a column line selected by said column select means.

7. The semiconductor memory device according to claim 6, wherein said write means comprises a write driver for transmitting internal write data corresponding to external write data to a memory cell in a data write operation in a normal operation mode.

8. The semiconductor memory device according to claim 6, wherein said column select means comprises means for driving to a selected state a column line in said different memory block according to said refresh address and said refresh mode designating signal.

9. The semiconductor memory device according to claim 6, wherein said column select means comprises a column decoder having output nodes provided corresponding to the column lines in said different memory block for driving a corresponding output node to a selected state according to a column address during activation thereof, and shift register means responsive to said refresh mode designating signal for driving an output node of the output nodes of said column decoder to a selected state by a sequential shift operation.

10. The semiconductor memory device according to claim 1, wherein said body refresh means comprises means for applying said body refresh voltage only once to said different memory block in response to activation of said refresh mode designating signal.

11. The semiconductor memory device according to claim 1, further comprising a plurality of sense amplifiers provided corresponding to each said column line, activated in response to activation of a sense drive signal on a sense drive signal line for sensing and amplifying potential on a corresponding column line, wherein said body refresh means comprises means, when activated, for setting voltage on said sense drive signal line corresponding to said different memory block to a voltage level of a polarity different from the polarity when said sense drive signal is active.

12. The semiconductor memory device according to claim 11, wherein each said column line comprises a pair of bit lines, each of said plurality of sense amplifiers comprises a PMOS sense amplifier for driving a bit line of a higher potential in a corresponding bit line pair to a high voltage level, and an NMOS sense amplifier for driving a bit line of a lower potential of said corresponding bit line pair to a low voltage level, said sense drive signal line comprises a PMOS sense drive signal line provided corresponding to said PMOS sense amplifier, and an NMOS sense drive signal line provided corresponding to said NMOS sense amplifier, said semiconductor memory device further comprises equalize means activated in response to inactivation of said sense amplifier for maintaining said NMOS sense drive signal line and PMOS sense drive signal line at a predetermined voltage, and said body refresh means comprises means for inactivating equalize means provided corresponding to said different memory block in activation of said refresh mode designating signal.

13. The semiconductor memory device according to claim 1, wherein said data refresh means comprises means responsive to activation of said refresh mode designating signal for generating a refresh address and carrying out only once a refresh operation of memory cell data in a memory block specified according to said refresh address during activation of the refresh mode designating signal.

14. The semiconductor memory device according to claim 1, wherein each of the column lines receives a voltage at one of a first level and a second level depending on data of a selected memory cell connected thereto upon data refreshing operation by said data refresh means, and said body refresh voltage is a voltage at such a third level that a difference between the voltage at the first level and the voltage at the second level is equal to or smaller in absolute value than a difference between the voltage at the second level and the voltage at the third level.

15. The semiconductor memory device according to claim 1, wherein said body refresh voltage is applied to all the column lines in the different memory block.

16. The semiconductor memory device according to claim 6, further comprising holding means provided corresponding to each of the column lines for maintaining a corresponding column line at a predetermined potential when activated, wherein said body refresh means includes means for stopping supply of the predetermined potential to the column lines by said holding means in the different memory block.

17. The semiconductor memory device according to claim 1, wherein said body refresh voltage is equal to or lower than a voltage on a word line in a non-selected state of the plurality of word lines.

* * * * *